US010091563B2

(12) United States Patent
Koyama

(10) Patent No.: US 10,091,563 B2
(45) Date of Patent: Oct. 2, 2018

(54) ENVIRONMENTAL SENSOR OR SEMICONDUCTOR DEVICE

(71) Applicant: SEMICONDUCTOR ENERGY LABORATORY CO., LTD., Atsugi-shi, Kanagawa-ken (JP)

(72) Inventor: Jun Koyama, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/554,228

(22) PCT Filed: Feb. 25, 2016

(86) PCT No.: PCT/IB2016/051019
§ 371 (c)(1),
(2) Date: Aug. 29, 2017

(87) PCT Pub. No.: WO2016/139559
PCT Pub. Date: Sep. 9, 2016

(65) Prior Publication Data
US 2018/0084314 A1 Mar. 22, 2018

(30) Foreign Application Priority Data

Mar. 2, 2015 (JP) .................. 2015-040494

(51) Int. Cl.
H04Q 9/00 (2006.01)
H03M 1/46 (2006.01)
(Continued)

(52) U.S. Cl.
CPC ............... H04Q 9/00 (2013.01); G11C 7/12 (2013.01); G11C 8/08 (2013.01); H01L 29/7869 (2013.01);
(Continued)

(58) Field of Classification Search
CPC ....................................................... H04Q 9/00
See application file for complete search history.

(56) References Cited

U.S. PATENT DOCUMENTS 5,528,032 A 6/1996 Uchiyama
5,744,864 A 4/1998 Cillessen et al.
(Continued)

FOREIGN PATENT DOCUMENTS

JP 06-275697 A 9/1994
JP 11-505377 5/1999
JP 2013-042657 A 2/2013

OTHER PUBLICATIONS

International Search Report (Application No. PCT/IB2016/051019) dated Apr. 26, 2016.
(Continued)

Primary Examiner — Leon Flores
(74) Attorney, Agent, or Firm — Nixon Peabody LLP; Jeffrey L. Costellia

(57) ABSTRACT

To provide an environmental sensor with reduced power consumption.
A semiconductor device includes a first sensor, a second sensor, a control circuit, a transmission amplifier, a modulation circuit, a memory device, an analog-to-digital converter circuit, and an antenna. The memory device and the analog-to-digital converter circuit each include a transistor in which an oxide semiconductor is formed in a channel region. The second sensor is an optical sensor, and has a function of transmitting a trigger signal to the control circuit when receiving laser light. The control circuit has a function of transmitting a control signal to the first sensor, the transmission amplifier, the modulation circuit, the memory device, and the analog-to-digital converter circuit when receiving the trigger signal. The first sensor is a sensor that senses a physical or chemical quantity, and the measured
(Continued)

data is subjected to digital conversion by the analog-to-digital converter circuit and stored in the memory device. In addition, the data is transmitted as an electromagnetic wave signal from the antenna through the modulation circuit and the transmission amplifier.

12 Claims, 32 Drawing Sheets

(51) Int. Cl.
  *G11C 8/08* (2006.01)
  *G11C 7/12* (2006.01)
  *H01L 29/786* (2006.01)
(52) U.S. Cl.
  CPC ............ *H03M 1/46* (2013.01); *H04Q 2209/40* (2013.01); *H04Q 2209/88* (2013.01)

(56) References Cited

U.S. PATENT DOCUMENTS

| | | |
|---|---|---|
| 7,965,180 B2 | 6/2011 | Koyama |
| 8,242,903 B2 | 8/2012 | Koyama |
| 8,455,868 B2 | 6/2013 | Yamazaki et al. |
| 8,508,360 B2 | 8/2013 | Koyama |
| 9,485,883 B2 | 11/2016 | Koyama |
| 2007/0285225 A1* | 12/2007 | Koyama ............... A61B 5/0002 340/539.12 |
| 2008/0079565 A1 | 4/2008 | Koyama |
| 2011/0089417 A1 | 4/2011 | Yamazaki et al. |
| 2011/0101351 A1 | 5/2011 | Yamazaki |
| 2017/0244436 A1 | 8/2017 | Koyama |

OTHER PUBLICATIONS

Written Opinion (Application No. PCT/IB2016/051019) dated Apr. 26, 2016.

\* cited by examiner

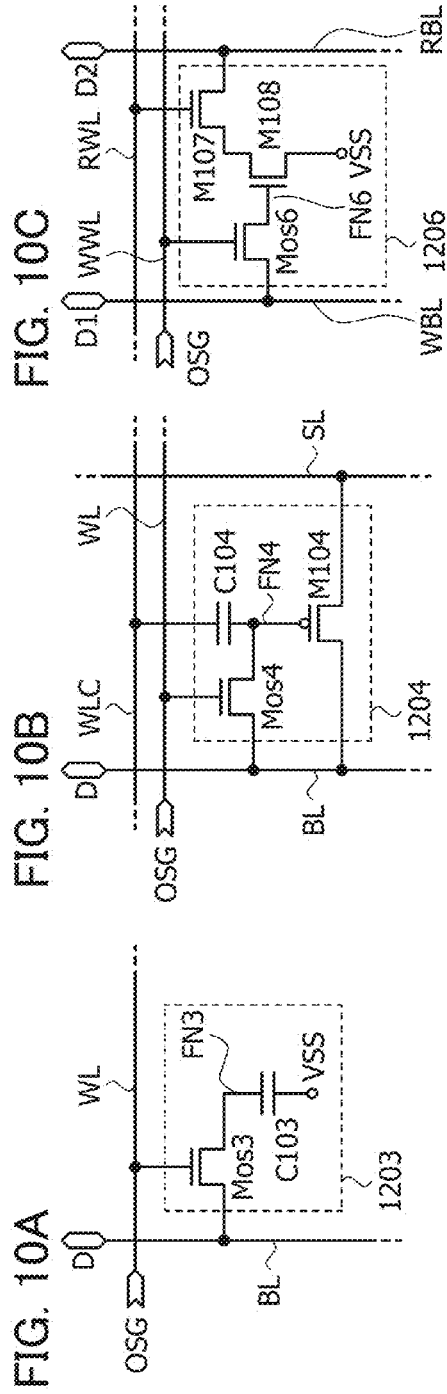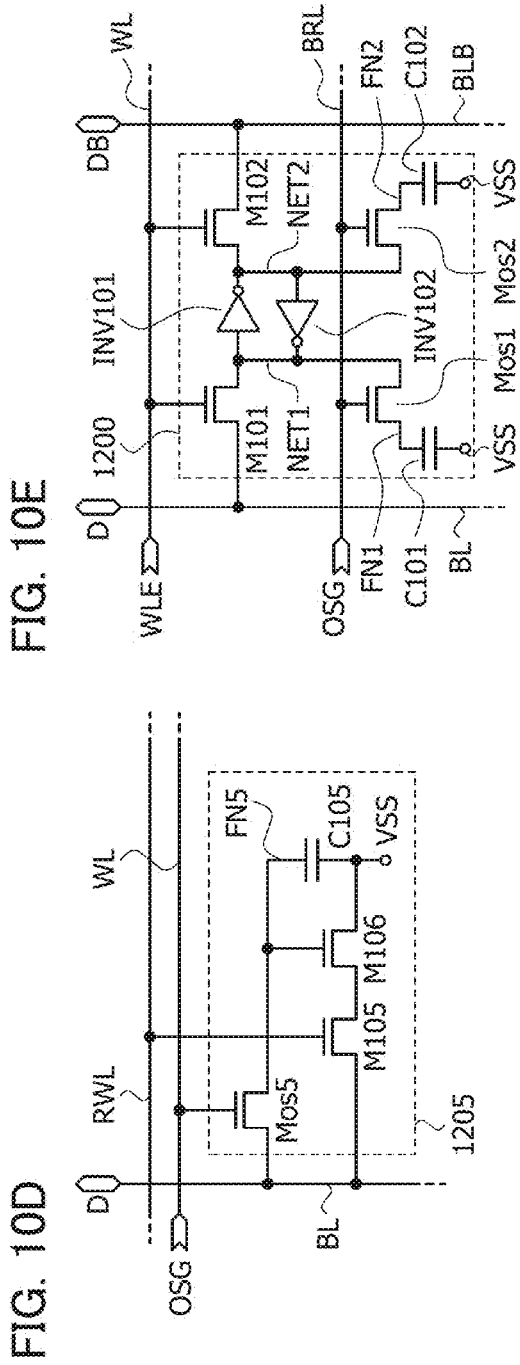

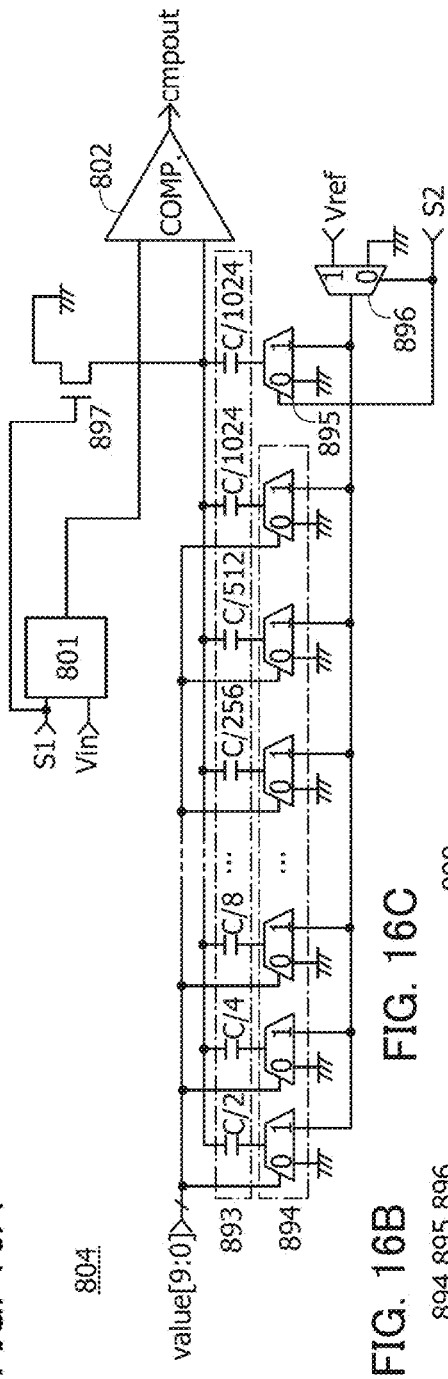
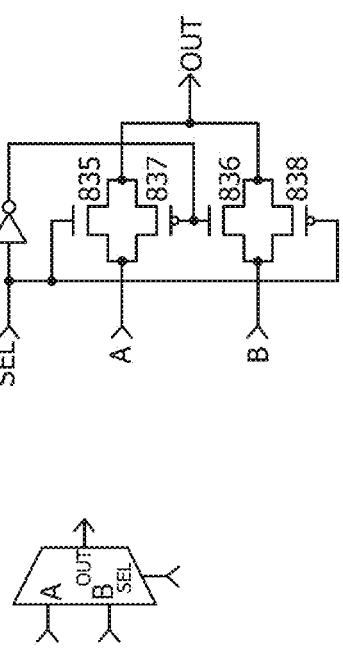
FIG. 16A
FIG. 16B
FIG. 16C

900

FIG. 27A
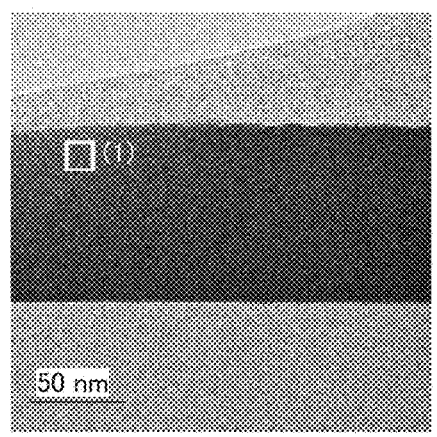
FIG. 27B            FIG. 27C
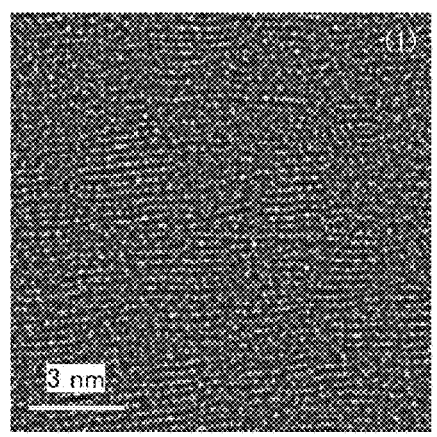    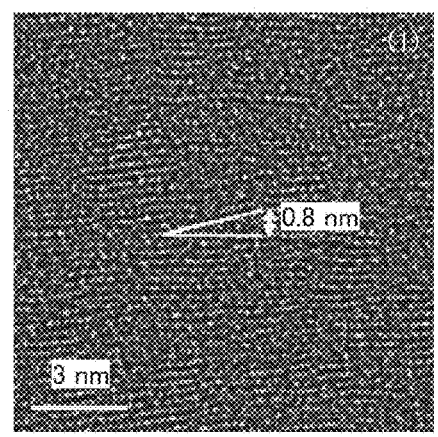
FIG. 27D
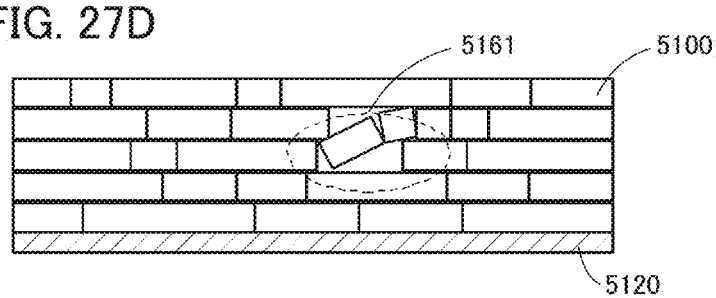

FIG. 28A
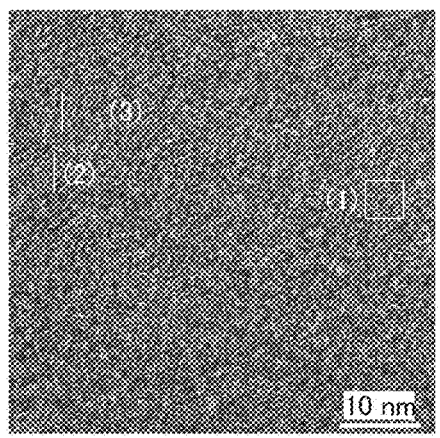
FIG. 28B         FIG. 28C         FIG. 28D
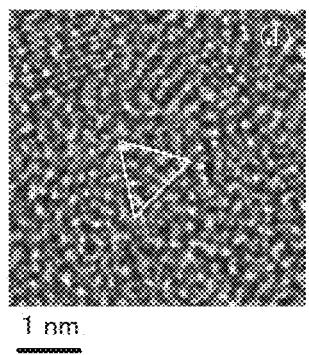 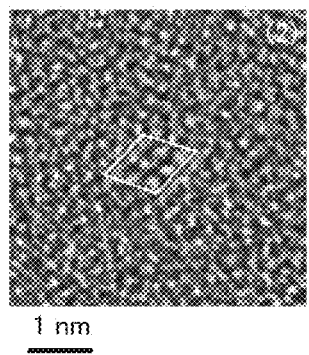 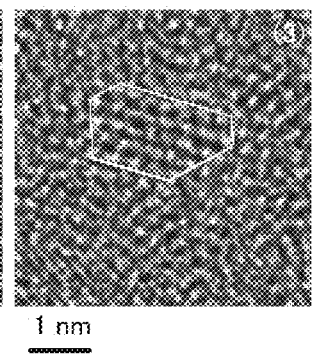

An electron beam is incident from a direction parallel to a sample surface

An electron beam is incident from a direction perpendicular to a sample surface

ENVIRONMENTAL SENSOR OR SEMICONDUCTOR DEVICE

TECHNICAL FIELD

One embodiment of the present invention relates to an environmental sensor or a semiconductor device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or composition (a composition of matter). Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method of driving them, a method of manufacturing them, a method of testing them, and systems including them.

BACKGROUND ART

In recent years, environmental sensors have been used for safety management and maintenance of buildings, collection of environmental information, and the like. The environmental sensors are being improved in many aspects such as miniaturization and low power consumption.

One of the ways that have been proposed to achieve higher performance such as lower power consumption and miniaturization is the use of an oxide semiconductor for a semiconductor layer (hereinafter referred to as an active layer, a channel layer, or a channel formation region in some cases) of a transistor in a semiconductor device. For example, a transistor in which an oxide of indium, gallium, and zinc (hereinafter referred to as an In—Ga—Zn oxide in some cases) is used for a channel layer is given (see Patent Document 1).

PRIOR ART DOCUMENT

Patent Document

[Patent Document 1] Japanese Translation of PCT International Application No. H11-505377
[Patent Document 2] Japanese Published Patent Application No. H6-275697

SUMMARY OF THE INVENTION

Problems to be Solved by the Invention

In recent years, constructions built in the high economic growth period in Japan (the 1950s to the 1970s) have come to the end of their life, and maintenance of the constructions is an important issue. As methods for maintaining the constructions, operations such as inspection, repairing, and reinforcing are given. In particular, in the inspection, temperatures, humidities, distortions, the amount of a substance that causes deterioration, and the like are examined in various points of a construction, and the data thereof are important for the future management and maintenance. One of electronic devices for collecting such data is an environmental sensor.

Furthermore, also in newly-built constructions, environmental sensors are provided in advance for the purpose of maintenance, in some cases.

In many cases, an environmental sensor is provided in a place difficult for people to enter such as a high place, the inside of a tunnel, or a bridge pier. Therefore, as a method of acquiring data, wireless communication using an environmental sensor including an RFIC (Radio Frequency Integrated Circuit, high-frequency integrated circuit) is utilized in many cases. In that case, wireless communication is performed between an environmental sensor and an outside transmitter/receiver, and data memorized in the environmental sensor is acquired.

RFICs are categorized into a passive-type and an active-type. A passive RFIC does not incorporate a battery and operates by converting received radio waves into electric power. An active RFIC incorporates a battery and operates by using electromotive force of the battery. That is, an environmental sensor that incorporates a passive RFIC drives the environmental sensor and the RFIC by using electric power converted from received radio waves; whereas an environmental sensor that incorporates an active RFIC drives the environmental sensor and the RFIC by using electromotive force of the battery.

Since the environmental sensor that incorporates a passive RFIC does not include a battery, the environmental sensor can perform communication and sensing only when receiving radio waves. In addition, since electric power for operating the environmental sensor is obtained by receiving radio waves, the electric power becomes insufficient for long-distance communication in some cases.

Since the environmental sensor that incorporates an active RFIC includes a battery, the environmental sensor can perform sensing even when not receiving radio waves. Furthermore, the active RFIC includes, in many cases, not only a battery but also a reception amplifier and a transmission amplifier. Therefore, owing to the reception amplifier and the transmission amplifier, the environmental sensor that incorporates an active RFIC enables longer-distance communication than the environmental sensor that incorporates a passive RFIC does. However, the reception amplifier has to always operate because the environmental sensor that incorporates an active RFIC needs to receive radio waves at any time. In a circuit configuration of the environmental sensor in which a transistor including silicon (Si) in a channel formation region is used, off-state current (leakage current) is generated in some cases even when the transistor is off. For these reasons, the environmental sensor that incorporates an active RFIC has high power consumption. That is, the environmental sensor consumes a battery at a high speed and therefore the number of times of battery replacement is increased. In particular, the environmental sensor is provided in a place difficult for people to enter such as a high place, the inside of a tunnel, or a bridge pier in some cases, so that battery replacement and battery charging cannot be performed safely in many cases.

Moreover, when a flash memory, a DRAM, or the like is used in an RFIC as a memory that stores a program or data, power consumption of an environmental sensor is increased in some cases whether the RFIC is active-type or passive-type. In addition, the larger the number of circuits in the environmental sensor is, the larger the power consumption is.

In view of the foregoing problems, an environmental sensor which is capable of sensing even when not receiving radio waves and which consumes low power is desired.

An object of one embodiment of the present invention is to provide a novel semiconductor device. Alternatively, an object of one embodiment of the present invention is to provide an electronic device including the novel semiconductor device. Alternatively, an object of one embodiment of the present invention is to provide a novel system using an electronic device including a module including the novel semiconductor device. Alternatively, an object of one embodiment of the present invention is to provide a novel electronic device, a novel system, or the like.

Alternatively, an object of one embodiment of the present invention is to provide a semiconductor device capable of sensing even when not receiving radio waves. Alternatively, an object of one embodiment of the present invention is to provide a semiconductor device in which the number of circuits is reduced. Alternatively, an object of one embodiment of the present invention is to provide a semiconductor device with low power consumption. Alternatively, an object of one embodiment of the present invention is to provide a semiconductor device in which the number of times of battery replacement and battery charging can be reduced. Alternatively, an object of one embodiment of the present invention is to provide a semiconductor device that enables long-distance communication.

Note that the objects of one embodiment of the present invention are not limited to the above objects. The above objects do not disturb the existence of other objects. Note that other objects are the ones that are not described above and will be described below. Other objects will be apparent from and can be derived from the description of the specification, the drawings, and the like by those skilled in the art. Note that one embodiment of the present invention achieves at least one of the above descriptions and the other objects. Note that one embodiment of the present invention does not need achieve all the above descriptions and the other objects.

Means for Solving the Problems (1)

One embodiment of the present invention is an environmental sensor including: a first sensor; a second sensor; a control circuit; a transmission amplifier; a modulation circuit; a memory device; an analog-to-digital converter circuit; a first antenna; a battery; and a power supply circuit. The environmental sensor characterized in that: the memory device includes a first transistor and a first retention node; the analog-to-digital converter circuit includes a second transistor and a second retention node; the first transistor includes an oxide semiconductor in a channel formation region; the second transistor includes an oxide semiconductor in a channel formation region; the first transistor has a function of controlling charge and discharge at the first retention node; the second transistor has a function of controlling charge and discharge at the second retention node; the battery has a function of supplying electric power to the first sensor, the second sensor, the control circuit, the transmission amplifier, the modulation circuit, the memory device, and the analog-to-digital converter circuit through the power supply circuit; the second sensor has a function of outputting a trigger signal to the control circuit when receiving light; the control circuit that receives a control signal has a function of transmitting a control signal to the first sensor, the memory device, the analog-to-digital converter circuit, the modulation circuit, and the transmission amplifier; the first sensor has a function of acquiring an external physical quantity or an external chemical quantity as first sensing data; the analog-to-digital converter circuit has a function of digitizing the first sensing data to generate second sensing data; the memory device has a function of storing the second sensing data; the modulation circuit has a function of modulating the second sensing data; the transmission amplifier has a function of amplifying the second sensing data modulated by the modulation circuit; and the first antenna has a function of transmitting the second sensing data amplified by the transmission amplifier as a first electromagnetic wave signal.

(2)

One embodiment of the present invention is an environmental sensor including: a reception circuit; a first sensor; a control circuit; a transmission amplifier; a modulation circuit; a memory device; an analog-to-digital converter circuit; a first antenna; a battery; and a power supply circuit. The environmental sensor characterized in that: the memory device includes a first transistor and a first retention node; the analog-to-digital converter circuit includes a second transistor and a second retention node; the first transistor includes an oxide semiconductor in a channel formation region; the second transistor includes an oxide semiconductor in a channel formation region; the first transistor has a function of controlling charge and discharge at the first retention node; the second transistor has a function of controlling charge and discharge at the second retention node; the battery has a function of supplying electric power to the first sensor, the reception circuit, the control circuit, the transmission amplifier, the modulation circuit, the memory device, and the analog-to-digital converter circuit through the power supply circuit; the reception circuit has a function of outputting a trigger signal to the control circuit when receiving a signal from the outside; the control circuit that receives the trigger signal has a function of transmitting a control signal to the first sensor, the memory device, the analog-to-digital converter circuit, the modulation circuit, and the transmission amplifier; the first sensor has a function of acquiring an external physical quantity or an external chemical quantity as first sensing data; the analog-to-digital converter circuit has a function of digitizing the first sensing data to generate second sensing data; the memory device has a function of storing the second sensing data; the modulation circuit has a function of modulating the second sensing data; the transmission amplifier has a function of amplifying the second sensing data modulated by the modulation circuit; and the first antenna has a function of transmitting the second sensing data amplified by the transmission amplifier as a first electromagnetic wave signal.

(3)

One embodiment of the present invention is the environmental sensor according to (2), in which the reception circuit includes a detector circuit; the battery has a function of supplying electric power to the detector circuit through the power supply circuit; the first antenna has a function of receiving a second electromagnetic wave signal from the outside; and the detector circuit has functions of demodulating the second electromagnetic wave signal and outputting it as the trigger signal to the control circuit.

(4)

One embodiment of the present invention is the environmental sensor according to (2), characterized in that: the reception circuit includes a second antenna and a detector circuit; the battery has a function of supplying electric power to the detector circuit through the power supply circuit; the second antenna has a function of receiving a second electromagnetic wave signal from the outside; the detector circuit has functions of demodulating the second electromagnetic wave signal and outputting it as the trigger signal to the control circuit; and wherein a frequency of the first electromagnetic wave signal and a frequency of the second electromagnetic wave signal are different from each other.

(5)

One embodiment of the present invention is the environmental sensor according to any one of (1) to (4), characterized in that the sensor has a function of measuring at least one of stress, distortion, temperature, humidity, light quantity, current, voltage, the number of particles, and concentration of the particles as the physical quantity.

(6)

One embodiment of the present invention is the environmental sensor according to any one of (1) to (4), characterized in that the first sensor has a function of measuring the quantity of at least one of an oxide ion, a sulfide ion, a chloride ion, a bromide ion, an iodide ion, a hydroxide ion, a sulfate ion, a carbonate ion, a hydrogen ion, and a calcium ion as the chemical quantity.

(7)

One embodiment of the present invention is the environmental sensor according to any one of (1) to (6), characterized in that: the memory device further includes a first capacitor; and the first capacitor has a function of retaining a voltage at the first retention node.

(8)

One embodiment of the present invention is the environmental sensor according to any one of (1) to (7), characterized in that: the analog-to-digital converter circuit further includes a second capacitor, and the second capacitor has a function of retaining a voltage at the second retention node.

Effect of the Invention

According to one embodiment of the present invention, a novel semiconductor device can be provided. Alternatively, according to one embodiment of the present invention, an electronic device including the novel semiconductor device can be provided. Alternatively, according to one embodiment of the present invention, an object is to provide a novel system using an electronic device including a module including the novel semiconductor device. Alternatively, according to one embodiment of the present invention, a novel electronic device, a novel system, or the like can be provided.

Alternatively, according to one embodiment of the present invention, a semiconductor device capable of sensing even when not receiving radio waves can be provided. Alternatively, according to one embodiment of the present invention, a semiconductor device in which the number of circuits is reduced can be provided. Alternatively, according to one embodiment of the present invention, a semiconductor device with low power consumption can be provided. Alternatively, according to one embodiment of the present invention, a semiconductor device in which the number of times of battery replacement and battery charging can be reduced can be provided. Alternatively, according to one embodiment of the present invention, a semiconductor device that enables long-distance communication can be provided.

Note that the effects of one embodiment of the present invention are not limited to the above effects. The effects described above do not disturb the existence of other effects. Note that other effects are the ones that are not described above and will be described below. Other effects will be apparent from and can be derived from the description of the specification, the drawings, and the like by those skilled in the art. Note that one embodiment of the present invention has at least one of the above effects and other effects.

Accordingly, one embodiment of the present invention does not have the aforementioned effects in some cases.

BRIEF DESCRIPTION OF DRAWINGS

FIG. 10 Circuit diagrams illustrating examples of memory cells.

FIG. 16 Circuit diagrams illustrating part of an analog-to-digital converter circuit.

FIG. 27 Cs-corrected high-resolution TEM images of a cross section of a CAAC-OS and a cross-sectional schematic view of the CAAC-OS.

FIG. 28 Cs-corrected high-resolution TEM images of a plane of a CAAC-OS.

MODE FOR CARRYING OUT THE INVENTION

The term "construction" in this specification refers to, for example, a tunnel, a bridge, an elevated bridge, a utility pole, or a steel tower, and includes a building. The building is, for example, residence (e.g., a solitary house or a collective housing), a commercial facility (e.g., a department store, a supermarket, a shopping mall, or an office building), or a factory.

In this specification, an oxide semiconductor is referred to as an OS (Oxide Semiconductor) in some cases. Thus, a transistor including the oxide semiconductor in a channel formation region is referred to as an OS transistor in some cases. A memory including the OS transistor is referred to as an OS memory in some cases. An analog-to-digital converter circuit including the OS transistor is referred to as an OS analog-to-digital converter circuit in some cases.

In this specification, an environmental sensor of one embodiment of the present invention is a semiconductor device including a sensor that senses a physical or chemical quantity in addition to a reception circuit, a transmission circuit, a battery, a power supply circuit, a control circuit, a memory device, and an analog-to-digital converter circuit. Thus, an "environmental sensor" means a semiconductor device of one embodiment of the present invention. Accordingly, the environmental sensor is referred to as a semiconductor device, an electronic device, or the like in some cases. In addition, the terms "sensor", "first sensor", "second sensor", and the like do not refer to environmental sensors of one embodiment of the present invention and refer to sensors that sense a physical or chemical quantity. In particular, the term "optical sensor" refers to a reception circuit that drives an environmental sensor by using laser light from the outside.

(Embodiment 1)

An environmental sensor of one embodiment of the present invention will be described.

<Configuration Example 1>

Figure 1:
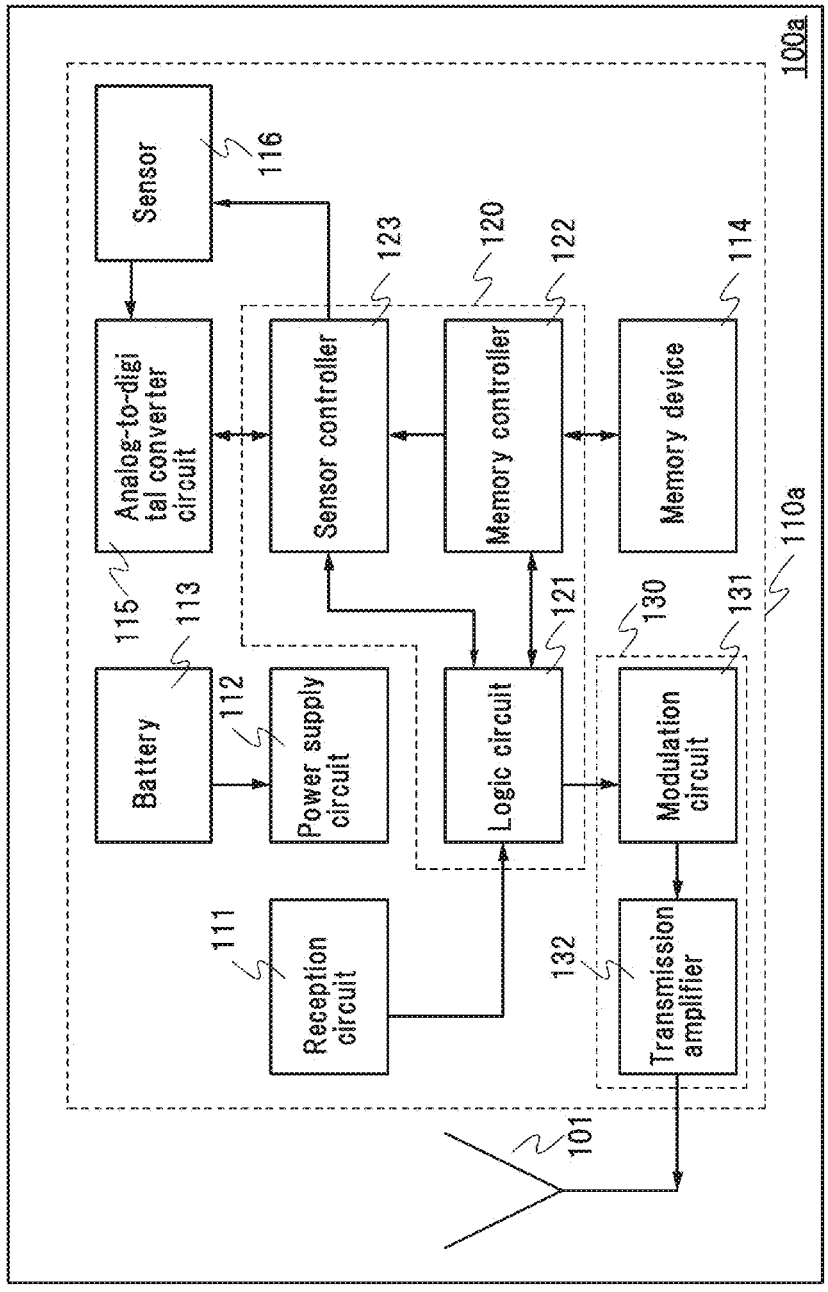
FIG. 1 A block diagram illustrating a semiconductor device.

FIG. 1 shows an example of an environmental sensor of the disclosed invention. An environmental sensor 100a is an active environmental sensor. The environmental sensor 100a includes an antenna 101 and a sensor circuit 110a. The sensor circuit 110a includes a reception circuit 111, a power supply circuit 112, a battery 113, a control circuit 120, a transmission circuit 130, a memory device 114, an analog-to-digital converter circuit 115, and a sensor 116. The control circuit 120 includes a logic circuit 121, a memory controller 122, and a sensor controller 123. The transmission circuit 130 includes a modulation circuit 131 and a transmission amplifier 132.

The antenna 101 is electrically connected to the transmission circuit 130. The transmission amplifier 132 is electrically connected to the modulation circuit 131. The logic circuit 121 is electrically connected to the reception circuit 111, the modulation circuit 131, the memory controller 122, and the sensor controller 123. The memory controller 122 is electrically connected to the sensor controller 123 and the memory device 114. The sensor controller 123 is electrically connected to the analog-to-digital converter circuit 115 and the sensor 116. The sensor 116 is electrically connected to the analog-to-digital converter circuit 115.

The battery 113 is electrically connected to the power supply circuit 112. The battery 113 functions as electromotive force of the environmental sensor 100a, and supplies a potential to the power supply circuit 112. The power supply circuit 112 generates a stable power supply voltage from the potential supplied by the battery 113. Note that although not shown in FIG. 1, the power supply circuit 112 is electrically connected to circuits in order to supply a power supply voltage to the circuits. In addition, a reset signal generation circuit may be provided in the power supply circuit 112. The reset signal generation circuit is a circuit that generates a reset signal of the logic circuit 121 by utilizing rise of the stable power supply voltage.

A power storage device such as a capacitor or a secondary battery, a primary battery, or the like can be used as the battery 113. As the secondary battery, a lead-acid battery, a nickel-cadmium battery, a nickel-hydride battery, or a lithium-ion battery can be used, for example. As the capacitor, an electric double layer capacitor, or a hybrid capacitor in which one of a pair of electrodes has an electric double layer structure and the other utilizes oxidation-reduction reaction can be used, for example. The hybrid capacitor, for example, includes a lithium ion capacitor in which a positive electrode has an electric double layer structure and a negative electrode has a lithium ion secondary battery structure.

The reception circuit 111 has a function of receiving a signal from the outside. The reception circuit 111 can transmit a driving signal to the logic circuit 121 to drive the environmental sensor 100a by receiving a signal from the outside.

The antenna 101 transmits sensing data as a wireless signal to the outside. The logic circuit 121 is a circuit for driving the environmental sensor 100a, and starts its operation when receiving a driving signal from the reception circuit 111. The modulation circuit 131 performs modulation in accordance with data output from the antenna 101.

The transmission amplifier 132 is a circuit for amplifying the data output from the antenna 101. Amplifying the output data enables longer distance communication than the passive RFIC does.

The sensor controller 123 is a circuit that controls the sensor 116 and the analog-to-digital converter circuit 115 in accordance with an instruction signal from the logic circuit 121. The sensor controller 123 also has a function of outputting obtained sensing data.

The analog-to-digital converter circuit 115 has a function of digitizing the sensing data transmitted from the sensor 116.

The memory controller 122 is a circuit that controls the memory device 114 in accordance with the instruction signal from the logic circuit 121. The memory controller 122 also has functions of inputting sensing data to the memory device 114 and outputting the sensing data from the memory device 114.

The memory device 114 has functions of writing and retaining acquired sensing data. In addition, the memory device 114 has functions of reading written sensing data and transmitting the data to the logic circuit 121. In the memory device 114, an operation program of the environmental sensor 100a is also stored.

<Operation Example 1>

Next, operation of the environmental sensor 100a will be described.

The reception circuit 111 inputs a driving signal to the logic circuit 121 by receiving a signal from the outside. The logic circuit 121 receives the driving signal from the reception circuit 111 and drives the memory controller 122 and the sensor controller 123. An output signal from the reception circuit 111 is a trigger signal for driving the control circuit 120. The reception circuit does not always operate unlike the reception amplifier, and operates when receiving a signal. Accordingly, the power consumption of the environmental sensor 100a can be low.

The sensor controller 123 controls the analog-to-digital converter circuit 115 and the sensor 116 such that the analog-to-digital converter circuit 115 digitizes sensing data acquired by the sensor 116. The digitized sensing data is stored in the memory device 114 through the memory controller 122.

At the end of sensing operation, the sensing data stored in the memory device 114 is read. The read sensing data is modulated in the modulation circuit 131 through the memory controller 122 and the logic circuit 121. The modulated sensing data is amplified by the transmission amplifier 132 and is transmitted from the antenna 101. Alternatively, a timer (not illustrated) may be provided, sensing and/or AD conversion may be performed periodically, the acquired sensing data may be stored in the memory device 114, and the transmission circuit 130 may transmit the sensing data when receiving the trigger signal.

In this manner, a signal is transmitted to the environmental sensor 100a and a radio wave output from the antenna 101 is received, whereby the sensing data acquired by the sensor 116 can be obtained.

<Configuration Example 2>

Figure 2:
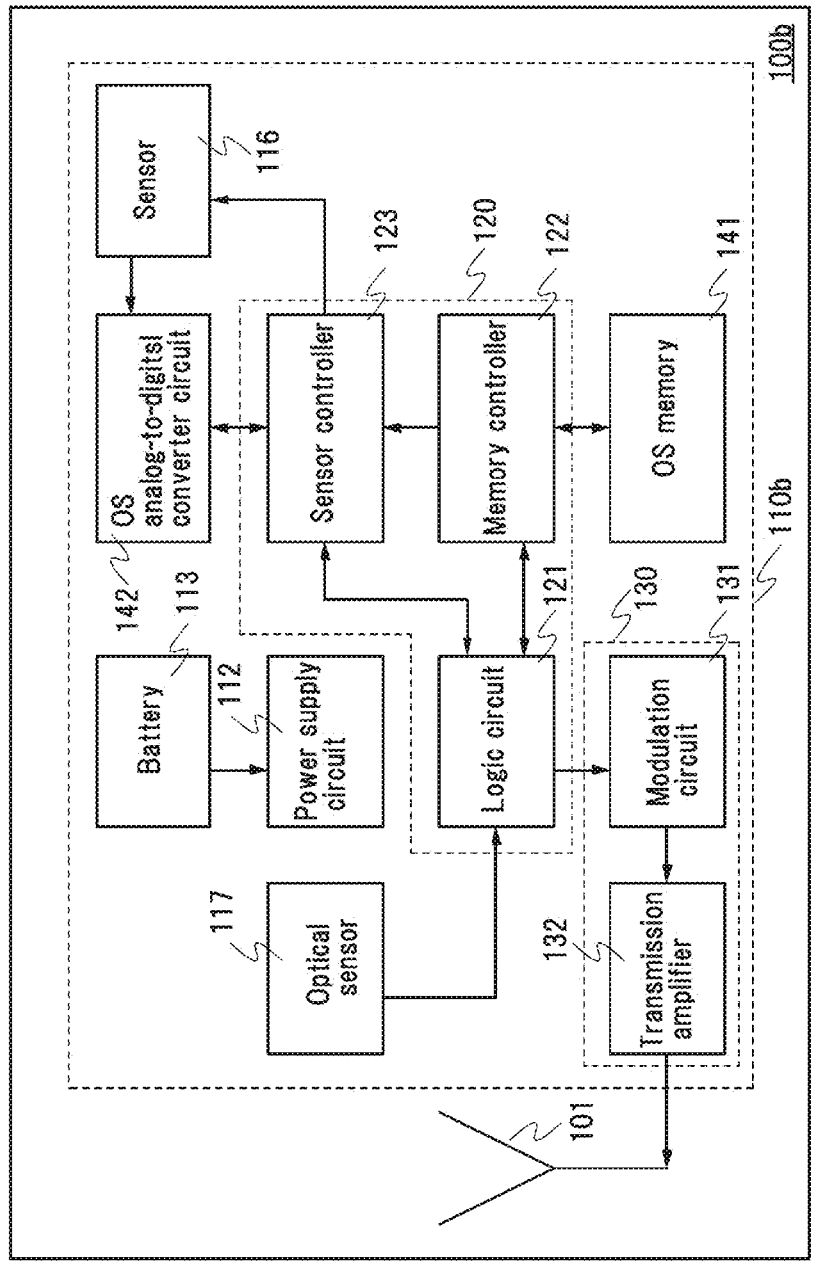
FIG. 2 A block diagram illustrating a semiconductor device.

FIG. 2 shows an example of an environmental sensor of the disclosed invention. An environmental sensor 100b is an active environmental sensor. The environmental sensor 100b is an example in which the signal input from the outside is a photo signal, and the reception circuit is an optical sensor 117. The environmental sensor 100b includes the antenna 101 and a sensor circuit 110b. The sensor circuit 110b includes the optical sensor 117, the power supply circuit 112, the battery 113, the control circuit 120, the transmission circuit 130, an OS memory 141, an OS analog-to-digital converter circuit 142, and the sensor 116. The control circuit 120 includes the logic circuit 121, the memory controller 122, and the sensor controller 123. The transmission circuit 130 includes the transmission amplifier 132 and the modulation circuit 131. In FIG. 2, the memory device 114 included in the environmental sensor 100a is the OS memory 141 with low power consumption, and the analog-to-digital convener circuit 115 included in the environmental sensor 100a is the OS analog-to-digital converter circuit 142 with low power consumption. Such a configuration can further reduce the power consumption.

The antenna 101 is electrically connected to the transmission amplifier 132. The transmission amplifier 132 is electrically connected to the modulation circuit 131. The logic circuit 121 is electrically connected to the optical sensor 117, the modulation circuit 131, the memory controller 122, and the sensor controller 123. The memory controller 122 is electrically connected to the sensor controller 123 and the OS memory 141. The sensor controller 123 is electrically connected to the OS analog-to-digital converter circuit 142 and the sensor 116. The sensor 116 is electrically connected to the OS analog-to-digital converter circuit 142.

The battery 113 is electrically connected to the power supply circuit 112. The battery 113 functions as electromotive force of the environmental sensor 100b, and supplies a potential to the power supply circuit 112. The power supply circuit 112 generates a stable power supply voltage from the potential supplied by the battery 113. Note that although not shown in FIG. 2, the power supply circuit 112 is electrically connected to circuits in order to supply a power supply voltage to the circuits. In addition, a reset signal generation circuit may be provided in the power supply circuit 112. The reset signal generation circuit is a circuit that generates a reset signal of the logic circuit 121 by utilizing rise of the stable power supply voltage.

A power storage device such as a capacitor or a secondary battery, a primary battery, or the like can be used as the battery 113. As the secondary battery, a lead-acid battery, a nickel-cadmium battery, a nickel-hydride battery, or a lithium-ion battery can be used, for example. As the capacitor, an electric double layer capacitor, or a hybrid capacitor in which one of a pair of electrodes has an electric double layer structure and the other utilizes oxidation-reduction reaction can be used, for example. The hybrid capacitor, for example, includes a lithium ion capacitor in which a positive electrode has an electric double layer structure and a negative electrode has a lithium ion secondary battery structure.

The optical sensor 117 has a function of receiving laser light from the outside. The optical sensor 117 can transmit a driving signal to the logic circuit 121 to drive the environmental sensor 100b by receiving laser light.

The antenna 101 transmits sensing data as a wireless signal to the outside. The logic circuit 121 is a circuit for driving the environmental sensor 100b, and starts its operation when receiving a driving signal from the optical sensor 117. The modulation circuit 131 performs modulation in accordance with data output from the antenna 101.

The transmission amplifier 132 is a circuit for amplifying the data output from the antenna 101. Amplifying the output data enables longer distance communication than the passive RFIC does.

The sensor controller 123 is a circuit that controls the sensor 116 and the OS analog-to-digital converter circuit 142 in accordance with an instruction signal from the logic circuit 121. The sensor controller 123 also has a function of outputting obtained sensing data.

The OS analog-to-digital converter circuit 142 is an analog-to-digital converter circuit including a transistor in which an oxide semiconductor is used for a channel formation region. The OS analog-to-digital convener circuit 142 has a function of digitizing sensing data transmitted from the sensor 116.

The memory controller 122 is a circuit that controls the OS memory 141 in accordance with the instruction signal from the logic circuit 121. The memory controller 122 also has functions of inputting sensing data to the OS memory 141 and outputting the sensing data from the OS memory 141.

The OS memory 141 is a memory that includes a transistor in which an oxide semiconductor is used for a channel formation region. The OS memory 141 has functions of writing and retaining acquired sensing data. In addition, the OS memory 141 has functions of reading written sensing data and transmitting the data to the logic circuit 121. In the OS memory, an operation program of the environmental sensor 100b is also stored.

<Operation Example 2>

Next, operation of the environmental sensor 100b will be described.

The optical sensor 117 inputs a driving signal to the logic circuit 121 by receiving laser light from the outside. The logic circuit 121 receives the driving signal from the optical sensor 117 and drives the memory controller 122 and the sensor controller 123. That is, laser light to the optical sensor 117 is a trigger signal for driving the control circuit 120. In addition, the reception circuit does not operate and does not consume electric power when not receiving a signal. Accordingly, the power consumption of the environmental sensor 100b can be low.

The sensor controller 123 controls the OS analog-to-digital converter circuit 142 and the sensor 116 such that the OS analog-to-digital converter circuit 142 digitizes sensing data acquired by the sensor 116. The digitized sensing data is stored in the OS memory 141 through the memory controller 122.

At the end of sensing operation, the sensing data stored in the OS memory 141 is read. The read sensing data is modulated in the modulation circuit 131 through the memory controller 122 and the logic circuit 121. The modulated sensing data is amplified by the transmission amplifier 132 and is transmitted from the antenna 101.

In this manner, laser light is transmitted to the environmental sensor 100b and a radio wave output from the antenna 101 is received, whereby the sensing data acquired by the sensor 116 can be obtained. Alternatively, a timer (not illustrated) may be provided, sensing and/or AD conversion may be performed periodically, the acquired sensing data may be stored in the OS memory 141, and the transmission circuit 130 may transmit the sensing data when receiving the trigger signal.

<Application Example 1>

An application example of the environmental sensor 100b will be described.

Figure 3:
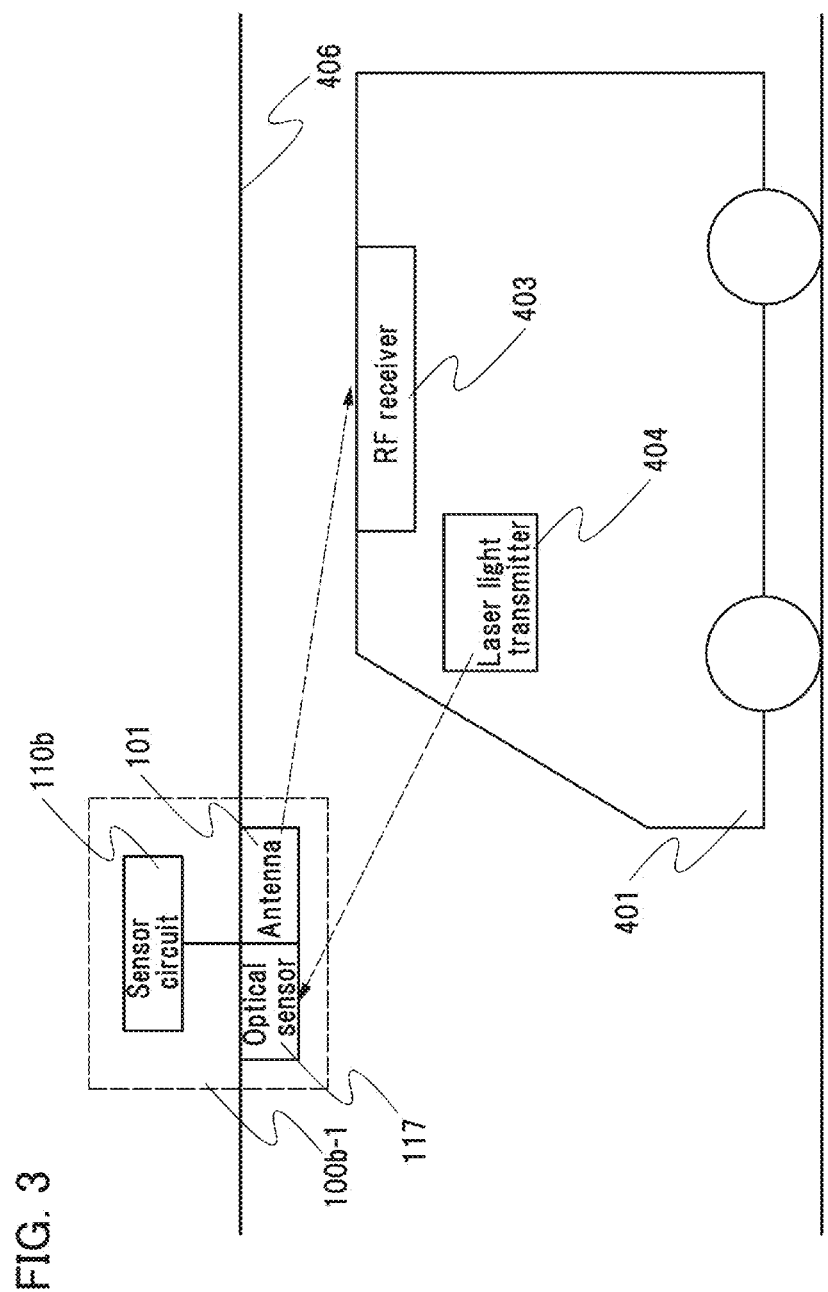
FIG. 3 A diagram illustrating usage of a semiconductor device.

FIG. 3 illustrates an example in which the environmental sensor 100b is provided in a tunnel. An environmental sensor 100b-1 is provided on a ceiling 406 of the tunnel, an RF (Radio Frequency) receiver 403 is provided on a roof portion of an automobile 401, and a laser light transmitter 404 is provided near a car window of the automobile 401.

The antenna 101 and the optical sensor 117 included in the environmental sensor 100b-1 are provided on a surface of the ceiling 406 of the tunnel. Alternatively, depending on circumstances or conditions, the antenna 101 and the optical sensor 117 may be suspended from the ceiling 406 of the tunnel. Further alternatively, only the antenna 101 may be embedded in a wall of the ceiling 406 of the tunnel.

The installation site of the sensor circuit 110b included in the environmental sensor 100b-1 can be changed as appropriate depending on data to be sensed. For example, in order to determine a distortion state, a corrosion state, and the like inside the wall of the ceiling 406 of the tunnel, the sensor circuit 110b may be provided inside the wall of the ceiling 406 as illustrated in FIG. 3. At this time, a sensor capable of sensing a substance that causes deterioration of the ceiling 406 can be used for the sensor 116 included in the sensor circuit 110b. In the case where the ceiling 406 is formed with concrete, examples of the substance that causes deterioration include an oxide ion, a sulfide ion, a chloride ion, a bromide ion, an iodide ion, a hydroxide ion, a sulfate ion, a carbonate ion, a hydrogen ion, and a calcium ion. A sensor capable of measuring the amount of these substances is used.

Alternatively, for example, in order to determine a state of cracks or defects at the surface of the ceiling 406 of the tunnel, the sensor circuit 110b may be provided near the surface of the ceiling 406 of the tunnel. At this time, a sensor capable of sensing a substance that causes deterioration of the ceiling 406 may be used for the sensor 116 included in the sensor circuit 110b as described above. Alternatively, a sensor capable of sensing light quantity may be used. A crack or a defect occurs on the ceiling 406, external light might enter the inside of the ceiling 406 through the crack or the defect. In such a case, the crack or the defect can be found quickly by the sensor sensing light quantity.

Furthermore, as a purpose other than conservation investigation of the ceiling 406 of the tunnel, for example, the air cleanliness inside the tunnel may be measured. In that case, the sensor circuit 110b may be provided on the surface of the ceiling 406 of the tunnel (not illustrated), a sensor capable of measuring the number of particles or the concentration thereof may be used as the sensor 116 included in the sensor circuit 110b. By measuring the number of particles or the concentration thereof, whether a ventilation system inside the tunnel functions can be determined. Accordingly, functions of a ventilator, a jet fan, and the like constituting the ventilation system in the tunnel can be investigated.

When the automobile 401 passes through the tunnel, the laser light transmitter 404 transmits laser light to the optical sensor 117. Note that the optical sensor can detect laser light away from a light source by 100 m or more.

Since the environmental sensor 100b in this embodiment is an active environmental sensor, there is no need to separately transmit power supply as a radio wave. The environmental sensor 100b can conduct sensing rapidly because the environmental sensor 100b includes the battery 113 and does not need to perform processing of commuting a signal received by the antenna which is performed in a passive environmental sensor. Furthermore, the optical sensor only receives laser light that becomes a trigger (that drives the environmental sensor), and the environmental sensor 100b can operate in accordance with a program stored in the OS memory 141 after once receiving the laser light and does not need to receive laser light for a long period.

For this reason, within a short time while the automobile 401 passes through the surroundings of a certain optical sensor, receiving light by the environmental sensor 100b-1 and transmitting a radio wave by the environmental sensor 100b-1 are performed. The RF receiver 403 receives the transmitted radio wave, and thus sensing data measured by the environmental sensor 100b can be acquired.

Figure 4:
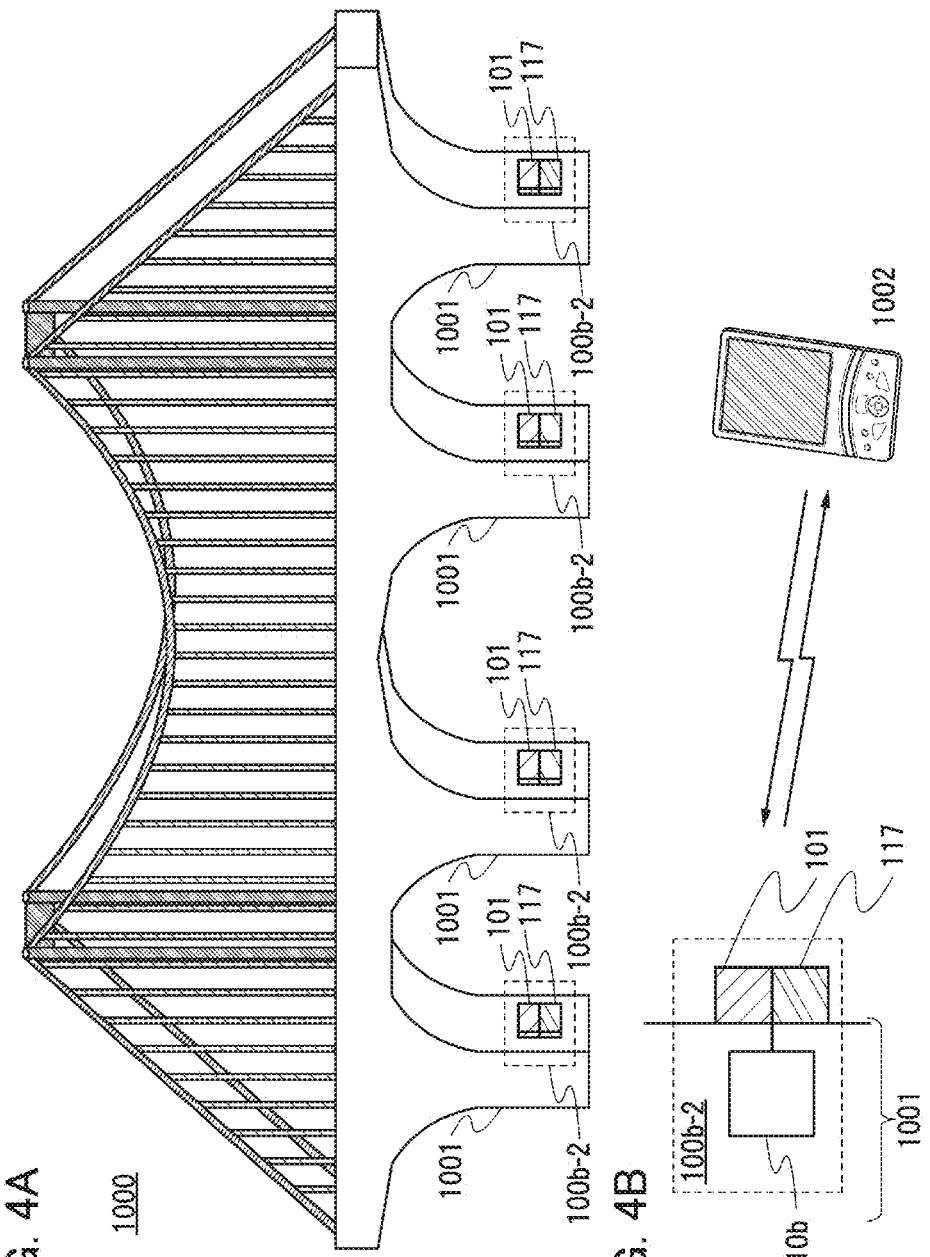
FIG. 4 Diagrams illustrating usage of a semiconductor device.

Application of the environmental sensor 100b of one embodiment of the present invention is not limited to the tunnel in Application example 1. For example, the environmental sensor 100b may be used for conservation investigation of a bridge pier. FIG. 4(A) illustrates an example in which environmental sensors 100b-2 are provided on bridge piers 1001 of a bridge 1000. Specifically, as illustrated in FIG. 4(B), the sensor circuit 110b is embedded in the bridge pier 1001, and the optical sensor 117 and the antenna 101 are provided outside the bridge pier 1001. With such a structure, with use of an information processing terminal 1002 provided with a laser light transmitter and an RF receiver, sensing data can be acquired through communication between the environmental sensor 100b-2 and the information processing terminal 1002, whereby conservation investigation of the bridge pier 1001 can be performed easily.

Figure 5:
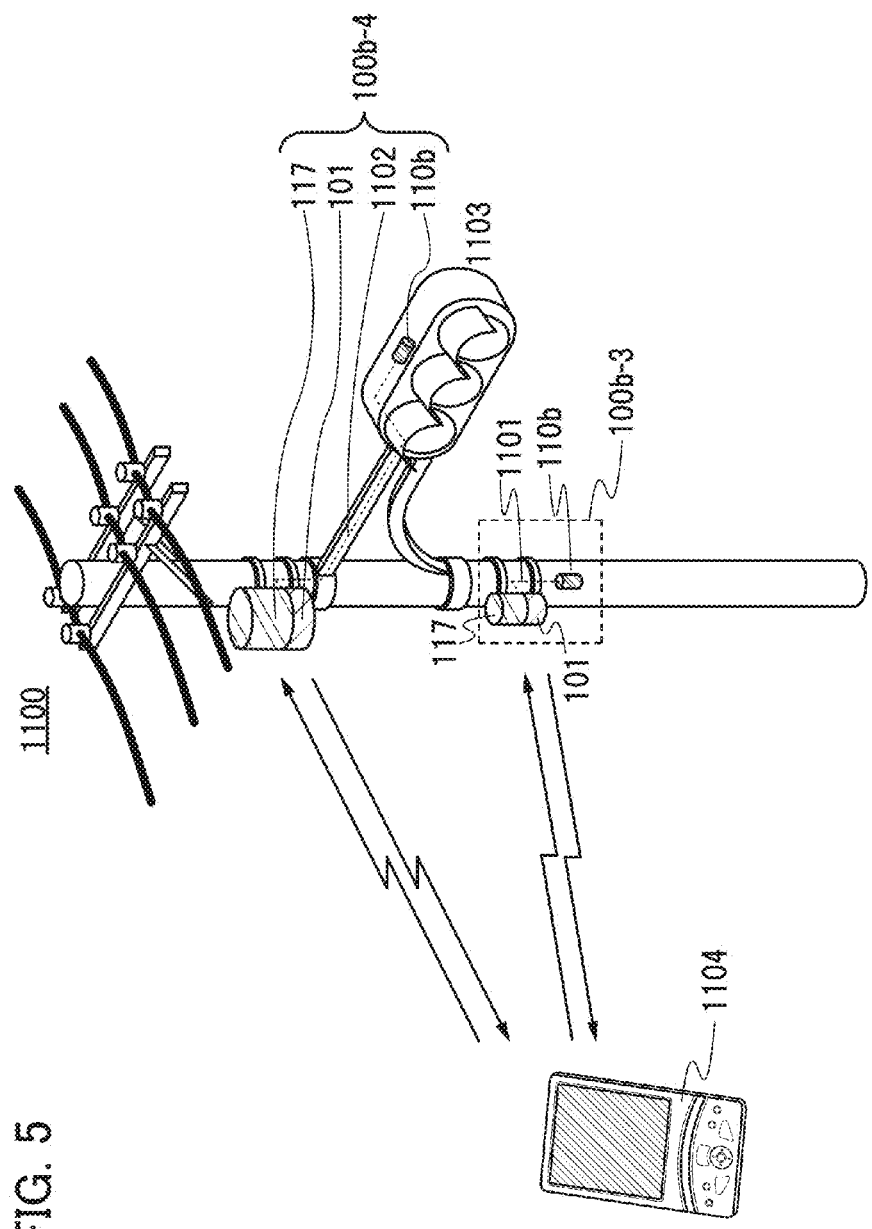
FIG. 5 A diagram illustrating usage of a semiconductor device.

Furthermore, for example, the environmental sensor 100b may be used for conservation investigation of utility poles, traffic lights, and the like. FIG. 5 illustrates an example in which an environmental sensor 100b-3 and an environmental sensor 100b-4 are provided on a utility pole 1100 with a traffic light. The environmental sensor 100b-3 has a structure in which the sensor circuit 110b is embedded in the utility pole 1100 and the optical sensor 117 and the antenna 101 are provided outside the utility pole 1100. The sensor circuit 110b is electrically connected to the optical sensor 117 and the antenna 101 via a wiring 1101. With such a structure, with use of an information processing terminal 1104 provided with a laser light transmitter and an RF receiver, sensing data can be acquired through communication between the environmental sensor 100b-3 and the information processing terminal 1104, whereby conservation investigation of the utility pole 1100 can be performed.

Furthermore, the environmental sensor 100b-4 has a structure in which the sensor circuit 110b is provided inside a traffic light 1103 and the optical sensor 117 and the antenna 101 are provided outside the utility pole 1100. The sensor circuit 110b is electrically connected to the optical sensor 117 and the antenna 101 via a wiring 1102. In that case, a sensor that senses current, voltage, light quantity, or the like inside the traffic light 1103 may be used as the sensor 116 included in the sensor circuit 110b. With such a structure, with use of the information processing terminal 1104 provided with a laser light transmitter and an RF receiver, information of the traffic light can be acquired through communication between the environmental sensor 100b-4 and the information processing terminal 1104, whereby conservation investigation of the traffic light 1103 can be performed easily.

For a purpose other than conservation investigation of the traffic light 1103, by using a sensor capable of measuring the number of particles and the concentration thereof as the sensor 116, the air cleanliness near the portion where the traffic light 1103 is provided can be measured. Specifically, the concentration of a particle, an exhaust gas, a pollen, or the like can be measured.

In addition to the above, providing the environmental sensor 100b in a place difficult to enter facilitates conservation investigation of a provided construction.

The frequency of electromagnetic wave signals used in this embodiment can be selected as appropriate depending on circumstance, environment, and the like in use. For example, in the case where the communication distance is approximately 10 m or shorter, a frequency of the UHF band, specifically, 300 MHz, or a frequency of 430 MHz may be used. In the case where the communication distance is greater than or equal to approximately 50 m and less than or equal to 70 m, a frequency of the microwave band, for example, a frequency of 2.45 GHz may be used. Note that in Configuration example 2 in this embodiment, communication with a distance of greater than or equal to 100 m is possible when a reception circuit is used as an optical sensor; accordingly, an optical sensor is suitable for the reception circuit.

Note that this embodiment can be combined with the other embodiments in this specification as appropriate.

(Embodiment 2)

An environmental sensor of one embodiment of the present invention will be described.

<Configuration Example 3>

Figure 6:
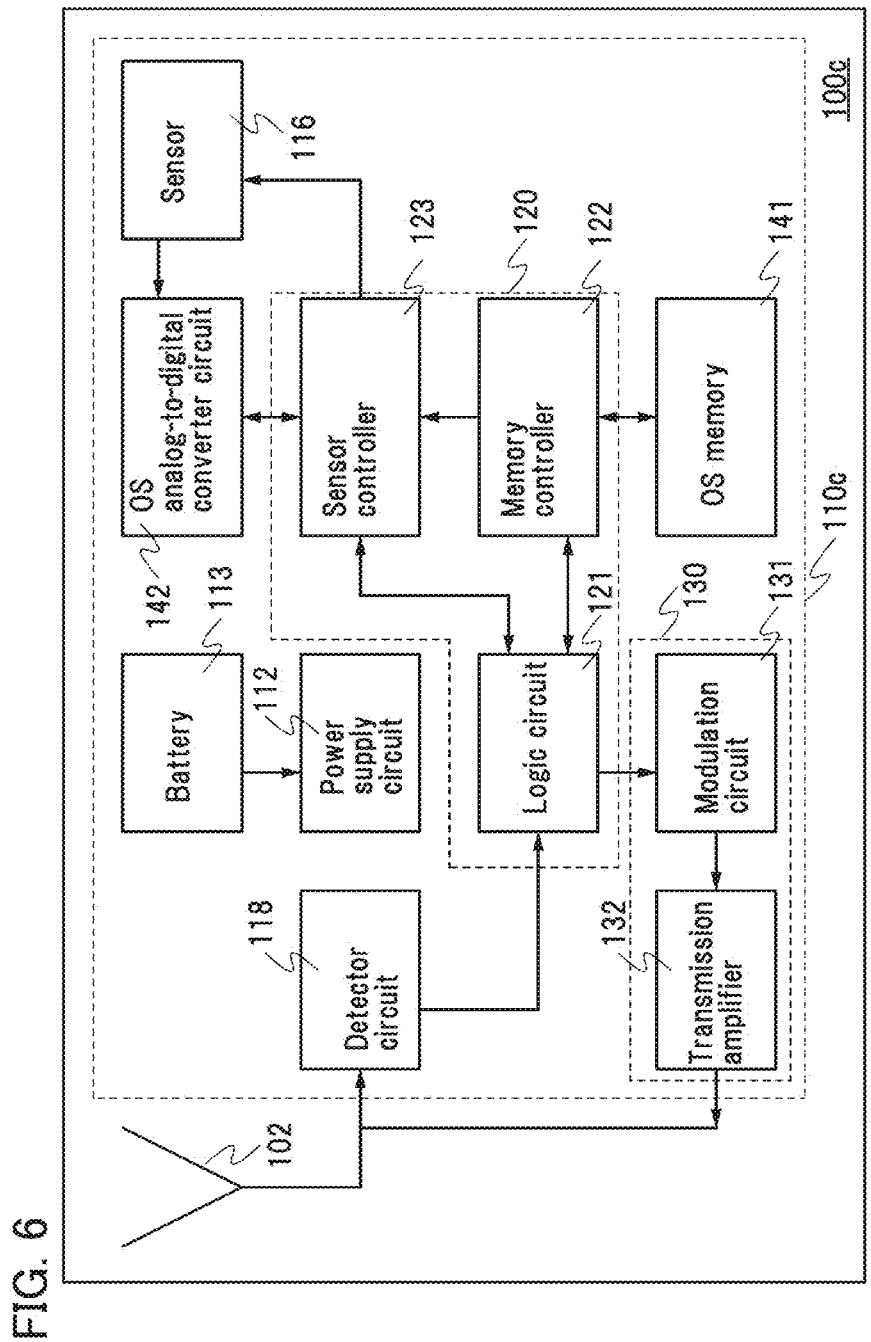
FIG. 6 A block diagram illustrating a semiconductor device.

FIG. 6 shows an example of a semiconductor device of the disclosed invention. An environmental sensor 100c is an active environmental sensor. The environmental sensor 100c is an example in which a signal input from the outside is an electromagnetic wave signal and the reception circuit 111 in the environmental sensor 100a is replaced with a detector circuit 118. The environmental sensor 100c includes an antenna 102 and a sensor circuit 110c. The sensor circuit 110c includes the power supply circuit 112, the battery 113, the detector circuit 118, the control circuit 120, the transmission circuit 130, the OS memory 141, the OS analog-to-digital converter circuit 142, and the sensor 116. The control circuit 120 includes the logic circuit 121, the memory controller 122, and the sensor controller 123. The transmission circuit 130 includes the modulation circuit 131 and the transmission amplifier 132. The transmission circuit 130 includes the modulation circuit 131 and the transmission amplifier 132. In FIG. 6, the OS memory 141 with low power consumption is used instead of the memory device 114 included in the environmental sensor 100a. In addition, the OS analog-to-digital converter circuit 142 with low power consumption is used instead of the analog-to-digital converter circuit 115 included in the environmental sensor 100a. Such a circuit configuration can achieve a further reduction in power consumption.

The antenna 102 is electrically connected to the detector circuit 118 and the transmission amplifier 132. The transmission amplifier 132 is electrically connected to the modulation circuit 131. The logic circuit 121 is electrically connected to the detector circuit 118, the modulation circuit 131, the memory controller 122, and the sensor controller 123. The memory controller 122 is electrically connected to the sensor controller 123 and the OS memory 141. The sensor controller 123 is electrically connected to the OS analog-to-digital converter circuit 142 and the sensor 116.

The battery 113 is electrically connected to the power supply circuit 112. The battery 113 functions as electromotive force of the environmental sensor 100c, and supplies a potential to the power supply circuit 112. The power supply circuit 112 generates a stable power supply voltage from the potential supplied by the battery 113. Note that although not shown in FIG. 6, the power supply circuit 112 is electrically connected to circuits in order to supply a power supply voltage to the circuits. In addition, a reset signal generation circuit may be provided in the power supply circuit 112. The reset signal generation circuit is a circuit that generates a reset signal of the logic circuit 121 by utilizing rise of the stable power supply voltage.

The antenna 102 receives a wireless signal from the outside or transmits sensing data as a wireless signal to the outside. Furthermore, the detector circuit 118 is a circuit for demodulating the input alternating signal by envelope detection and generating a demodulated signal. The logic circuit 121 is a circuit for decoding and processing the demodulated signal. The modulation circuit 131 is a circuit for performing modulation in accordance with data output from the antenna 102.

The transmission amplifier 132 is a circuit for amplifying the data output from the antenna 102. Amplifying the output data enables longer distance communication than the passive RFIC does.

The sensor controller 123 is a circuit that controls the sensor 116 and the OS analog-to-digital convener circuit 142 in accordance with an instruction signal from the logic circuit 121. The sensor controller 123 also has a function of outputting obtained sensing data.

The OS analog-to-digital converter circuit 142 is an analog-to-digital converter circuit including a transistor in which an oxide semiconductor is used for a channel formation region. The OS analog-to-digital converter circuit 142 has a function of digitizing sensing data transmitted from the sensor 116.

The memory controller 122 is a circuit that controls the OS memory 141 in accordance with the instruction signal from the logic circuit 121. The memory controller 122 also has functions of inputting sensing data to the OS memory 141 and outputting the sensing data from the OS memory 141.

The OS memory 141 is a memory on which a transistor that uses an oxide semiconductor for a channel formation region is mounted. The OS memory 141 has functions of writing and retaining acquired sensing data. In addition, the OS memory 141 has functions of reading written sensing data and transmitting the data to the logic circuit 121. In the OS memory 141, an operation program of the environmental sensor 100c is also stored.

Figure 7:
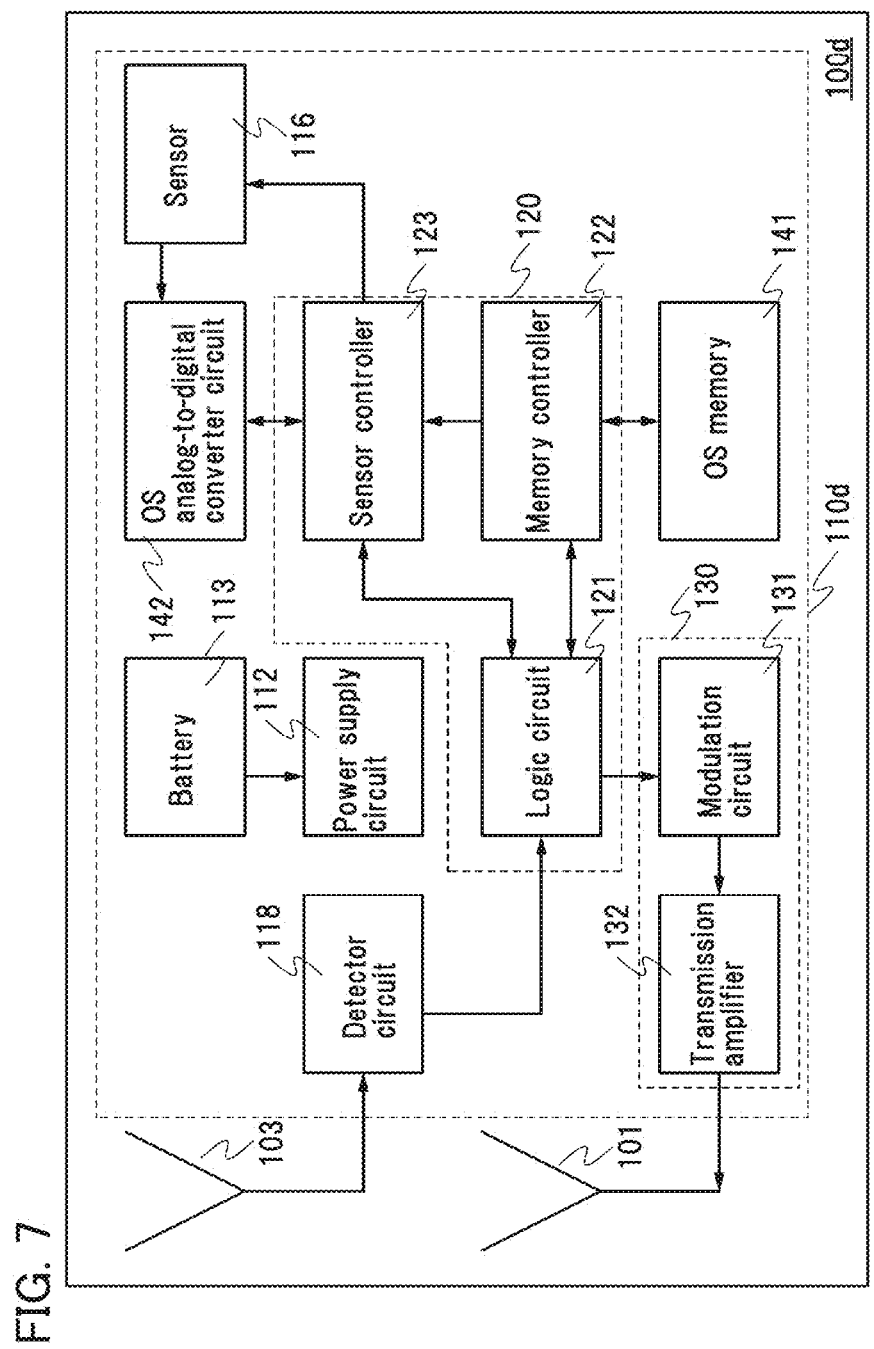
FIG. 7 A block diagram illustrating a semiconductor device.

The configuration of this embodiment is not limited to the configuration example illustrated in FIG. 6. For example, as illustrated in FIG. 7, an environmental sensor 100d which includes the antenna 101 and the antenna 103 in addition to the antenna 102 may be employed. The antenna 103 is electrically connected to the detector circuit 118, and the antenna 101 is electrically connected to the transmission amplifier 132. That is, the antenna 103 is provided as a receiver antenna and the antenna 101 is provided as a transmitter antenna. Thus, a transmission signal can be used as a radio wave whose frequency is different from that of a reception signal.

Since the receiver antenna in the environmental sensor in this embodiment only receives a signal that becomes a trigger (that drives the environmental sensor), frequencies of the reception signal and the transmission signal do not need to be the same. That is, the receiver antenna and the transmitter antenna may be provided and signals with different frequencies may be used as the reception signal and the transmission signal.

<Operation Example 3>

Next, operation of the environmental sensor 100c will be described.

The antenna 102 receives a signal from the outside, and the signal is input to the detector circuit 118. The signal is demodulated by the detector circuit 118 and input to the logic circuit 121. The logic circuit 121 reads the demodulated signal and drives the memory controller 122 and the sensor controller 123.

The sensor controller 123 controls the OS analog-to-digital converter circuit 142 and the sensor 116 such that the OS analog-to-digital converter circuit 142 digitizes sensing data acquired by the sensor 116. The digitized sensing data is stored in the OS memory 141 through the memory controller 122.

At the end of sensing operation, the sensing data stored in the OS memory 141 is read. The read sensing data is modulated in the modulation circuit 131 through the memory controller 122 and the logic circuit 121. The modulated sensing data is amplified by the transmission amplifier 132 and is transmitted from the antenna 102. Alternatively, a timer (not illustrated) may be provided, sensing and/or AD conversion may be performed periodically, the acquired sensing data may be stored in the OS memory 141, and the transmission circuit 130 may transmit the sensing data when receiving the trigger signal.

In this manner, a radio wave can be transmitted and received with the environmental sensor 100c, whereby the sensing data acquired by the sensor 116 can be obtained.

<Application Example 2>

An application example of the environmental sensor 100c will be described.

Figure 8:
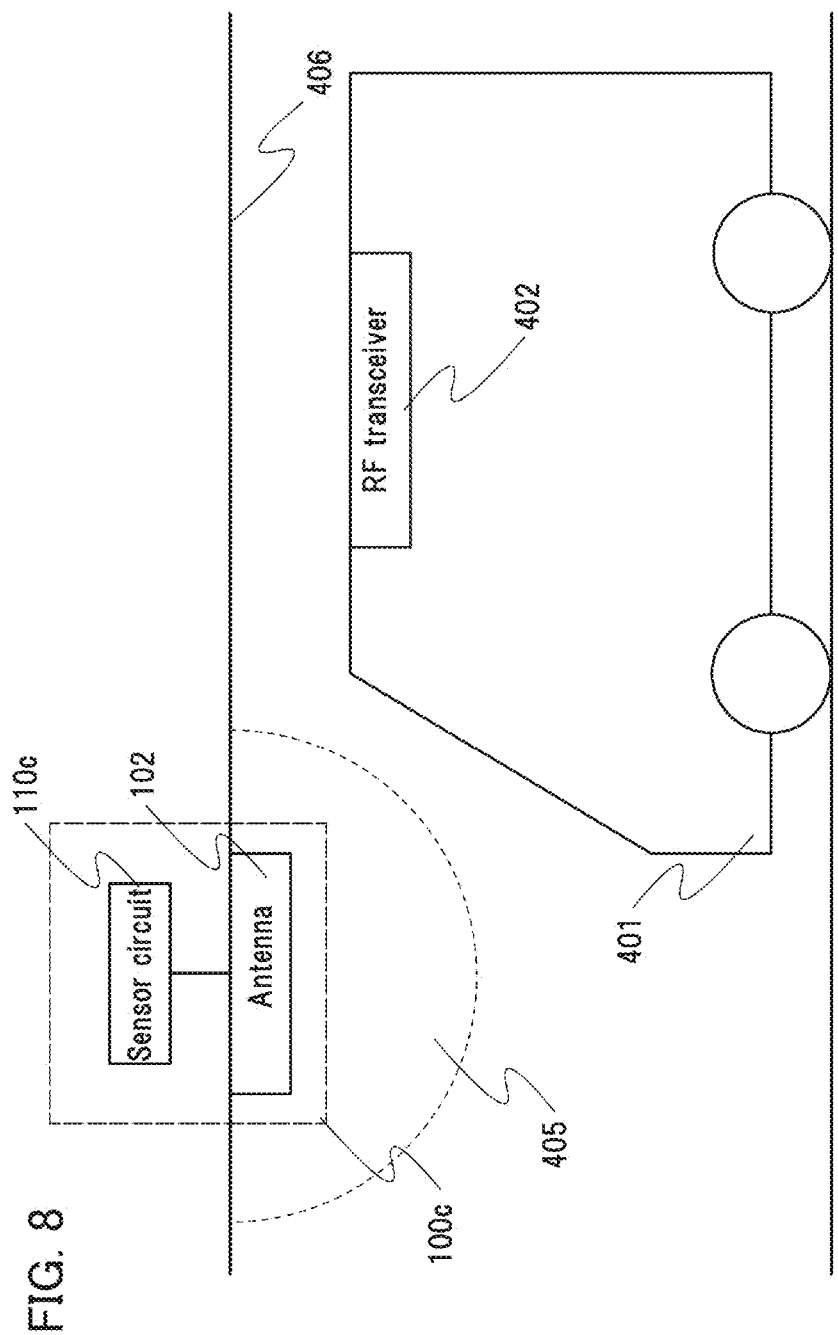
FIG. 8 A diagram illustrating usage of a semiconductor device.

FIG. 8 illustrates an example in which the environmental sensor 100c is provided in a tunnel. The environmental sensor 100c is provided on the ceiling 406 of the tunnel. The automobile 401 includes an RF transceiver 402 on the roof portion.

The antenna 102 included in the environmental sensor 100c are provided on a surface of the ceiling 406 of the tunnel. Alternatively, depending on circumstances or conditions, the antenna 102 may be suspended from the ceiling 406 of the tunnel, or may be embedded in the wall of the ceiling 406 of the tunnel.

The installation site of the sensor circuit 110c included in the environmental sensor 100c can be changed as appropriate depending on data to be sensed. For example, in order to determine a distortion state, a corrosion state, and the like inside the wall of the ceiling 406 of the tunnel, the sensor circuit 110c may be provided inside the wall of the ceiling 406 of the tunnel as illustrated in FIG. 8. At this time, a sensor capable of sensing a substance that causes deterioration of the ceiling 406 can be used for the sensor 116 included in the sensor circuit 110c. In the case where the ceiling 406 is formed with concrete, examples of the substance that causes deterioration include an oxide ion, a sulfide ion, a chloride ion, a bromide ion, an iodide ion, a hydroxide ion, a sulfate ion, a carbonate ion, a hydrogen ion, and a calcium ion. A sensor capable of measuring the amount of these substances is used.

The installation site of the sensor 116 included in the environmental sensor 100c can be changed as appropriate depending on data to be sensed. For example, in order to determine a distortion state, a corrosion state, and the like inside the wall of the ceiling 406 of the tunnel, the sensor 116 may be provided inside the wall of the ceiling 406 of the tunnel as illustrated in FIG. 8. Alternatively, for example, in order to determine a surface state of the ceiling 406 of the tunnel, the sensor 116 may be provided on a surface of the ceiling 406 of the tunnel.

When the automobile 401 passes through the tunnel, the RF transceiver 402 transmits a radio wave 405 to the antenna 102. Note that time while the automobile 401 passes through the surrounding of a certain antenna is short, and thus the environmental sensor is required to conduct sensing in a short time.

Since the environmental sensor 100c is an active environmental sensor, there is no need to transmit power supply as a radio wave. Since including the battery 113, the environmental sensor 100c can conduct sensing rapidly by receiving a radio wave from the RF transceiver 402. Furthermore, the environmental sensor 100c can operate in accordance with a program stored in the OS memory 141 after once receiving the radio wave and does not need to receive the radio wave for a long period. Sensing does not depend on the communication distance, and thus sensing is possible even when the receiving time is short.

Accordingly, within a short time while the automobile 401 passes through the surrounding of a certain antenna, a radio wave can be transmitted and received between the automobile 401 and the environmental sensor 100c, whereby sensing data can be obtained from the environmental sensor 100c.

An application method of the environmental sensor 100c in this embodiment is not limited to the tunnel in Application example 2. For example, as in Embodiment 1, the environmental sensor 100b-2 in the bridge pier 1001 illustrated in FIG. 4(A) may be replaced with the environmental sensor 100c or the environmental sensor 100d, and the information processing terminal 1002 provided with an RF transceiver may be used for conservation investigation of the bridge pier 1001. Alternatively, for example, the environmental sensor 100b-3 or the environmental sensor 100b-4 in the utility pole 1100 with the traffic light illustrated in FIG. 5 may be replaced with the environmental sensor 100c or the environmental sensor 100d and conservation investigation of the utility pole 1100 and the traffic light 1103 may be performed. In addition to the above, providing the environmental sensor 100c or the environmental sensor 100d in a place difficult to enter facilitates conservation investigation of a provided construction.

The frequency of electromagnetic wave signals used in this embodiment can be selected as appropriate depending on circumstance, environment, and the like in use. For example, in the case where the communication distance is approximately 10 m or shorter, a frequency of the UHF band, specifically, 300 MHz, or a frequency of 430 MHz may be used. In the case where the communication distance is greater than or equal to approximately 50 m and less than or equal to 70 m, a frequency of the microwave band, for example, a frequency of 2.45 GHz may be used.

Note that this embodiment can be combined with the other embodiments in this specification as appropriate.

(Embodiment 3)

A configuration example of a memory device of one embodiment of the present invention will be described with reference to FIG. 9.

Figure 9:
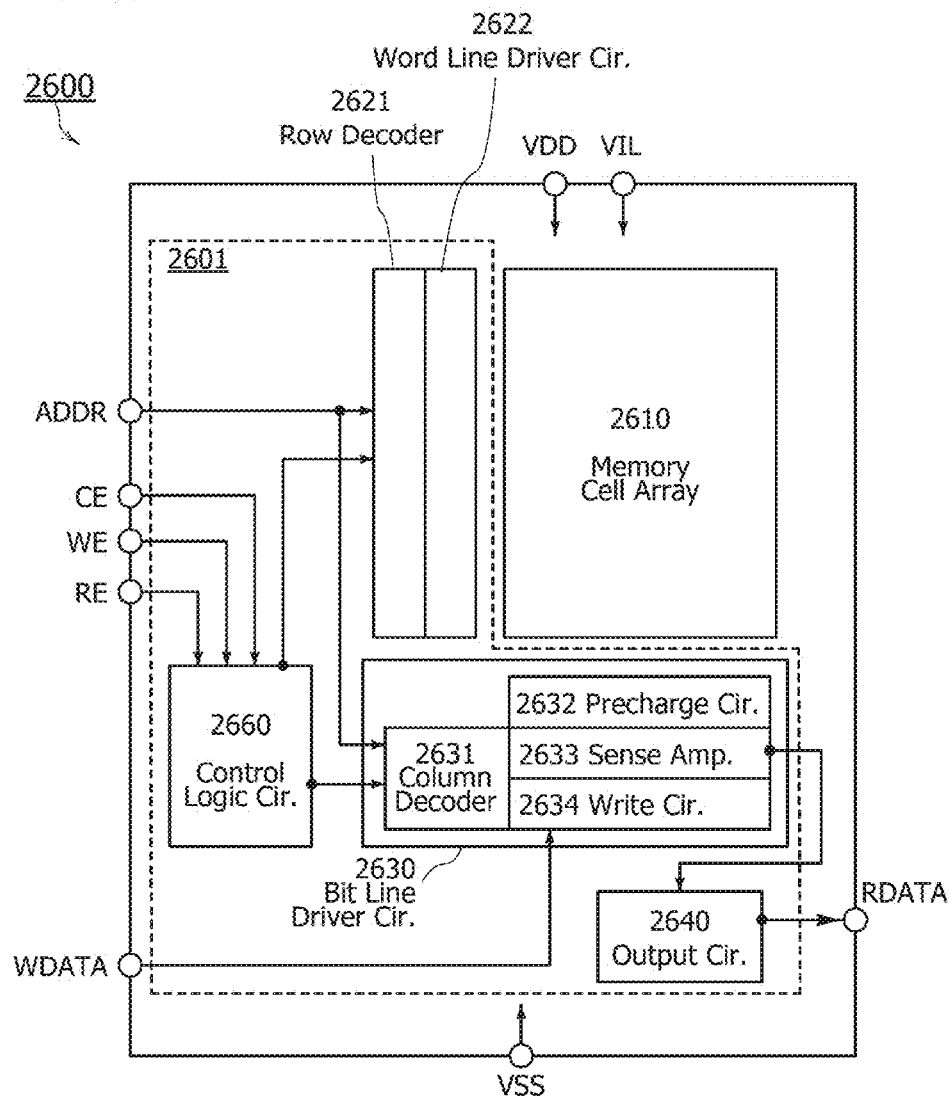
FIG. 9 A block diagram illustrating an example of a memory device.

FIG. 9 illustrates a configuration example of a memory device. A memory device 2600 includes a peripheral circuit 2601 and a memory cell array 2610 (denoted by Memory Cell Array in the drawing). The peripheral circuit 2601 includes a row decoder 2621 (denoted by Low Decoder in the drawing), a word line driver circuit 2622 (abbreviated to Word Line Driver Cir. in the drawing), a bit line driver circuit 2630 (abbreviated to Bit Line Driver Cir. in the drawing), an output circuit 2640 (abbreviated to Output Cir. in the drawing), and a control logic circuit 2660 ((abbreviated to Control Logic Cir. in the drawing)).

The bit line driver circuit 2630 includes a column decoder 2631 (abbreviated to Column Decoder in the drawing), a precharge circuit 2632 (abbreviated to Precharge Cir. in the drawing), a sense amplifier 2633 (abbreviated to Sense Amp. in the drawing), and a write circuit 2634 (abbreviated to Write Cir. in the drawing). The precharge circuit 2632 has a function of precharging wirings (BL and BLB) and a function of making the voltages of the wiring BL and the wiring BLB in the same column equal. The sense amplifier 2633 has a function of amplifying data signals (D, DB, D1, and D2) read from the wirings (BL and BLB). The amplified data signal is output as a digital data signal RDATA from the memory device 2600 through the output circuit 2640. Note that the wiring BL and the wiring BLB are wirings which are connected to memory cells, and the data signals D, DB, D1, and D2 are data signals written to memory cells or reading data signals from the memory cells. Tire details will he described in Embodiment 4.

As power source voltages, a low power source voltage (VSS), a high power source voltage (VDD) for the peripheral circuit 2601, and a high power source voltage (VIL) for the memory cell array 2610 are supplied to the memory device 2600 from the outside.

Control signals (CE, WE, and RE), an address signal ADDR, and a data signal WDATA arc input to the memory device 2600 from the outside. The address signal ADDR is input to the row decoder 2621 and the column decoder 2631, and the data signal WDATA is input to the write circuit 2634.

The control logic circuit 2660 processes the signals (CE, WE, and RE) input from the outside, and generates control signals for the row decoder 2621 and the column decoder 2631. CE is a chip enable signal, WE is a write enable signal, and RE is a read enable signal. Signals processed by the control logic circuit 2660 are not limited to those listed above, and other control signals may be input as necessary.

Note that whether each of the aforementioned circuits or signals is provided can be determined as appropriate and as needed.

When a p-channel Si transistor and a transistor including a channel formation region using an oxide semiconductor described in a later embodiment are used in the memory device 2600, the memory device 2600 with a reduced in size can be provided.

In addition, the memory device 2600 whose power consumption can be reduced can be provided. Furthermore, the memory device 2600 whose operation speed can be increased can be provided. In particular, by using only a p-channel transistor as the Si transistor, manufacturing costs can be reduced.

Furthermore, a memory cell to be described in Embodiment 4 can be used as a memory cell in the memory cell array 2610.

Note that this embodiment can be combined with the other embodiments in this specification as appropriate.

(Embodiment 4)

A configuration example of a memory cell of one embodiment of the present invention will be described with reference to FIGS. 10(A) to 10(E) and FIGS. 11(A) and 11(B).

FIG. 10(A) is a circuit diagram illustrating a configuration example of a memory cell. A memory cell 1203 includes a transistor Mos3 and a capacitor C103. One of a source and a drain of the transistor Mos3 is electrically connected to a wiring BL. The other of the source and the drain of the transistor Mos3 is electrically connected to one electrode of the capacitor C103. A gate of the transistor Mos3 is electrically connected to a wiring WL. The low power supply potential (VSS) is applied to the other electrode of the capacitor C103.

A node FN3 is provided between the other of the source and the drain of the transistor Mos3 and the one electrode the capacitor C103 and serves as a data retention portion. The transistor Mos3 functions as a switch that connects the node FN3 to the wiring BL. A signal D is input and output to and from the wiring BL as a write signal and a read signal. As a signal for selecting a memory cell, a signal OSG is input to the wiring WL.

Data writing and data reading are performed when the transistor Mos3 is turned on to connect the node FN3 to the wiring BL.

Figure 11A:
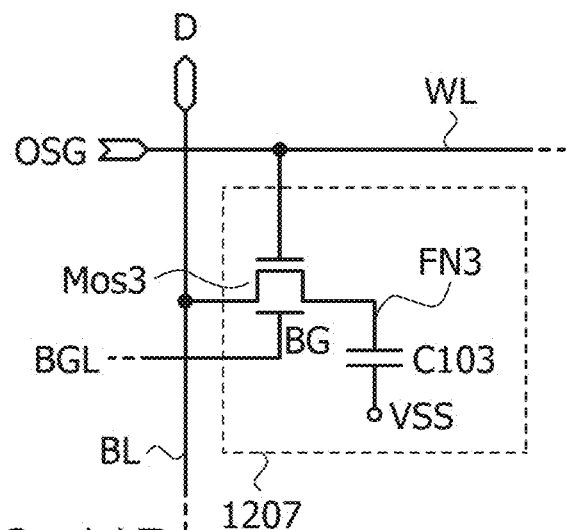
FIG. 11 Circuit diagrams illustrating examples of memory cells.
Figure 11B:
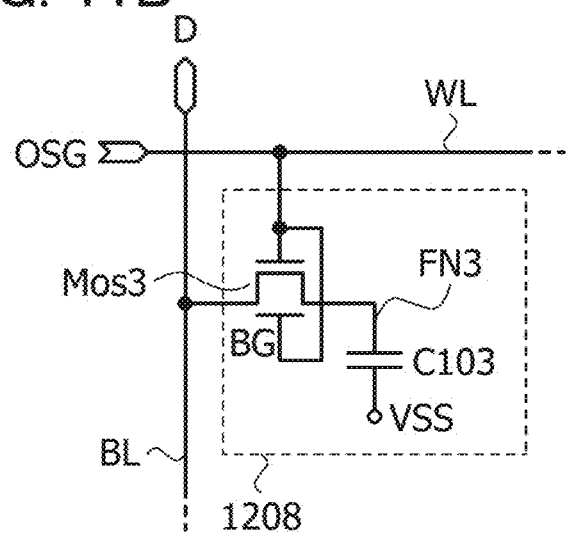

FIGS. 11(A) and 11(B) illustrate a memory cell 1207 and a memory cell 1208 in each of which a back gate is added to the memory cell 1203. In the memory cell 1207 illustrated in FIG. 11(A), a back gate BG and a wiring BGL are provided for the transistor Mos3, and a predetermined potential is applied to the back gate BG from the wiring BGL. The threshold voltage of the transistor Mos3 can be controlled by controlling the potential from the wiring BGL. In the memory cell 1208 illustrated in FIG. 11(B), the back gate BG is provided for the transistor Mos3 and electrically connected to the front gate of the transistor Mos3 (or the wiring WL). With this structure, the same potential is applied to the front gate and the back gate BG, so that the amount of current flowing through the transistor Mos3 when the transistor Mos3 is on can be increased.

Note that the back gate can be provided not only in the memory cells 1207 and 1208 but also in other memory cells. For example, the back gate can be provided in a memory cell 1204, a memory cell 1205, a memory cell 1206, and a memory cell 1200 to be described later.

FIG. 10(B) is a circuit diagram illustrating a configuration example of a memory cell. The memory cell 1204 includes a transistor Mos4, a transistor M104, and a capacitor C104. One of a source and a drain of the transistor Mos4 is electrically connected to the wiring BL. The other of the source and the drain of the transistor Mos4 is electrically connected to one electrode of the capacitor C104 and a gate of the transistor M104. A gate of the transistor Mos4 is electrically connected to the wiring WL. One of a source and a drain of the transistor M104 is electrically connected to the wiring BL. The other of the source and the drain of the transistor M104 is electrically connected to a wiring SL. The other electrode of the capacitor C104 is electrically connected to a wiring WLC.

A node FN4 is provided among the other of the source and the drain of the transistor Mos4, the gate of the transistor M104, and the one electrode the capacitor C104 and serves as a data retention portion. The transistor Mos4 functions as a switch that connects the node FN4 to the wiring BL. The signal OSG is input to the wiring WL. The capacitor C104 connects the wiring WLC to the node FN4. The wiring WLC is a wiring for supplying constant voltage to the terminal of the capacitor C104 in writing and reading operations. The transistor M104 is a p-channel transistor.

While constant voltage is applied to the wirings WLC and SL, data is written by turning on the transistor Mos4 and connecting the node FN4 to the wiring BL. For data reading, constant voltage is applied to the wirings BL, WLC, and SL. The value of current flowing between the source electrode and the drain electrode of the transistor M104 changes depending on the voltage of the node FN4. The wiring BL is charged or discharged by the current between the source and the drain of the transistor M104, so that the value of data retained in the memory cell 1204 can be read by detecting the voltage (signal D) of the wiring BL.

Note that the transistor M104 can be an n-channel transistor. That is, a voltage applied to the wirings (BL, SL, and WLC) may be determined on the basis of the polarity of the transistor M104.

FIG. 10(C) is a circuit diagram illustrating a configuration example of a memory cell. The memory cell 1206 includes a transistor Mos6, a transistor M107, and a transistor M108. One of a source and a drain of the transistor Mos6 is electrically connected to a wiring WBL. The other of the source and the drain of the transistor Mos6 is electrically connected to a gate of the transistor M108. A gate of the transistor Mos6 is electrically connected to a wiring WWL. One of a source and a drain of the transistor M107 is electrically connected to a wiring RBL. The other of the source and the drain of the transistor M107 is electrically connected to one of a source and a drain of the transistor M108. A gate of the transistor M107 is electrically connected to a wiring RWL. The low power supply potential (VSS) is applied to the other of the source and the drain of the transistor M108.

A node FN6 is provided between the other of the source and the drain of the transistor Mos6 and the gate of the transistor M108 and serves as a data retention portion. The transistor Mos6 functions as a switch that connects the node FN6 to the wiring WBL. The transistor M107 functions as a switch that connects the wiring RBL to the one of the source and the drain of the transistor. The signal D1 is input to the wiring WBL as a data write signal. As a signal for selecting a memory cell, the signal OSG is input to the wiring WWL.

Data is written by turning on the transistor Mos6 and connecting the node FN6 to the wiring WBL. For data reading, the transistor M107 is turned on after constant voltage is applied to the wiring RBL in advance. The value of current flowing between the source electrode and the drain electrode of the transistor M108 changes depending on the voltage of the node FN6. The wiring RBL is charged or discharged by the current between the source and the drain of the transistor M108, so that the value of data retained in the memory cell 1206 can be read by detecting the voltage (signal D2) of the wiring RBL.

FIG. 10(D) is a circuit diagram illustrating a configuration example of a memory cell. The memory cell 1205 includes a transistor Mos5, a transistor M105, a transistor M106, and a capacitor C105. One of a source and a drain of the transistor Mos5 is electrically connected to the wiring BL. The other of the source and the drain of the transistor Mos5 is electrically connected to a gate of the transistor M106 and one electrode of the capacitor C105. A gate of the transistor Mos5 is electrically connected to the wiring WL. One of a source and a drain of the transistor M105 is electrically connected to the wiring BL. The other of the source and the drain of the transistor M105 is electrically connected to one of a source and a drain of the transistor M106. A gate of the transistor M105 is electrically connected to the wiring RWL. The other of the source and the drain of the transistor M106 is electrically connected to the other electrode of the capacitor C105. The low power supply potential (VSS) is applied to the other of the source and the drain of the transistor M106 and the other electrode of the capacitor C105.

A node FN5 is provided among the other of the source and the drain of the transistor Mos5, the gate of the transistor M106, and the one electrode the capacitor C105 and serves as a data retention portion. The transistor Mos5 functions as a switch that connects the node FN5 to the wiring BL. The signal OSG is input to the wiring WL.

Data is written by turning on the transistor Mos5 and connecting the node FN4 to the wiring BL. Data is read by turning on the transistor M105. The value of current flowing between the source and the drain of the transistor M106 changes depending on the voltage of the node FN5. The wiring BL is charged or discharged by the current between the source electrode and the drain electrode of the transistor M106, so that the value of data retained in the memory cell 1205 can be read by detecting the voltage (signal D) of the wiring BL.

Note that the transistors M105 and M106 can be p-channel transistors. Thus, voltage applied to the wiring RWL and voltage applied to the capacitor C105 may be determined in accordance with the polarities of the transistors M105 and M106.

The memory cell 1200 in FIG. 10(E) is an example of an SRAM cell in which backup operation can be performed. The memory cell 1200 includes transistors M101, M102, Mos1, and Mos2, inverters INV101 and INV102, and capacitors C101 and C102. The memory cell 1200 is connected to the wirings WL, BL, BLB, and BRL. The low power supply voltage (VSS) or the like is applied to the memory cell 1200 as power supply voltage.

An input terminal and an output terminal of the inverter INV101 are connected to an output terminal and an input terminal of the inverter INV102, respectively, so that the memory cell 1200 has a configuration of an inverter loop circuit. A gate electrode of the transistor M101 and a gate electrode of the transistor M102 are connected to the wiring WL. The transistor M101 functions as a switch that connects the wiring BL to an input node of the inverter INV101, and the transistor M102 functions as a switch that connects the wiring BLB to an input node of the inverter INV102.

The wiring WL functions as a writing/reading word line, and a signal (WLE) for selecting a memory cell is input from a word line driver circuit. The wirings BL and BLB function as bit lines that transmit data signals D and DB. The data signal DB is a signal that is obtained by inverting the logic value of the data signal D. The data signals D and DB are supplied from a bit line driver circuit. Furthermore, the wirings BL and BLB are also wirings for transmitting data read from the memory cell 1200 to an output circuit.

The memory cell 1200 corresponds to a circuit including a volatile storage circuit (the inverters INV101 and INV102 and the transistors M101 and M102) and a pair of storage circuits (the transistor Mos1 and the capacitor C101) and (the transistor Mos2 and the capacitor C102). The storage circuits (the transistor Mos1 and the capacitor C101) and (the transistor Mos2 and the capacitor C102) are each a circuit for backing up data of the volatile storage circuit by storing potentials held in a node NET1 and a node NET2, respectively. These storage circuits turn on the transistors Mos1 and Mos2 to charge or discharge the capacitors C101 and C102 so that data is written, and turn off the transistors Mos1 and Mos2 to store charge accumulated in the capacitors C101 and C102 so that data is retained without power supply.

Data is recovered by turning on the transistors Mos1 and Mos2. The transistors Mos1 and Mos2 are turned on while supply of power to the inverters INV101 and INV102 is stopped, whereby a node FN1 and the node NET1 are connected so that charge is shared by the node FN1 and the node NET1, and a node FN2 and the node NET2 are connected so that charge is shared by the node FN2 and the node NET2. Then, power is supplied to the inverters INV101 and INV102, so that data is restored to the inverter loop circuit depending on the potentials of the node NET1 and the node NET2. After that, the transistors Mos1 and Mos2 are turned off.

Gate electrodes of the transistors Mos1 and Mos2 are connected to the wiring BRL. The signal OSG is input to the wiring BRL. In response to the signal OSG, the storage circuits (the transistor Mos1 and the capacitor C101) and (the transistor Mos2 and the capacitor C102) is driven and backup or recovery operation is performed.

Structures and operations of the storage circuits (the transistor Mos1 and the capacitor C101) and (the transistor Mos2 and the capacitor C102) are described below.

The storage circuits (the transistor Mos1 and the capacitor C101) and (the transistor Mos2 and the capacitor C102) accumulates charge in the capacitors C101 and C102, so that the potentials of the nodes FN1 and FN2 are held. When the transistors Mos1 and Mos2 are turned on, the node NET1 and the node FN1 are connected and the potential held in the node NET1 is applied to the node FN1. Furthermore, when the transistor Mos2 is turned on, the node NET2 and the node FN2 are connected and the potential held in the node NET2 is applied to the node FN2. In addition, turning off the transistors Mos1 and Mos2 brings the nodes FN1 and FN2 into an electrically floating state, so that charge accumulated in the capacitors C101 and C102 is held and the storage circuits are brought into a data retention state.

For example, in the case where the node FN1 has a high potential, charge may leak from the capacitor C101 and the voltage of the node FN1 might decrease gradually. Each of the transistors Mos1 and Mos2 preferably includes an oxide semiconductor (preferably an oxide containing In, Ga, and Zn) in a channel formation region. Consequently, leakage current flowing between the source electrode and the drain electrode in an off state (off-state current) is extremely low; thus, voltage variation of the node FN1 can be suppressed. That is, the circuit including the transistor Mos1 and the capacitor C101 can be operated as a nonvolatile storage circuit or a storage circuit that can retain data for a long time without power supply. Furthermore, in a similar manner, the circuit including the transistor Mos2 and the capacitor C102 can be used as a backup storage circuit of the volatile storage circuit (the inverters INV101 and INV102 and the transistors M101 and M102).

A transistor described as an example in Embodiment 6 can be used as the transistors Mos1 and Mos2. Because of the low off-state current of the transistors Mos1 and Mos2, the memory cell 1200 can retain data for a long time without power supply. The favorable switching characteristics of the transistors Mos1 and Mos2 facilitate backup and recovery operations of the memory cell 1200.

As in FIG. 10(E), in the configuration examples of the memory cells in FIGS. 10(A) to 10(D), each of the transistors Mos3, Mos4, Mos5, and Mos6 preferably includes an oxide semiconductor (preferably an oxide containing In, Ga, and Zn) in a channel formation region. Consequently, a leakage current (off-state current) that flows between a source electrode and a drain electrode in an off state is extremely low; thus, voltage variation of the nodes FN3, FN4, FN5, and FN6 can be suppressed. That is, each of the memory cells 1203, 1204, 1205, and 1206 can be operated as a storage circuit that can retain data for a long time without power supply.

The memory cell described in this embodiment and the transistor that includes an oxide semiconductor in a channel formation region and is described as an example in Embodiment 6 are used in the memory device 2600 described in the above embodiment, so that it is possible to provide the memory device 2600 that includes a storage circuit capable of retaining data for a long time without power supply and can have a smaller size, reduced power consumption, a higher speed, or a smaller power supply voltage variation.

N-channel transistors used in the memory cell may each be replaced with the transistor that includes an oxide semiconductor in a channel formation region and is described as an example in Embodiment 6. In particular, by using only a p-channel transistor as the Si transistor, manufacturing cost can be reduced.

Note that this embodiment can be combined with the other embodiments in this specification as appropriate.

(Embodiment 5)

A configuration example of an analog-to-digital converter circuit of one embodiment of the present invention will be described.

Figure 12:
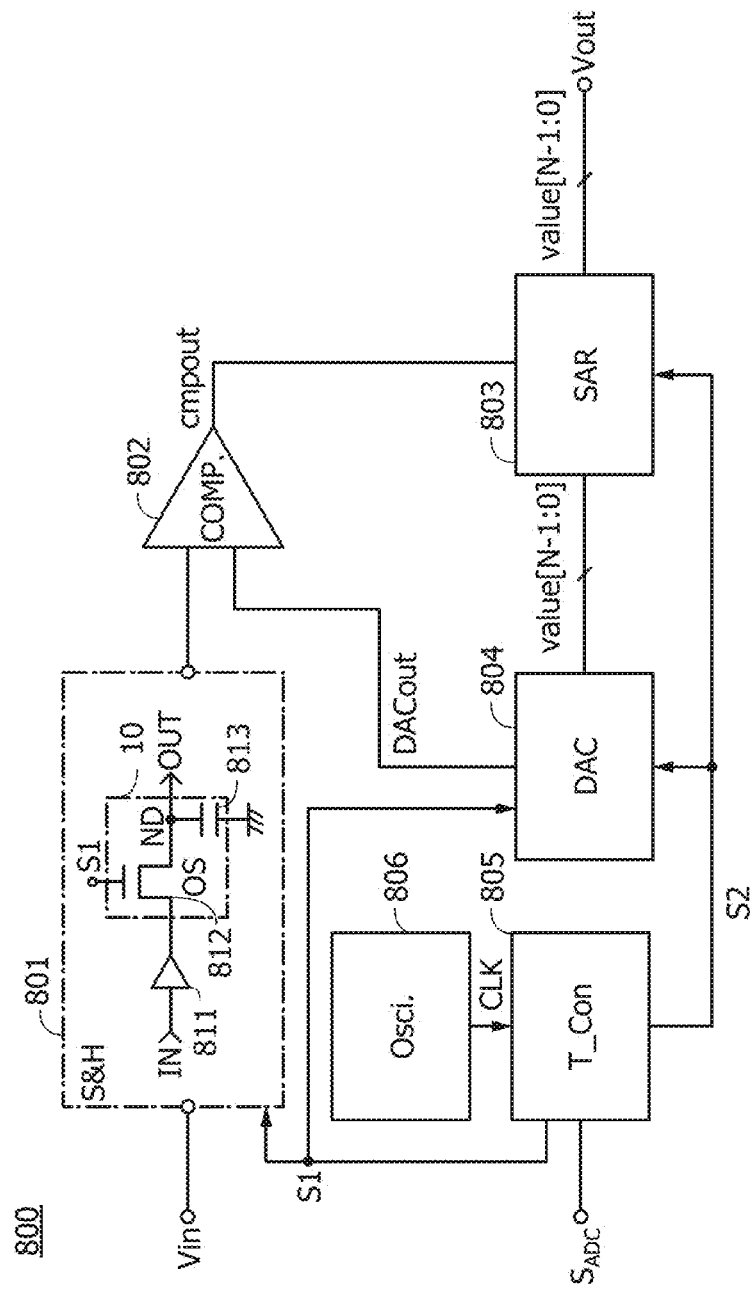
FIG. 12 A block diagram illustrating an example of an analog-to-digital converter circuit.

FIG. 12 illustrates an analog-to-digital converter circuit. An analog-to-digital converter circuit 800 includes a comparator 802 (abbreviated to COMP, in FIG. 12), a successive approximation register 803 (abbreviated to SAR in FIG. 12), a digital-to-analog convener circuit 804 (abbreviated to DAC in FIG. 12), a timing controller 805 (abbreviated to T_con in FIG. 12), and an oscillator circuit 806 (abbreviated to Osci. in FIG 12).

The analog-to-digital converter circuit 800 further includes a sample hold circuit 801 (also referred to as a sample-and-hold circuit, and abbreviated to S&H in FIG. 12). The sample-and-hold circuit 801, to which a potential of analog data (an analog potential Vin) is input, is capable of holding charge corresponding to the analog potential Vin in accordance with control by a control signal S1. The control signal S1 is a signal supplied from the timing controller 805.

The sample-and-hold circuit 801 includes, for example, a buffer circuit 811, a transistor 812, and a capacitor 813. An input terminal of the sample-and-hold circuit 801 is connected to one of a source and a drain of the transistor 812. An output terminal of the sample-and-hold circuit 801 is connected to the other of the source and drain of the transistor 812. Note that a node at the other of the source and drain of the transistor 812 is referred to as a node ND for description.

The buffer circuit 811 has functions of amplifying a signal such as analog data input to the sample-and-hold circuit 801 and outputting the amplified signal. Although the buffer circuit 811 is provided between the input terminal of the sample-and-hold circuit 801 and the one of the source and drain of the transistor 812 in FIG. 12, the structure is not limited thereto and the buffer circuit 811 may be connected to a gate of the transistor 812.

The transistor 812 is a transistor having a function of having an extremely low off-state current flowing between the source and drain. For a transistor having such a function, an OS transistor is preferred. An OS transistor will be described in detail in Embodiment 6. In FIG. 12, "OS" is written beside a circuit symbol of an OS transistor for clarification. The one of the source and drain of the transistor 812 is connected to an input terminal of the sample-and-hold circuit 801. The gate of the transistor 812 is connected to a wiring for supplying a control signal S1. The other of the source and drain of the transistor 812 is connected to the output terminal of the sample-and-hold circuit 801 or the node ND.

The capacitor 813 has a function of holding a charge corresponding to the analog potential Vin when the transistor 812 is turned off. In FIG. 12, the capacitor 813 is connected to the other of the source and drain of the transistor 812, that is, to the node ND; however, the capacitor 813 is not necessarily provided and can be omitted when gate capacitance or the like in an input terminal of the comparator 802 is utilized. Note that a circuit including the transistor 812 and the capacitor 813 and holding the charge corresponding to the analog potential Vin is denoted by a first circuit 10 in the drawing.

The comparator 802 has functions of comparing the level of the analog potential Vin held in the sample-and-hold circuit 801 and that of an analog potential DACout output by the digital-analog converter circuit 804, and outputting a signal cmpout in accordance with the comparison result.

The successive approximation register 803 has functions of holding a signal cmpout that changes in accordance with the analog potential DACout, as N-bit digital data (N is a natural number larger than or equal to 2), and outputting the data. The N-bit digital data, that is, the digital data from the 0th bit to the (N−1)-th bit (denoted by value [N−1:0] in FIG. 12), is output to the outside as Vout, and also output to the digital-analog converter circuit 804. The successive approximation register 803 includes a logic circuit including registers corresponding to respective bits, and can output digital data in accordance with control by a control signal S2. The control signal S2 is a signal supplied from the timing controller 805.

The digital-analog converter circuit 804 has functions of generating the analog potential DACout in accordance with the digital data, and outputting the potential. The digital-analog converter circuit 804 may be the conversion type with a capacitor (C-DAC) or the conversion type with a resistor (R-DAC). In particular, a C-DAC including an OS transistor is preferable to hold a digital value. Note that a structure of the C-DAC including an OS transistor is described in a below embodiment with a specific circuit structure.

Figure 13:
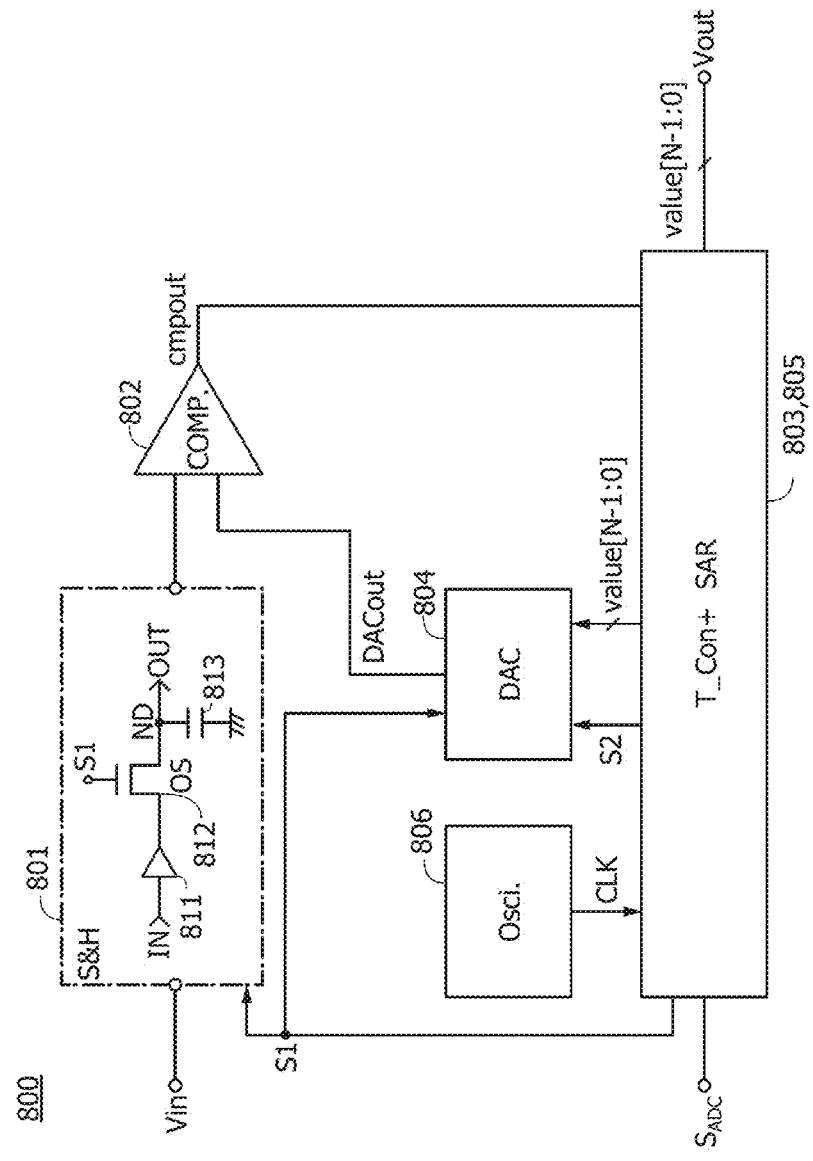
FIG. 13 A block diagram illustrating an example of an analog-to-digital converter circuit.

The timing controller 805 has functions of generating and outputting the control signals S1 and S2 in synchronization with a clock signal CLK in accordance with a signal $S_{ADC}$. The timing controller 805 includes a logic circuit, and can output the control signals S1 and S2 in accordance with the clock signal CLK and the signal $S_{ADC}$. The timing controller 805 including the logic circuit can be formed to be integral with the successive approximation register 803 including the logic circuit as shown in FIG. 13. The timing controller is referred to as a control circuit in some cases.

The oscillator circuit 806 (abbreviated to Osci. in FIG. 12) has functions of generating and outputting the clock signal CLK. The oscillator circuit 806 may be a clock signal generated by a crystal oscillator or a clock signal generated by a ring oscillator.

In the analog-to-digital converter circuit 800 illustrated in FIG. 12, the analog potential Vin acquired by a sensor circuit or the like is held in the sample-and-hold circuit 801 that includes the transistor 812 whose off-state current is significantly low. In the sample-and-hold circuit 801, by turning off the transistor 812, the analog potential Vin is held at the node ND capable of holding a charge. Thus, supply of electric power to the buffer circuit 811 included in the sample-and-hold circuit 801 or the like is stopped, leading to a reduction in power consumption.

With this structure, power consumption can be reduced without inhibiting the drive voltage or the frequency of the clock signal, so that it is possible to avoid decreasing the performance of the analog-to-digital converter circuit, such as the resolution or sampling rate. With this structure, the analog data can be held without the use of a flash memory or the like, whereby power consumption can be reduced without the provision of a dedicated high-voltage generation circuit or a dedicated periphery circuit.

Figure 14:
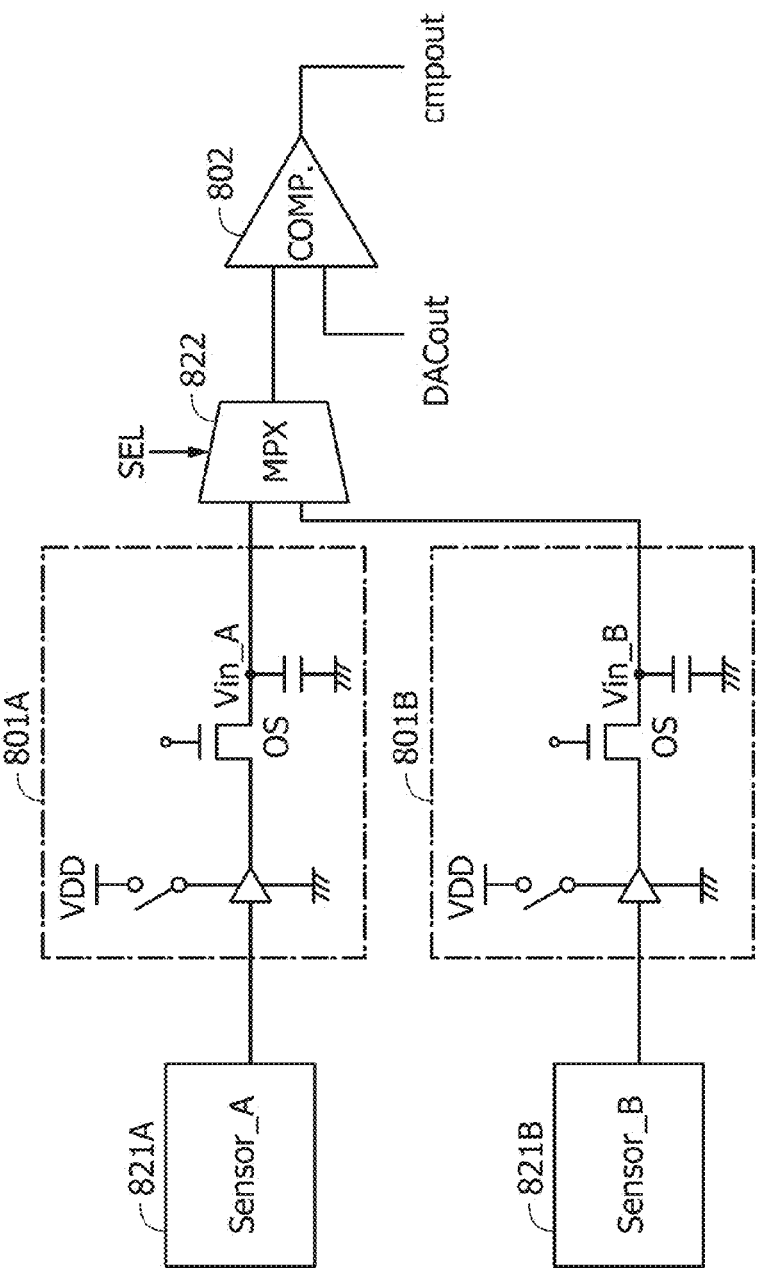
FIG. 14 A block diagram illustrating part of an analog-to-digital converter circuit.

Note that a plurality of sensor circuits that supplies the analog potential Vin to the sample-and-hold circuit 801 may be provided. In that case, when a sensor circuit 821A and a sensor circuit 821B are provided as illustrated in FIG. 14, a sample-and-hold circuit 801A and a sample-and-hold circuit 801B are provided. A selector 822 (also referred to as multiplexer, and abbreviated to MPX in FIG. 14) is provided between the sample-and-hold circuits 801A and 801B and the comparator 802.

In accordance with a selection signal SEL, the selector 822 has functions of selecting any one of the analog potentials of the sample-and-hold circuits 801A and 801B, and outputting the potential to the comparator 802. The sample-and-hold circuits 801A and 801B each have the same function as the sample-and-hold circuit 801 described in FIG. 12, so that they can hold the analog potentials Vin_A and Vin_B obtained in the sensor circuits 821A and 821B, and power supply to the buffer circuit can be stopped. Accordingly, the operation can be performed to reduce power consumption. After once sampling the analog potentials Vin_A and Vin_B in the sample-and-hold circuits 801A and 801B, power supply to the sensor circuits 821A and 821B can be stopped to stop supply of the analog potentials Vin_A and Vin_B from the sensor circuits 821A and 821B. Accordingly, the power consumption of the sensor circuits 821A and 821B can be reduced.

The analog potential obtained in the sensor circuit may be constant or always be variable. When sampling a variable analog potential, the sampling may be performed with the use of a correlated double sampling (CDS: Correlated Double Sampling) circuit. The correlated double sampling circuit is used to remove noise by obtaining relative difference between two timings.

Figure 15A:
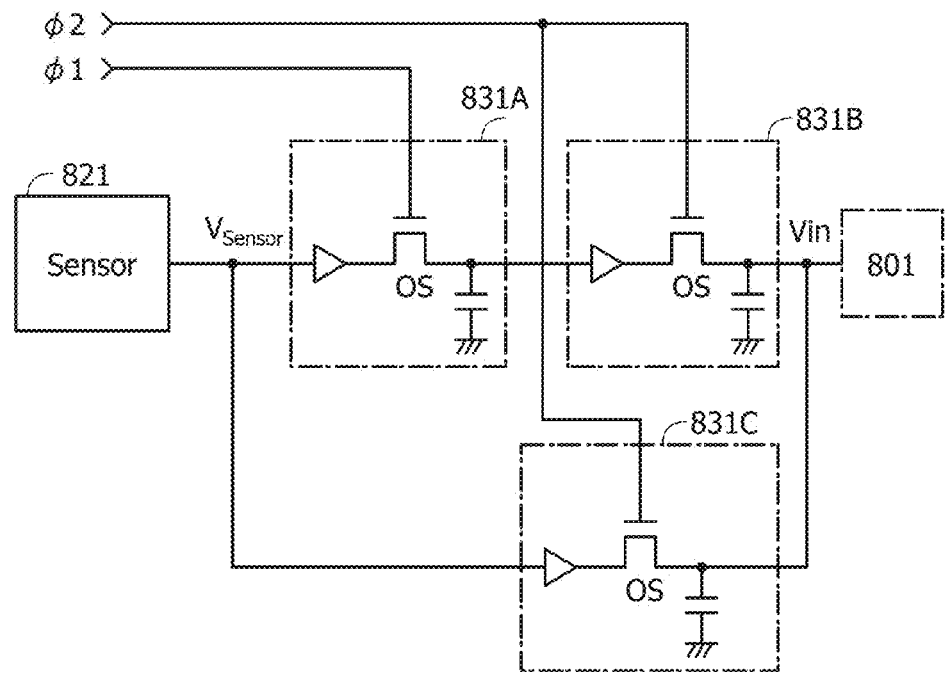
FIG. 15 A block diagram illustrating part of an analog-to-digital converter circuit and a timing chart showing operation thereof.

FIG. 15(A) shows an example of the correlated double sampling circuit. The correlated double sampling circuit includes sample-and-hold circuits 831A to 831C. For the sample-and-hold circuits 831A to 831C, a circuit similar to the sample-and-hold circuit 801 shown in FIG. 12 or the like can be used. A control signal φ1 is supplied to a transistor of the sample-and-hold circuit 831A, and a control signal φ2 is supplied to transistors of the sample-and-hold circuits 831B and 831C.

The use of OS transistors as transistors that are turned off by the control signal φ1 and φ2 can reduce changes in the potential sampled in the capacitors included in the sample-and-hold circuits 831A to 831C for obtaining the difference. Thus, accuracy of the correlated double sampling circuit can be improved. In addition, after once sampling a potential, power supply to buffer circuits of the sample-and-hold circuits 831A to 831C can be stopped, whereby power consumption can be reduced.

Figure 15B:
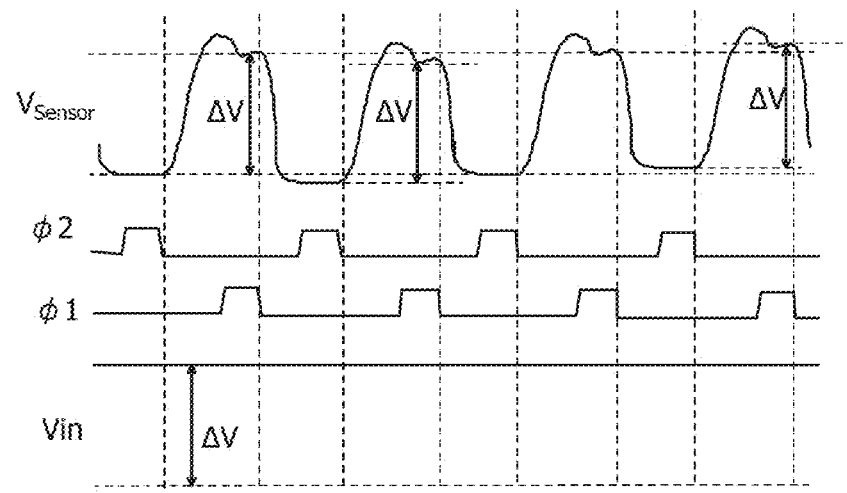

FIG. 15(B) shows a timing chart illustrating an operation example of the correlated double sampling circuit shown in FIG. 15(A). Note that a potential $V_{Sensor}$ is a variable potential obtained in the sensor circuit 821, and the potential Vin is an analog potential transmitted through the correlated double sampling circuit. As shown in FIG. 15(B), even when the potential $V_{Sensor}$ is variable, conducting sampling to obtain the difference in a regular cycle makes it possible to obtain the potential Vin as an analog potential that is constant at voltage ΔV.

FIG. 16(A) shows a circuit configuration example of the digital-analog converter circuit 804. Note that FIG. 16(A) shows a 10-bit C-DAC. In FIG. 16(A), the sample-and-hold circuit 801 and the comparator 802 are also shown for description. The digital-analog converter circuit 804 shown in FIG. 16(A) includes capacitors 893, selectors 894, 895, and 896, and a transistor 897. The capacitor 893 has capacitance corresponding to the bit number. Examples of the capacitance are written beside the capacitors 893 in FIG. 16(A). The selectors 894 and 895 are provided corresponding to the capacitor 893.

FIG. 16(B) shows a circuit configuration example of the selectors 894, 895, and 896 of FIG. 16(A). The control signal S2 is supplied to terminals SEL of the selectors 895 and 896. A potential selected by the selector 896 is supplied to terminals A of the selectors 894 and 895. A reference potential Vref is supplied to a terminal A of the selector 896. A ground potential is supplied to terminals B of the selectors 894, 895, and 896.

FIG. 16(C) shows a more specific circuit configuration example of the selectors of FIG. 16(B). The selector shown in FIG. 16(C) includes an inverter circuit 898, an n-channel transistor 835, a transistor 836, a p-channel transistor 837, and a transistor 838.

Figure 17:
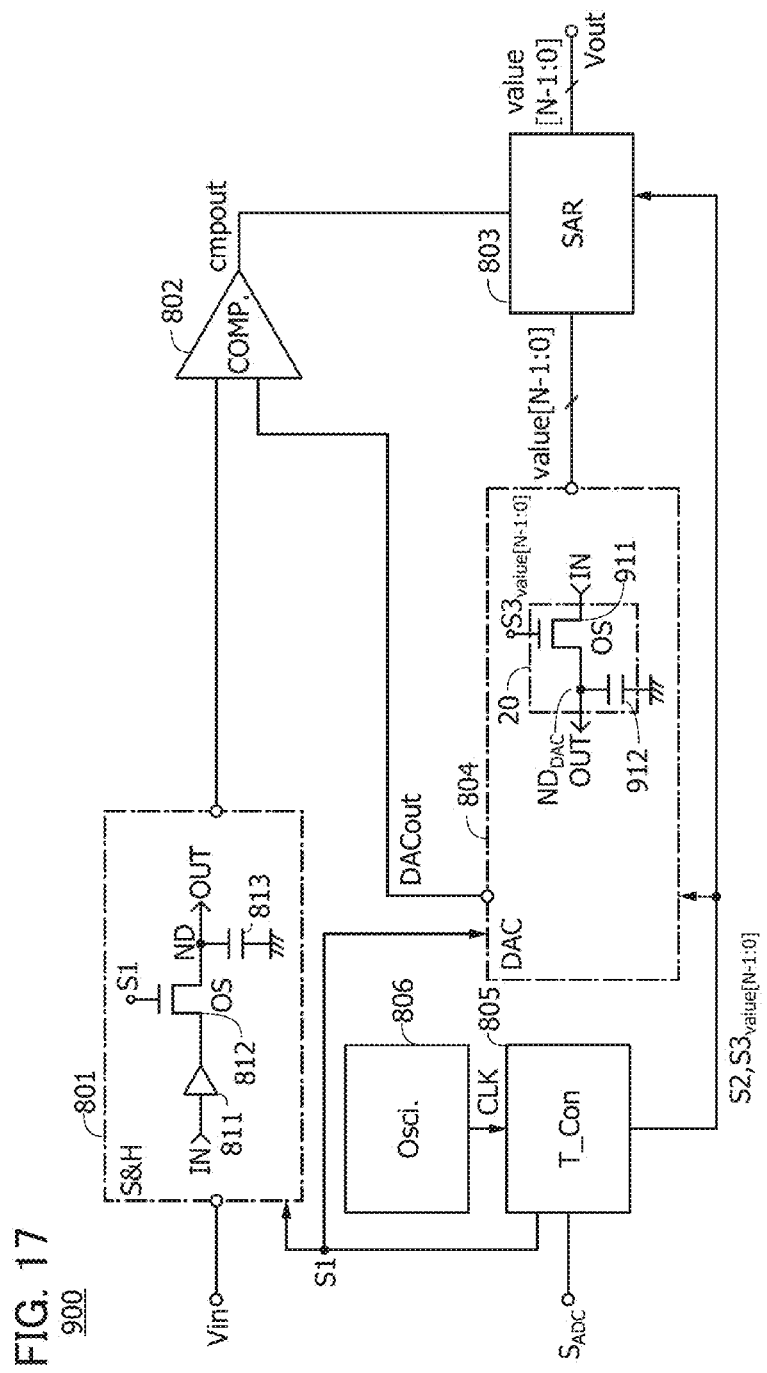
FIG. 17 A block diagram illustrating an example of an analog-to-digital converter circuit.

Next, FIG. 17 illustrates an example of an analog-to-digital converter circuit which is different from that in FIG. 12.

An analog-to-digital converter circuit 900 shown in FIG. 17 includes the sample-and-hold circuit 801, the successive approximation register 803, the digital-analog converter circuit 804, the timing controller 805, and the oscillator circuit 806.

The analog-to-digital converter circuit 900 illustrated in FIG. 17 is different from the analog-to-digital converter circuit 800 in FIG. 12 in that a transistor 911 and a capacitor 912 for holding digital data are included in the digital-to-analog converter circuit 804. A gate of the transistor 911 is supplied with a control signal $S3_{value[N-1:0]}$ for controlling the on/off state in accordance with each bit from the timing controller 805. Different points from the analog-to-digital converter circuit 800 in FIG. 12 will be described in detail below, and the description of the same points as the analog-to-digital converter circuit 800 in FIG. 12 is omitted.

When the transistor 911 is turned off, a charge corresponding to the potential of digital data is held in a node $ND_{DAC}$. In this way, the transistor 911 and the capacitor 912 hold the digital data. Like the transistor 812, the transistor 911 is a transistor having a function of having an extremely low off-state current flowing between the source and drain, and is preferably an OS transistor. Note that a circuit including the transistor 911 and the capacitor 912 and holding charge corresponding to the potential of digital data is denoted by a first circuit 20.

Figure 18A:
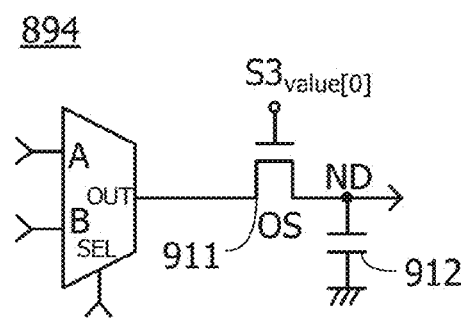
FIG. 18 Circuit diagrams illustrating part of an analog-to-digital converter circuit.
Figure 18B:
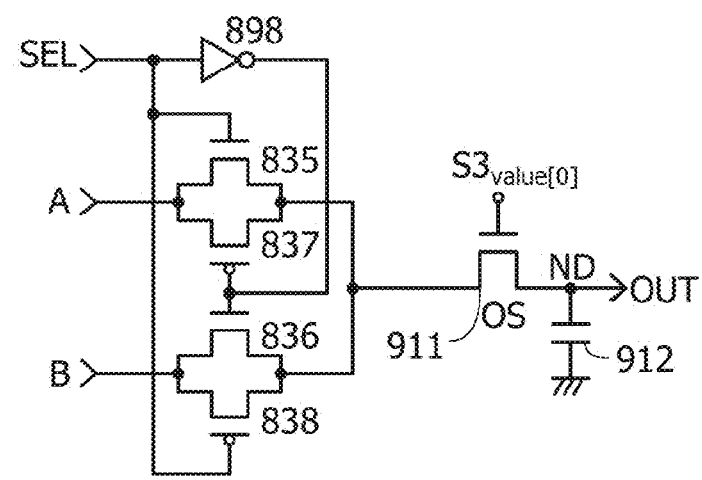

In the case where the digital data is held in the digital-analog converter circuit 804, the transistor 911 and the capacitor 912 may be added to the selector 894 of FIGS. 16(A) to 16(C). FIGS. 18(A) and 18(B) show an example of a circuit diagram where the transistor 911 and the capacitor 912 are added to the selector 894. In the example of FIGS. 18(A) and 18(B), as the control signal $S3_{value[N-1:0]}$, a control signal $S3_{value[0]}$ of the 0th bit is supplied to the gate of the transistor 911.

With the structure of FIG. 17, power consumption can be reduced by stopping power supply to the sample-and-hold circuit 801, the comparator 802, the successive approximation register 803, and the digital-analog converter circuit 804. Specifically, as shown in FIG. 18, when the analog potential Vin is held in the sample-and-hold circuit 801, power supply to the buffer circuit 811 can be stopped. In addition, at every time digital data of a certain bit is determined in the digital-analog converter circuit 804, power supply to the corresponding register in the successive approximation register 803 can be stopped. Furthermore, power supply to the comparator 802 and the digital-analog converter circuit 804 can be stopped.

The structure disclosed in this embodiment enables the potential of analog data or digital data to be held with the use of an OS transistor even after power supply is stopped; therefore, power supply to each circuit can be stopped to reduce power consumption. In addition, if power supply to the whole semiconductor device functioning as an analog-to-digital converter circuit is stopped after determination of digital data, power consumption can be reduced until another analog potential Vin is input.

As is the case in the semiconductor device in Embodiment 1, the semiconductor device described in this embodiment functioning as an analog-to-digital converter circuit makes the sample-and-hold circuit 801 including the transistor with an extremely low off-state current hold the analog potential Vin obtained in the sensor or the like. In addition, the determined digital data is held in the digital-analog converter circuit. According to one embodiment of the present invention, power supply to each circuit included in the semiconductor device can be stopped to reduce power consumption.

In the semiconductor device of this embodiment, power consumption can be reduced without inhibiting the drive voltage or the frequency of the clock signal, so that it is possible to avoid decreasing the performance of the analog-to-digital converter circuit, such as the resolution or sampling rate. In the semiconductor device of this embodiment, the analog data can be held without the use of a flash memory or the like, whereby power consumption can be reduced without the provision of a dedicated high-voltage generation circuit or a dedicated periphery circuit.

Note that this embodiment can be combined with the other embodiments in this specification as appropriate.

(Embodiment 6)

In this embodiment, transistors of one embodiment of the disclosed invention will be described.

Transistors according to one embodiment of the present invention each preferably include the nc-OS or CAAC-OS to be described in Embodiment 7.

<Transistor Structure 1>

Figure 20A:
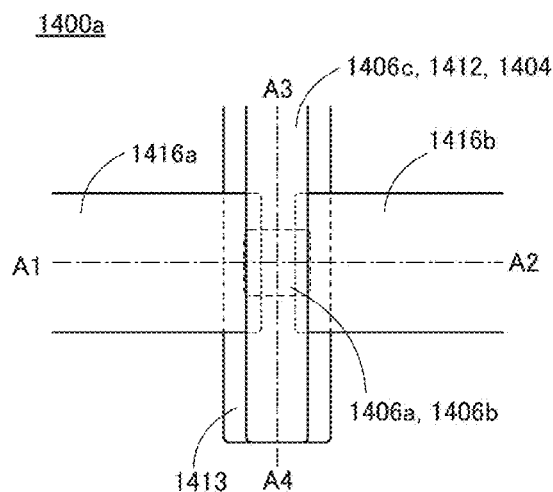
FIG. 20 A top view and cross-sectional views illustrating a structural example of a transistor.
Figure 20B:
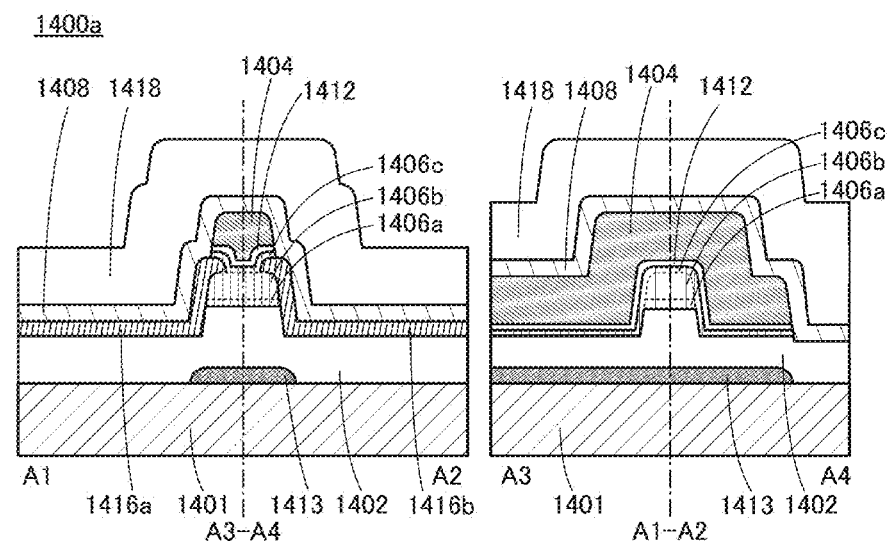

FIGS. 20(A) and 20(B) are a top view and a cross-sectional view which illustrate a transistor of one embodiment of the present invention. FIG. 20(A) is a top view and FIG. 20(B) is a cross-sectional view taken along dashed-dotted line A1-A2 and dashed-dotted line A3-A4 in FIG. 20(A). Note that for simplification of the drawing, some components are not illustrated in the top view in FIG 20(A).

A transistor 1400a in FIGS. 20(A) and 20(B) includes a conductor 1413 over a substrate 1401, an insulator 1402 having a projection over the substrate 1401 and the conductor 1413, an metal oxide 1406a over the projection of the insulator 1402, a metal oxide 1406b over the metal oxide 1406a, a conductor 1416a and a conductor 1416b which are in contact with a top surface and a side surface of the metal oxide 1406b and which are arranged to be separated from each other, an metal oxide 1406c over the metal oxide 1406b, the conductor 1416a, and the conductor 1416b, an insulator 1412 over the metal oxide 1406c, a conductor 1404 over the insulator 1412, an insulator 1408 over the conductor 1416a, the conductor 1416b, and the conductor 1404, and an insulator 1418 over the insulator 1408. Although the conductor 1413 is part of the transistor here, a transistor structure of one embodiment of the present invention is not limited thereto. For example, the conductor 1413 may be a component independent of the transistor.

Note that the metal oxide 1406c is in contact with at least a top surface and a side surface of the metal oxide 1406b in the cross section taken along line A3-A4. Furthermore, the conductor 1404 faces the top surface and the side surface of the metal oxide 1406b with the metal oxide 1406c and the insulator 1412 provided therebetween in the cross section taken along line A3-A4. The conductor 1413 faces a bottom surface of the metal oxide 1406b with the insulator 1402 provided therebetween. The insulator 1402 does not necessarily include a projection. The transistor 1400a does not necessarily include the metal oxide 1406c. The transistor 1400a does not necessarily include the insulator 1408. The transistor 1400a does not necessarily include the insulator 1418.

Note that the metal oxide 1406b has a function of a channel formation region of a transistor. The conductor 1404 has a function of a first gate electrode (also referred to as a front gate electrode) of the transistor. The conductor 1413 has a function of a second gate electrode (also referred to as a back gate electrode) of the transistor. The conductor 1416a and the conductor 1416b have a function of a source electrode and a drain electrode of the transistor. The insulator 1408 has a function of a barrier layer. The insulator 1408 has, for example, a function of blocking oxygen and/or hydrogen. Alternatively, the insulator 1408 has, for example, a higher capability of blocking oxygen and/or hydrogen than the metal oxide 1406a and/or the metal oxide 1406c.

Note that the metal oxide 1406a or the metal oxide 1406c is categorized as a semiconductor in some cases depending on which of the materials described later is used and the ratio between the materials. Since the metal oxide 1406b functions as a channel formation region of the transistor as described above, carriers do not move in the metal oxide 1406a and the metal oxide 1406c in some cases. Thus, even when the metal oxide 1406a or the metal oxide 1406c has semiconductor properties, it is referred to as an insulator in this embodiment in some cases.

The insulator 1402 is preferably an insulator containing excess oxygen.

The insulator containing excess oxygen means an insulator from which oxygen is released by heat treatment, for example. The silicon oxide layer containing excess oxygen means a silicon oxide layer which can release oxygen by heat treatment or the like, for example. Therefore, the insulator 1402 is an insulator in which oxygen can be moved. In other words, the insulator 1402 may be an insulator having an oxygen-transmitting property. For example, the insulator 1402 may be an insulator having higher oxygen permeability than the metal oxide 1406a.

The insulator containing excess oxygen has a function of reducing oxygen vacancies in the metal oxide 1406b in some cases. Such oxygen vacancies form DOS in the metal oxide 1406b and serve as hole traps or the like. In addition, hydrogen comes into the site of such an oxygen vacancy and forms an electron serving as a carrier. Therefore, by reducing the oxygen vacancies in the metal oxide 1406b, the transistor can have stable electrical characteristics.

Here, an insulator from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in TDS analysis (thermal desorption spectroscopy analysis: Thermal Desorption Spectroscopy) in the range of a surface temperature of higher than or equal to 100° C. and lower than or equal to 700° C. or higher than or equal to 100° C. and lower than or equal to 500° C.

Here, the method of measuring the amount of released oxygen using TDS analysis is described below.

The total amount of released gas from a measurement specimen in TDS analysis is proportional to the integral value of the ion intensity of the released gas. Then, comparison with a reference specimen is made, whereby the total amount of released gas can be calculated.

For example, the number of released oxygen molecules ($N_{O2}$) from a measurement specimen can be calculated according to the following formula using the TDS results of a silicon substrate containing hydrogen at a predetermined density, which is a reference specimen, and the TDS results of the measurement specimen. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2}\times S_{O2}\times\alpha$$

The value $N_{H2}$ is obtained by conversion of the amount of hydrogen molecules desorbed from the standard specimen into densities. The value $S_{H2}$ is the integral value of ion intensity in the case where the standard specimen is subjected to the TDS analysis. Here, the reference value of the standard specimen is set to $N_{H2}/S_{H2}$. $S_{O2}$ is the integral value of ion intensity when the measurement specimen is analyzed by TDS. The value $\alpha$ is a coefficient affecting the ion intensity in the TDS analysis. Refer to Patent Document 2 for details of the above formula. The amount of released oxygen was measured with a thermal desorption spectroscopy apparatus produced by ESCO Ltd., EMD-WA1000S/W using a silicon substrate containing hydrogen atoms at $1\times10^{16}$ atoms/cm$^2$, for example, as the reference specimen.

Furthermore, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5\times10^{17}$ spins/cm$^3$. Note that the insulator containing a peroxide radical may have an asymmetric signal with a g factor of approximately 2.01 in ESR (electron spin resonance: Electron Spin Resonance).

The insulator containing excess oxygen may be formed using oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS: Rutherford Backscattering Spectrometry).

As illustrated in FIG. 20(B), the side surfaces of the metal oxide 1406b are in contact with the conductor 1416a and the conductor 1416b. The metal oxide 1406b can be electrically surrounded by an electric field of the conductor 1404 (a structure in which a semiconductor is electrically surrounded by an electric field of a conductor is referred to as a surrounded channel (s-channel) structure). Therefore, a channel is formed in the entire metal oxide 1406b (bulk) in some cases. In the s-channel structure, a large amount of current can flow between a source electrode and a drain electrode of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm.

Furthermore, by applying a lower voltage or a higher voltage than a source electrode to the conductor 1413, the threshold voltage of the transistor may be shifted in the positive direction or the negative direction. For example, by shifting the threshold voltage of the transistor in the positive direction, a normally-off transistor in which the transistor is in a non-conduction state (off state) even when the gate voltage is 0 V can be achieved in some cases. The voltage applied to the conductor 1413 may be a variable or a fixed voltage. When the voltage applied to the conductor 1413 is a variable, a circuit for controlling the voltage may be electrically connected to the conductor 1413.

Next, metal oxides that can be used as the metal oxides 1406a, 1406b, 1406c, and the like will be described.

The metal oxide 1406b is an oxide semiconductor containing indium, for example. The metal oxide 1406b can have high carrier mobility (electron mobility) by containing indium, for example. The metal oxide 1406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, magnesium, tungsten, and the like. Note that two or more of the above elements may be used in combination as the element M. The element M is an element having a high bonding energy with oxygen, for example. The element M is an element whose bonding energy with oxygen is higher than that of indium, for example. The element M is an element that can increase the energy gap of the oxide semiconductor, for example. Furthermore, the metal oxide 1406b preferably contains zinc. When the oxide semiconductor contains zinc, the oxide semiconductor is easily to be crystallized, for example.

Note that the metal oxide 1406b is not limited to the oxide semiconductor containing indium. The metal oxide 1406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the metal oxide 1406b, an oxide with a wide energy gap may be used. For example, the energy gap of the metal oxide 1406b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the metal oxide 1406a and the metal oxide 1406c are oxides including one or more elements other than oxygen included in the metal oxide 1406b. Since the metal oxide 1406a and the metal oxide 1406c each include one or more elements other than oxygen included in the metal oxide 1406b, an interface state is less likely to be formed at the interface between the metal oxide 1406a and the metal oxide 1406b and the interface between the metal oxide 1406b and the metal oxide 1406c.

The metal oxide 1406a, the metal oxide 1406b, and the metal oxide 1406c preferably include at least indium. In the case of using an In-M-Zn oxide as the metal oxide 1406a, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the metal oxide 1406b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the metal oxide 1406c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the metal oxide 1406c may be an oxide that is a type the same as that of the metal oxide 1406a. Note that the metal oxide 1406a and/or the metal oxide 1406c do/does not necessarily contain indium in some cases. For example, the metal oxide 1406a and/or the metal oxide 1406c may be gallium oxide.

As the metal oxide 1406b, an oxide having an electron affinity higher than those of the insulators 1406a and 1406c is used. For example, as the metal oxide 1406b, an oxide having an electron affinity higher than those of the insulators 1406a and 1406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the metal oxide 1406c preferably includes an indium gallium oxide. The gallium atomic ratio [Ga/(In+Ga)] is, for example, higher than or equal to 70%, preferably higher than or equal to 80%, further preferably higher than or equal to 90%.

Figure 19:
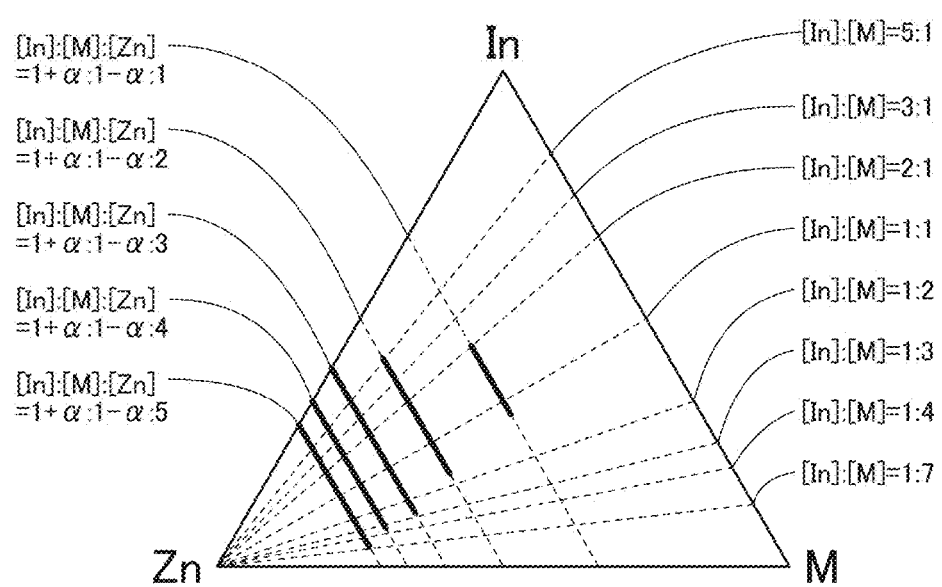
FIG. 19 A triangular diagram explaining composition of an In-M-Zn oxide.

Note that the composition of the metal oxide 1406a is preferably in the neighborhood of the composition represented by the bold line in FIG. 19. The composition of the metal oxide 1406b is preferably in the neighborhood of the composition represented by the bold line in FIG. 19. The composition of the metal oxide 1406c is preferably in the neighborhood of the composition represented by the bold line in FIG. 19. When these compositions are employed, the channel formation region of the transistor can have a single crystal structure. Alternatively, the channel formation region, the source region, and the drain region of the transistor can have a single crystal structure in some cases. When the channel formation region of the transistor has a single crystal structure, the transistor can have high frequency characteristics in some cases.

At this time, when a gate voltage is applied, a channel is formed in the metal oxide 1406b having the highest electron affinity in the metal oxide 1406a, the metal oxide 1406b, and the metal oxide 1406c.

Here, in some cases, there is a mixed region of the metal oxide 1406a and the metal oxide 1406b between the metal oxide 1406a and the metal oxide 1406b. Furthermore, in some cases, there is a mixed region of the metal oxide 1406b and the metal oxide 1406c between the metal oxide 1406b and the metal oxide 1406c. The mixed region has a low density of interface states. For that reason, the stack of the metal oxide 1406a, the metal oxide 1406b, and the metal oxide 1406c has a band structure where energy at each interface and in the vicinity of the interface is changed continuously (continuous junction).

At this time, electrons move mainly in the metal oxide 1406b, not in the metal oxide 1406a and the metal oxide 1406c. As described above, when the interface state density at the interface between the metal oxide 1406a and the metal oxide 1406b and the interface state density at the interface between the metal oxide 1406b and the metal oxide 1406c are decreased, electron movement in the metal oxide 1406b is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS: Root Mean Square) roughness with a measurement area of 1 μm×1 μm of a top surface or a bottom surface of the metal oxide 1406b (a formation surface; here, a top surface of the metal oxide 1406a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P-V) with the measurement area of 1 μm×1 μm is less than 10 nm, preferably less than 9 nm, further preferably less than 8 nm, still further preferably less than 7 nm. RMS roughness, Ra, and P-V can be measured using a scanning probe microscope SPA-500 manufactured by SII Nano Technology Inc.

The electron movement is also inhibited, for example, in the case where the density of defect states is high in a region where a channel is formed.

For example, in the case where the metal oxide 1406b contains oxygen vacancies ($V_O$), hydrogen might enter sites of the oxygen vacancies to form a donor level (hereinafter, the state in which hydrogen enters the sites of oxygen vacancies is also referred to as $V_O$H). Because $V_O$H scatters electrons, it is a factor of decreasing the on-state current of the transistor. Note that the sites of oxygen vacancies become more stable by entry of oxygen than by entry of hydrogen. Thus, by decreasing oxygen vacancies in the metal oxide 1406b, the on-state current of the transistor can be increased in some cases.

To decrease oxygen vacancies in the metal oxide 1406b, for example, there is a method in which excess oxygen in the insulator 1402 is moved to the metal oxide 1406b through the metal oxide 1406a. In this case, the metal oxide 1406a is preferably a layer having an oxygen-transmitting property (a layer through which oxygen passes or is transmitted).

In the case where the transistor has an s-channel structure, a channel is formed in the whole of the metal oxide 1406b. Therefore, as the metal oxide 1406b has a larger thickness, a channel region becomes larger. In other words, the thicker the metal oxide 1406b is, the larger the on-state current of the transistor is. For example, the metal oxide 1406b has a region with a thickness greater than or equal to 10 nm, preferably greater than or equal to 20 nm, further preferably greater than or equal to 40 nm, further preferably greater than or equal to 60 nm, still further preferably greater than or equal to 100 nm. In some cases, when the channel formation region is reduced in size, electrical characteristics of the transistor with a smaller thickness of the metal oxide 1406b may be improved. Therefore, the metal oxide 1406b may have a thickness less than 10 nm. Note that the metal oxide 1406b has a region with a thickness, for example, less than or equal to 300 nm, preferably less than or equal to 200 nm, further preferably less than or equal to 150 nm because the productivity of the semiconductor device might be decreased.

Moreover, the thickness of the metal oxide 1406c is preferably as small as possible to increase the on-state current of the transistor. The thickness of the metal oxide 1406c is less than 10 nm, preferably less than or equal to 5 nm, further preferably less than or equal to 3 nm, for example. Meanwhile, the metal oxide 1406c has a function of blocking entry of elements other than oxygen (such as hydrogen and silicon) included in the adjacent insulator into the metal oxide 1406b where a channel is formed. For this reason, it is preferable that the metal oxide 1406c have a certain thickness. The thickness of the metal oxide 1406c is greater than or equal to 0.3 nm, preferably greater than or equal to 1 nm, further preferably greater than or equal to 2 nm, for example. The metal oxide 1406c preferably has an oxygen blocking property to suppress outward diffusion of oxygen released from the insulator 1402 and the like.

To improve reliability, preferably, the thickness of the metal oxide 1406a is large and the thickness of the metal oxide 1406c is small. For example, the metal oxide 1406a has a region with a thickness greater than or equal to 10 nm, preferably greater than or equal to 20 nm, further preferably greater than or equal to 40 nm, still further preferably greater than or equal to 60 nm. When the thickness of the metal oxide 1406a is made large, a distance from an interface between the adjacent insulator and the metal oxide 1406a to the metal oxide 1406b in which a channel is formed can be large. Since the productivity of the semiconductor device might be decreased, the metal oxide 1406a has a region with a thickness, for example, less than or equal to 200 nm, preferably less than or equal to 120 nm, further preferably less than or equal to 80 nm.

For example, a region in which the concentration of silicon which is measured by secondary ion mass spectrometry (SIMS: Secondary Ion Mass Spectrometry) is lower than $1\times10^{19}$ atoms/cm$^3$, preferably lower than $5\times10^{18}$ atoms/cm$^3$, or further preferably lower than $2\times10^{18}$ atoms/cm$^3$ is provided between the metal oxide 1406b and the metal oxide 1406a. A region with a silicon concentration lower than $1\times10^{19}$ atoms/cm$^3$, preferably lower than $5\times10^{18}$ atoms/cm$^3$, further preferably lower than $2\times10^{18}$ atoms/cm$^3$ which is measured by SIMS is provided between the metal oxide 1406b and the metal oxide 1406c.

It is preferable to reduce the concentration of hydrogen in the metal oxides 1406a and 1406c in order to reduce the concentration of hydrogen in the metal oxide 1406b. The metal oxide 1406a and the metal oxide 1406c have a region whose hydrogen concentration is less than or equal to $2\times10^{20}$ atoms/cm$^3$, preferably less than or equal to $5\times10^{19}$ atoms/cm$^3$, further preferably less than or equal to $1\times10^{19}$ atoms/cm$^3$, further preferably less than or equal to $5\times10^{18}$ atoms/cm$^3$ by SIMS. It is preferable to reduce the concentration of nitrogen in the metal oxides 1406a and 1406c in order to reduce the concentration of nitrogen in the metal oxide 1406b. The metal oxides 1406a and 1406c have a region whose nitrogen concentration is less than $5\times10^{19}$ atoms/cm$^3$, preferably less than or equal to $5\times10^{18}$ atoms/cm$^3$, further preferably less than or equal to $1\times10^{18}$ atoms/cm$^3$, further preferably less than or equal to $5\times10^{17}$ atoms/cm$^3$ by SIMS.

The above three-layer structure is an example. For example, a two-layer structure without the metal oxide 1406a or the metal oxide 1406c may be employed. Alternatively, a four-layer structure in which any one of the semiconductors described as examples of the metal oxide 1406a, the metal oxide 1406b, and the metal oxide 1406c is provided below or over the metal oxide 1406a or below or over the metal oxide 1406c may be employed. Alternatively, an n-layer structure (n is an integer of 5 or more) in which any one of the semiconductors described as examples of the metal oxide 1406a, the metal oxide 1406b, and the metal oxide 1406c is provided at two or more of the following positions: over the metal oxide 1406a, below the metal oxide 1406a, over the metal oxide 1406c, and below the metal oxide 1406c.

As the substrate 1401, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single element semiconductor substrate of silicon, germanium, or the like or a compound semiconductor substrate containing silicon carbide, silicon germanium, gallium arsenide, indium phosphide, zinc oxide, or gallium oxide as a material is used, for example. A semiconductor substrate in which an insulator region is provided in the above semiconductor substrate, e.g., an SOI (Silicon On Insulator) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 1401. As a method of providing the transistor over a flexible substrate, there is a method in which the transistor is formed over a non-flexible substrate and then the transistor is separated and transferred to the substrate 1401 which is a flexible substrate. In that case, a separation layer is preferably provided between the non-flexible substrate and the transistor. As the substrate 1401, a sheet, a film, or a foil containing a fiber may be used. The substrate 1401 may have elasticity. The substrate 1401 may have a property of returning to its original shape when bending or pulling is stopped. Alternatively, the substrate 1401 may have a property of not returning to its original shape. The thickness of the substrate 1401 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 1401 has a small thickness, the weight of the semiconductor device can be reduced. When the substrate 1401 has a small thickness, even in the case of using glass or the like, the substrate 1401 may have elasticity or a property of returning to its original shape when bending or pulling is stopped. Therefore, an impact applied to the semiconductor device over the substrate 1401, which is caused by dropping or the like, can be reduced. That is, a durable semiconductor device can be provided.

For the substrate 1401 which is a flexible substrate, metal, an alloy, resin, glass, or fiber thereof can be used, for example. The flexible substrate 1401 preferably has a lower coefficient of linear expansion because deformation due to an environment is suppressed. The flexible substrate 1401 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 1401 because of its low coefficient of linear expansion.

The conductor 1413 may be formed to have a single-layer structure or a stacked-layer structure using a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 1402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 1402 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 1402 may have a function of preventing diffusion of impurities from the substrate 1401. In the case where the metal oxide 1406*b* is an oxide semiconductor, the insulator 1402 can have a function of supplying oxygen to the metal oxide 1406*b*.

Each of the conductor 1416*a* and the conductor 1416*b* may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Due to the conductor 1416*a* and the conductor 1416*b*, a defect may be formed in the metal oxide 1406*a*, the metal oxide 1406*b*, or the metal oxide 1406*c* in some cases. The defect makes the metal oxide 1406*a*, the metal oxide 1406*b*, or the metal oxide 1406*c* an n-type semiconductor in some cases. As a result, ohmic contact is made between any of the metal oxide 1406*a*, the metal oxide 1406*b*, or the metal oxide 1406*c* and the conductor 1416*a* and the conductor 1416*b*. For example, in the case where the defect formed in the metal oxide 1406*a*, the metal oxide 1406*b*, or the metal oxide 1406*c* is reduced by dehydrogenation or supplying excess oxygen, a Schottky junction is made between any of the metal oxide 1406*a*, the metal oxide 1406*b*, or the metal oxide 1406*c* and the conductor 1416*a* and the conductor 1416*b*.

The insulator 1412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 1412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 1404 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 1408 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 1408 may be preferably formed to have, for example, a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

The insulator 1418 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 1418 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Figure 21A:
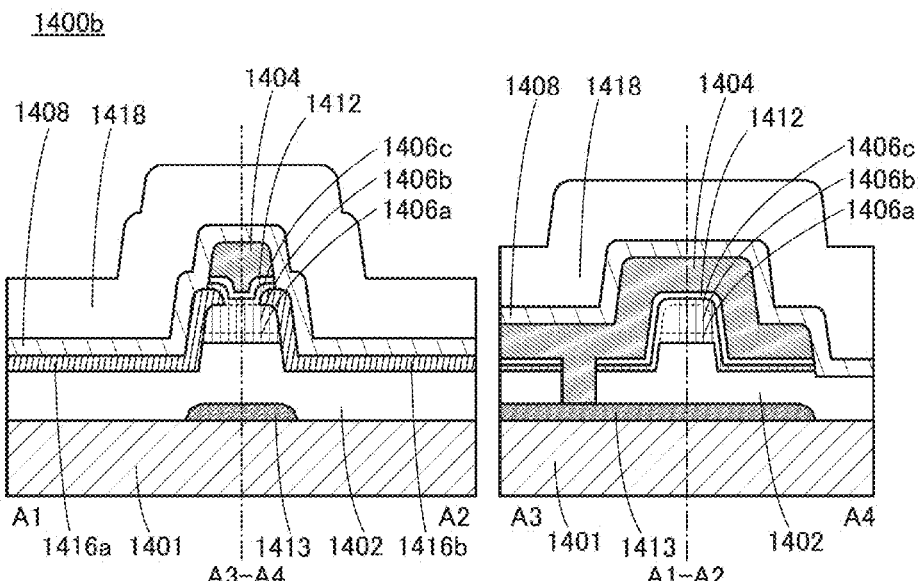
FIG. 21 Cross-sectional views illustrating a structural example of a transistor.
Figure 21B:
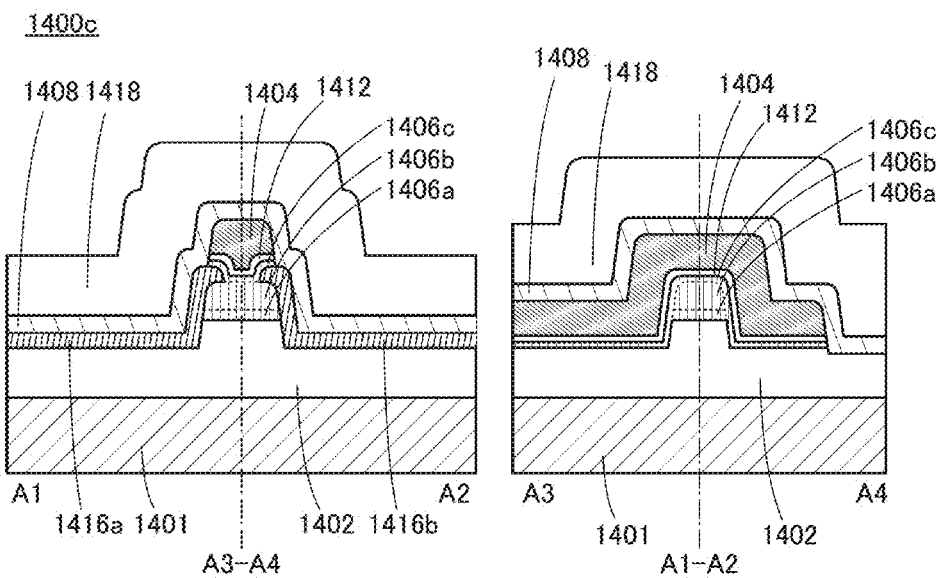

Although FIG. 20 show an example where the conductor 1404 which is a first gate electrode of a transistor is not electrically connected to the conductor 1413 which is a second gate electrode, a transistor structure of one embodiment of the present invention is not limited thereto. For example, as in a transistor 1400*b* illustrated in FIG. 21(A), the conductor 1404 may be electrically connected to the conductor 1413. With such a structure, the conductor 1404 and the conductor 1413 are supplied with the same potential; thus, switching characteristics of the transistor can be improved. Alternatively, as in a transistor 1400*c* illustrated in FIG. 21(B), the conductor 1413 is not necessarily provided.

Figure 22A:
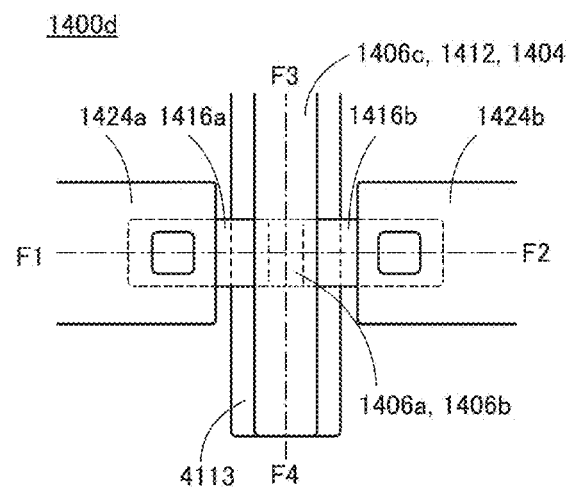
FIG. 22 A top view and cross-sectional views illustrating a structural example of a transistor.
Figure 22B:
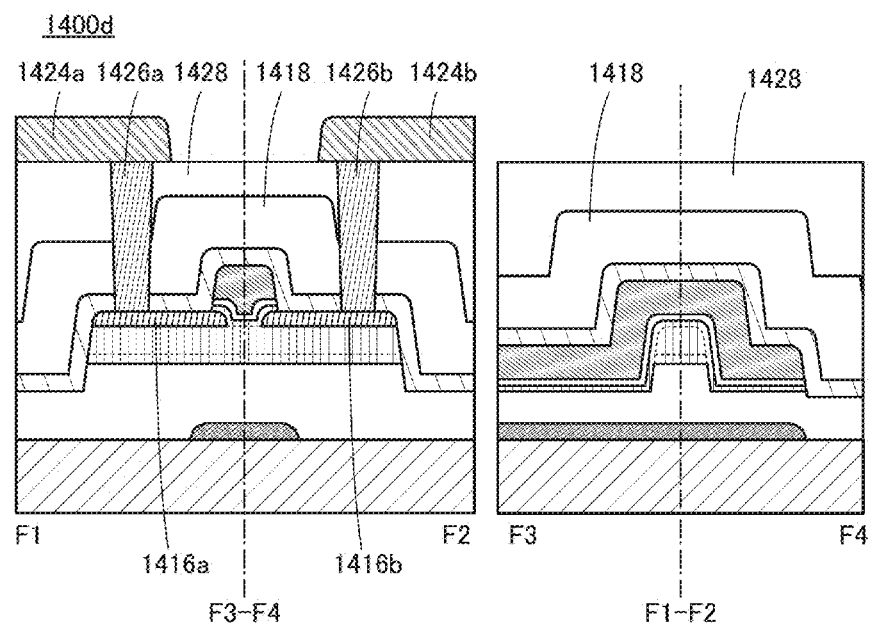

FIG. 22(A) is an example of a top view of a transistor. FIG. 22(B) is an example of a cross-sectional view taken along dashed-dotted line F1-F2 and dashed-dotted line F3-F4 in FIG. 22(A). Note that some components such as an insulator are omitted in FIG. 22(A) for easy understanding.

Although FIG. 20 and the like show an example where the conductor 1416*a* and the conductor 1416*b* which function as a source electrode and a drain electrode are in contact with a top surface and a side surface of the metal oxide 1406*b*, a top surface of the insulator 1402, and the like, a transistor structure of one embodiment of the present invention is not limited thereto. For example, like the transistor 1400*d* illustrated in FIG. 22, the conductor 1416*a* and the conductor 1416*b* may be in contact with only the top surface of the metal oxide 1406*b*.

As illustrated in FIG. 22(B), an insulator 1428 may be provided over the insulator 1418. The insulator 1428 preferably has a flat top surface. The insulator 1428 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 1428 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. To planarize the top surface of the insulator 1428, planarization treatment may be performed by a chemical mechanical polishing (CMP) method or the like.

A resin may be used as the insulator 1428. For example, a resin containing polyimide, polyamide, acrylic, silicone, or the like may be used. The use of a resin does not need planarization treatment performed on the top surface of the insulator 1428 in some cases. By using a resin, a thick film can be formed in a short time; thus, the productivity can be increased.

As illustrated in FIGS. 22(A) and 22(B), a conductor 1424a and a conductor 1424b may be provided over the insulator 1428. The conductor 1424a and the conductor 1424b may function as wirings, for example. The insulator 1428 may include an opening and the conductor 1416a and the conductor 1424a may be electrically connected to each other through the opening. The insulator 1428 may have another opening and the conductor 1416b and the conductor 1424b may be electrically connected to each other through the opening. In this case, the conductor 1426a and the conductor 1426b may be provided in the respective openings.

Each of the conductor 1424a and the conductor 1424b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

In the transistor illustrated in FIG. 22, the conductor 1416a and the conductor 1416b are not in contact with side surfaces of the metal oxide 1406b. Thus, an electric field applied from the conductor 1404 functioning as a first gate electrode to the side surfaces of the metal oxide 1406b is less likely to be blocked by the conductor 1416a and the conductor 1416b. The conductor 1416a and the conductor 1416b are not in contact with a top surface of the insulator 1402. Thus, excess oxygen (oxygen) released from the insulator 1402 is not consumed to oxidize the conductor 1416a and the conductor 1416b. Accordingly, excess oxygen (oxygen) released from the insulator 1402 can be efficiently used to reduce oxygen vacancies in the metal oxide 1406b. In other words, the transistor having the structure illustrated in FIG. 22 has excellent electrical characteristics such as a high on-state current, high field-effect mobility, a small subthreshold swing value, and high reliability.

Figure 23A:
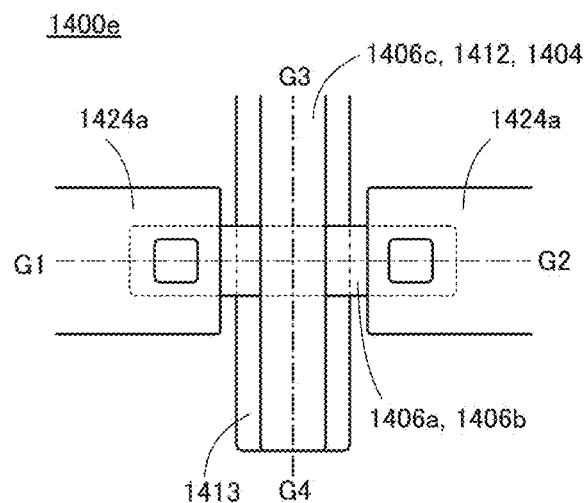
FIG. 23 A top view and a cross-sectional view illustrating a structural example of a transistor.
Figure 23B:
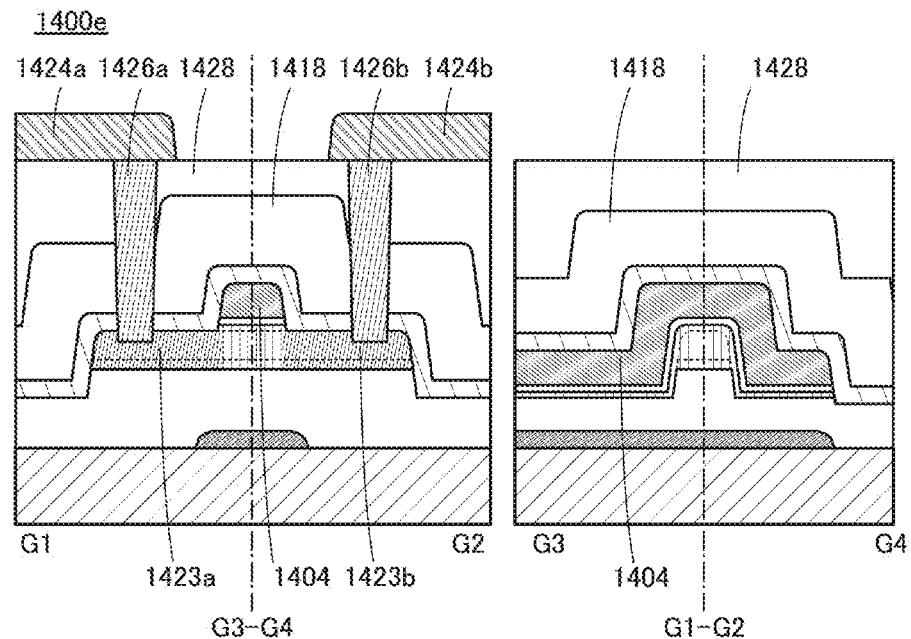

FIGS. 23(A) and 23(B) are a top view and a cross-sectional view which illustrate a transistor of one embodiment of the present invention. FIG. 23(A) is a top view and FIG. 23(B) is a cross-sectional view taken along dashed-dotted line G1-G2 and dashed-dotted line G3-G4 in FIG. 23(A). Note that for simplification of the drawing, some components are not illustrated in the top view in FIG. 23(A).

A transistor 1400e may have a structure in which, as illustrated in FIG. 23, the conductor 1416a and the conductor 1416b are not provided and the conductor 1426a and the conductor 1426b are in contact with the metal oxide 1406b. In this case, a low-resistance region 1423a (low-resistance region 1423b) is preferably provided in a region in contact with at least the conductor 426a and the conductor 1426b in the metal oxide 1406b and/or the metal oxide 1406a. The low-resistance region 1423a and the low-resistance region 1423b may be formed in such a manner that, for example, the conductor 1404 and the like are used as masks and impurities are added to the metal oxide 1406b and/or the metal oxide 1406a. The conductor 1426a and the conductor 1426b may be provided in holes (portions which penetrate) or recessed portions (portions which do not penetrate) of the metal oxide 1406b. When the conductor 1426a and the conductor 1426b are provided in holes or recessed portions of the metal oxide 1406b, contact areas between the conductors 1426a and 1426b and the metal oxide 1406b are increased; thus, the adverse effect of the contact resistance can be decreased. In other words, the on-state current of the transistor can be increased.

<Transistor Structure 2>

Figure 24A:
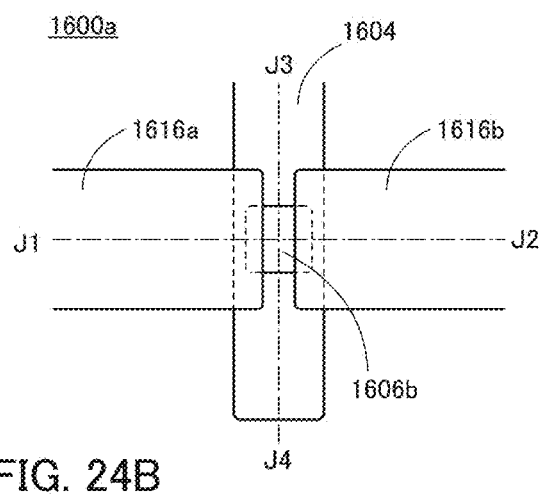
FIG. 24 A top view and a cross-sectional view illustrating a structural example of a transistor.
Figure 24B:
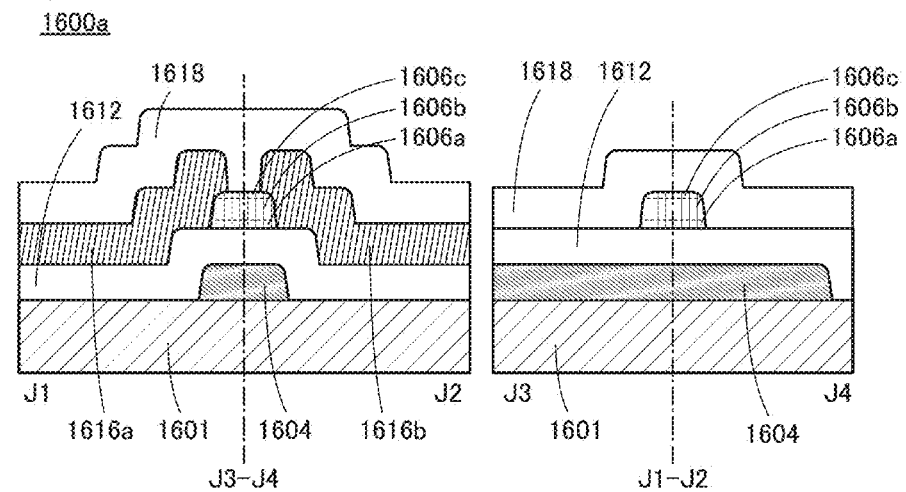

FIGS. 24(A) and 24(B) are a top view and a cross-sectional view of a transistor of one embodiment of the present invention. FIG. 24(A) is a top view and FIG. 24(B) is a cross-sectional view taken along dashed-dotted line J1-J2 and dashed-dotted line J3-J4 in FIG. 24(A). Note that for simplification of the drawing, some components are not illustrated in the top view in FIG. 24(A).

A transistor 1600a illustrated in FIGS. 24(A) and 24(B) includes a conductor 1604 over a substrate 1601, an insulator 1612 over the conductor 1604, a metal oxide 1606a over the insulator 1612, a metal oxide 1606b over the metal oxide 1606a, a metal oxide 1606c over the metal oxide 1606b, a conductor 1616a and a conductor 1616b which are spaced and in contact with the metal oxide 1606a, the metal oxide 1606b, and the metal oxide 1606c, and an insulator 1618 over the metal oxide 1606c and the conductors 1616a and 1616b. Note that the conductor 1604 faces a bottom surface of the metal oxide 1606b with the insulator 1612 provided therebetween. The insulator 1612 may have a projection. An insulator may be provided between the substrate 1601 and the conductor 1604. For the insulator, the description of the insulator 1402 or the insulator 1408 is referred to. The metal oxide 1606a is not necessarily provided. The insulator 1618 is not necessarily provided.

Note that the metal oxide 1606b has a function of a channel formation region of the transistor. The conductor 1604 has a function of a first gate electrode (also referred to as a front gate electrode) of the transistor. The conductor 1616a and the conductor 1616b have functions of a source electrode and a drain electrode of the transistor.

Note that the metal oxide 1606a or the metal oxide 1606c is categorized as a semiconductor in some cases depending on which of the materials described later is used and the ratio between the materials. Since the metal oxide 1606b serves as a channel formation region of the transistor as described above, carriers do not move in the metal oxide 1606a and the metal oxide 1606c in some cases. Thus, even when the metal oxide 1606a or the metal oxide 1606c has semiconductor properties, it is referred to as an insulator in this embodiment.

The insulator 1618 is preferably an insulator containing excess oxygen.

Note that for the substrate 1601, the description of the substrate 1401 is referred to. For the conductor 1604, the description of the conductor 1404 is referred to. For the insulator 1612, the description of the insulator 1412 is referred to. For the metal oxide 1606a, the description of the metal oxide 1406c is referred to. For the metal oxide 1606b, the description of the metal oxide 1406b is referred to. For the metal oxide 1606c, the description of the metal oxide 1406a is referred to. For the conductor 1616a and the conductor 1616b, the description of the conductor 1416a and the conductor 1416b is referred to. For the insulator 1618, the description of the insulator 1402 is referred to.

Over the insulator 1618, a display element may be provided. For example, a pixel electrode, a liquid crystal layer, a common electrode, a light-emitting layer, an organic EL layer, an anode electrode, a cathode electrode, or the like may be provided. The display element is connected to the conductor 1616a or the like, for example.

Figure 25A:
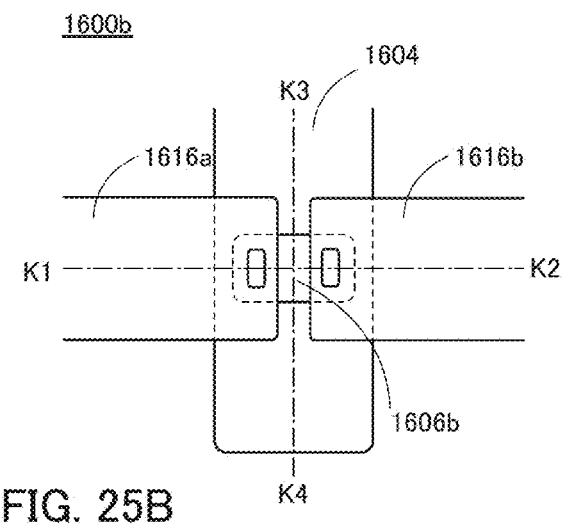
FIG. 25 A top view and a cross-sectional view illustrating a structural example of a transistor.
Figure 25B:
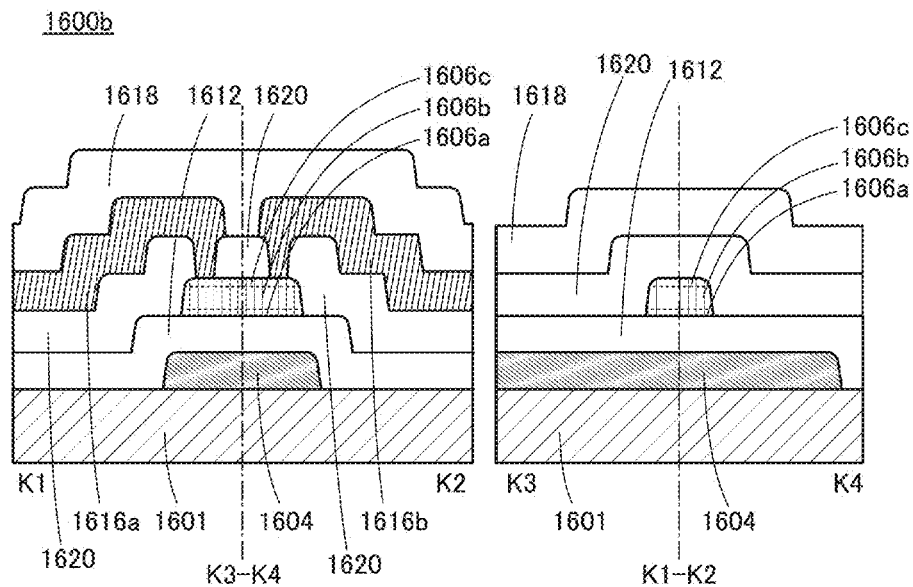

FIG. 25(A) is an example of a top view of a transistor. FIG. 25(B) is an example of a cross-sectional view taken along dashed-dotted line K1-K2 and dashed-dotted line K3-K4 in FIG. 25(A). Note that some components such as an insulator are omitted in FIG. 25(A) for easy understanding.

Over the semiconductor, an insulator that can function as a channel protective film may be provided. For example, as in a transistor 1600b illustrated in FIG. 25, an insulator 1620 may be provided between the metal oxide 1606c and the conductors 1616a and 1616b. In that case, the conductor 1616a (conductor 1616b) and the metal oxide 1606c are connected to each other through an opening in the insulator 1620. For the insulator 1620, the description of the insulator 1618 may be referred to.

Figure 26A:
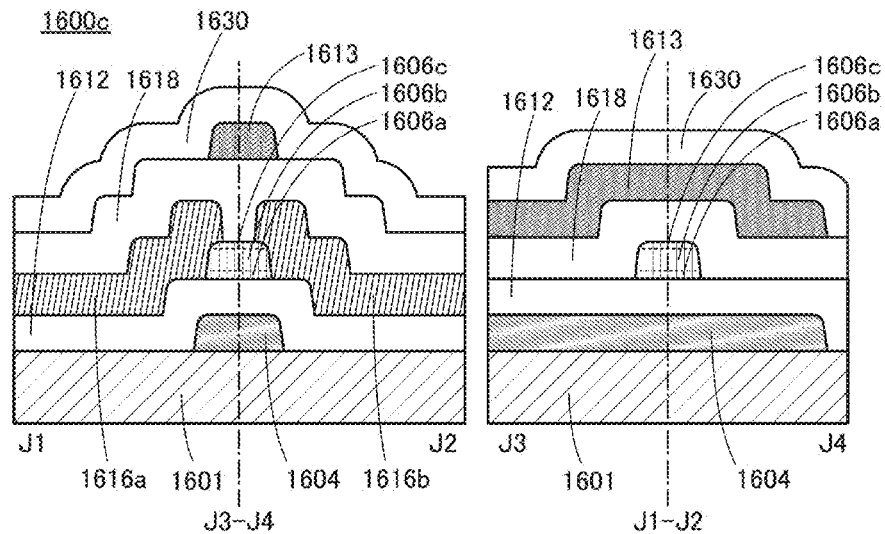
FIG. 26 Cross-sectional views illustrating structural examples of transistors.
Figure 26B:
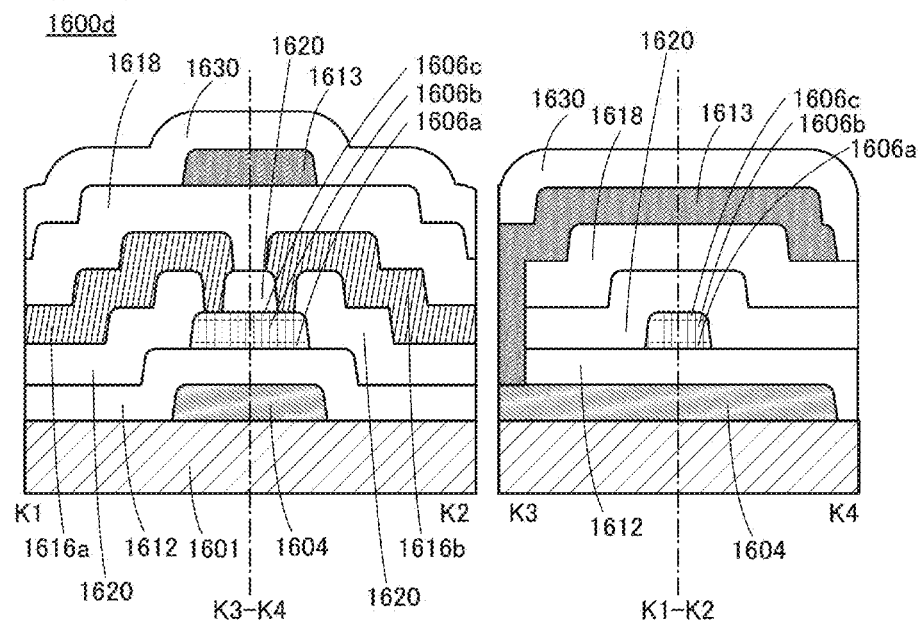

Note that in FIG. 24(B) and FIG. 25(B), a conductor 1613 may be provided over the insulator 1618, and an insulator 1630 may be provided over the conductor 1613. Examples in that case are shown in a transistor 1600c in FIG. 26(A) and a transistor 1600d in FIG. 26(B). Note that for the conductor 1613, the description of the conductor 1413 is referred to. For the insulator 1630, the description of the insulator 1418 is referred to. A potential or signal which is the same as that supplied to the conductor 1604 or a potential or signal which is different from that supplied to the conductor 1604 may be supplied to the conductor 1613. For example, by supplying a constant potential to the conductor 1613, the threshold voltage of a transistor may be controlled. In other words, the conductor 1613 can function as a second gate electrode. Furthermore, an s-channel structure may be formed using the conductor 1613 and the like. The insulator 1630 is not necessarily provided.

Note that this embodiment can be combined with the other embodiments in this specification as appropriate.

(Embodiment 7)
<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a CAAC-OS (C Axis Aligned Crystalline Oxide Semiconductor), a polycrystalline oxide semiconductor, an nc-OS (nanocrystalline Oxide Semiconductor), an amorphous-like Oxide semiconductor (a-like OS: amorphous like Oxide Semiconductor), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM: Transmission Electron Microscope), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

The CAAC-OS observed with a TEM is described below. FIG. 27(A) shows a high-resolution TEM image of a cross section of the CAAC-OS which is observed from a direction substantially parallel to the specimen surface. The high-resolution TEM image is obtained with a spherical aberration corrector (Spherical Aberration Corrector) function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

FIG. 27(B) is an enlarged Cs-corrected high-resolution TEM image of a region (1) in FIG. 27(A). FIG. 27(B) shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

As shown in FIG. 27(B), the CAAC-OS has a characteristic atomic arrangement. The characteristic atomic arrangement is denoted by an auxiliary line in FIG. 27(C). FIGS. 27(B) and 27(C) prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc: nanocrystal). Furthermore, the CAAC-OS can also be referred to as an oxide semiconductor including CANC (C-Axis Aligned nanocrystals).

Here, according to the Cs-corrected high-resolution TEM images, the schematic arrangement of pellets 5100 of a CAAC-OS over a substrate 5120 is illustrated by such a structure in which bricks or blocks are stacked (see FIG. 27(D)). The part in which the pellets are tilted as observed in FIG. 27(C) corresponds to a region 5161 shown in FIG. 27(D).

FIG. 28(A) shows a Cs-corrected high-resolution TEM image of a plane of the CAAC-OS observed from a direction substantially perpendicular to the specimen surface. FIGS. 28(B), 28(C), and 28(D) are enlarged Cs-corrected high-resolution TEM images of regions (1), (2), and (3) in FIG. 28(A), respectively. FIGS. 28(B), 28(C), and 28(D) indicate that metal atoms are arranged in a triangular, quadrangular, or hexagonal configuration in a pellet. However, there is no regularity of arrangement of metal atoms between different pellets.

Figure 29A:
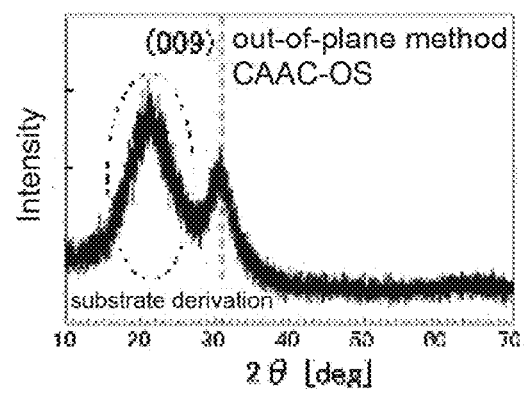
FIG. 29 Graphs showing structural analysis of a CAAC-OS and a single crystal oxide semiconductor by XRD.

Next, a CAAC-OS analyzed by X-ray diffraction (XRD: X-Ray Diffraction) is described. For example, when the structure of a CAAC-OS including an InGaZnO$_4$ crystal is analyzed by an out-of-plane method, a peak appears at a diffraction angle (2θ) of around 31° as shown in FIG. 29(A). This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 29B:
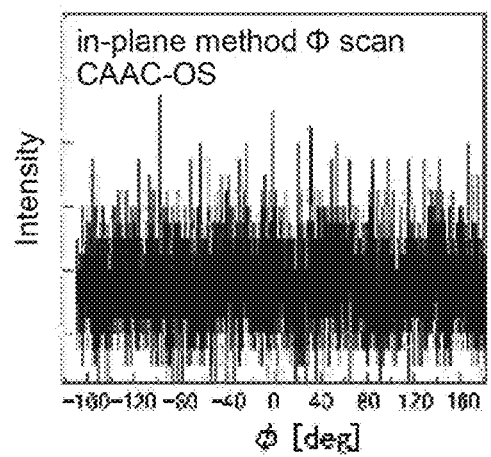
Figure 29C:
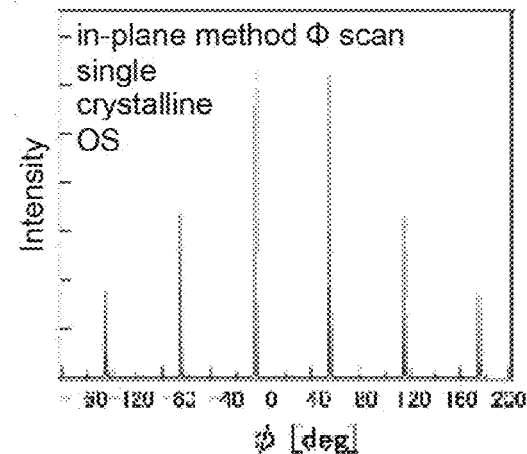

On the other hand, in structural analysis of the CAAC-OS by an in-plane method in which an X-ray is incident on a specimen in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the specimen rotated using a normal vector of the specimen surface as an axis (φ axis), as shown in FIG. 29(B), a peak is not clearly observed. In contrast, in the case of a single crystal oxide semiconductor of InGaZnO$_4$, when φ scan is performed with 2θ fixed at around 56°, as shown in FIG. 29(C), six peaks which are derived from crystal planes equivalent to the (110) plane are observed. Accordingly, the structural analysis using XRD shows that the directions of a-axes and b-axes are irregularly oriented in the CAAC-OS.

Figure 30A:
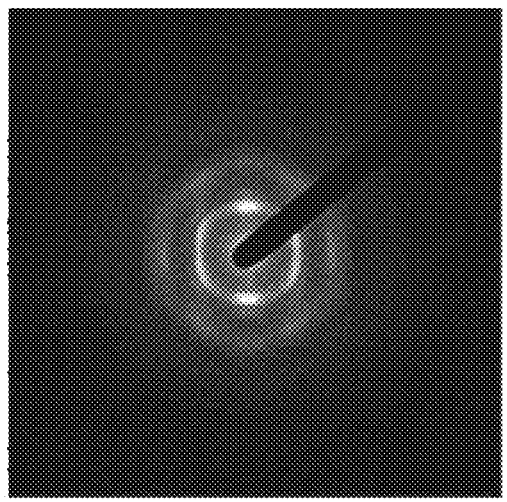
FIG. 30 Images showing electron diffraction patterns of a CAAC-OS.
Figure 30B:
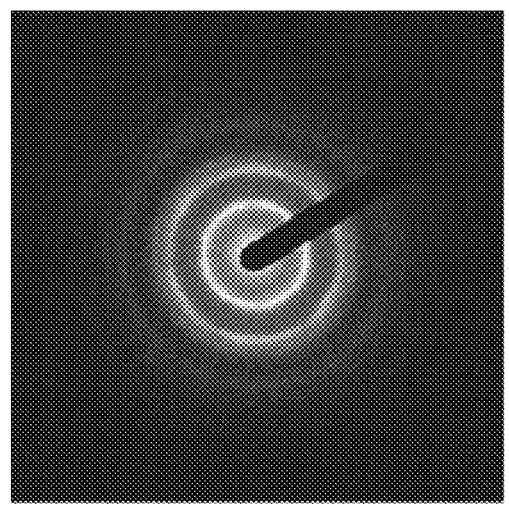

Next, a CAAC-OS analyzed by electron diffraction is described. For example, when an electron beam with a probe diameter of 300 nm is incident on a CAAC-OS including an InGaZnO$_4$ crystal in a direction parallel to the specimen surface, a diffraction pattern (also referred to as a selected-area transmission electron diffraction pattern) shown in FIG. 30(A) can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 30(B) shows a diffraction pattern obtained in such a manner that an electron beam with a probe diameter of 300 nm is incident on the same specimen in a direction perpendicular to the specimen surface. As shown in FIG. 30(B), a ring-like diffraction pattern is observed. Thus, the electron diffraction also indicates that the a-axes and b-axes of the pellets included in the CAAC-OS do not have regular alignment. The first ring in FIG. 30(B) is considered to be derived from the (010) plane, the (100) plane, and the like of the InGaZnO$_4$ crystal. The second ring in FIG. 30(B) is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}$/cm$^3$, preferably lower than $1\times10^{11}$/cm$^3$, further preferably lower than $1\times10^{10}$/cm$^3$, and higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS film is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including RANC (Random Aligned nanocrystals) or an oxide semiconductor including NANC (Non-Aligned nanocrystals).

Thus, the nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

In a high-resolution TEM image of the a-like OS film, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as a specimen A), an nc-OS (referred to as a specimen B), and a CAAC-OS (referred to as a Specimen C) are prepared as specimens subjected to electron irradiation. Each of the specimens is an In—Ga—Zn oxide.

First, a high-resolution cross-sectional TEM image of each specimen is obtained. The high-resolution cross-sectional TEM images show that all the specimens have crystal parts.

Note that which part is regarded as a crystal part is determined as follows. It is known that a unit cell of the InGaZnO$_4$ crystal has a structure in which nine layers including three In—O layers and six Ga—Zn—O layers are layered in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 31:
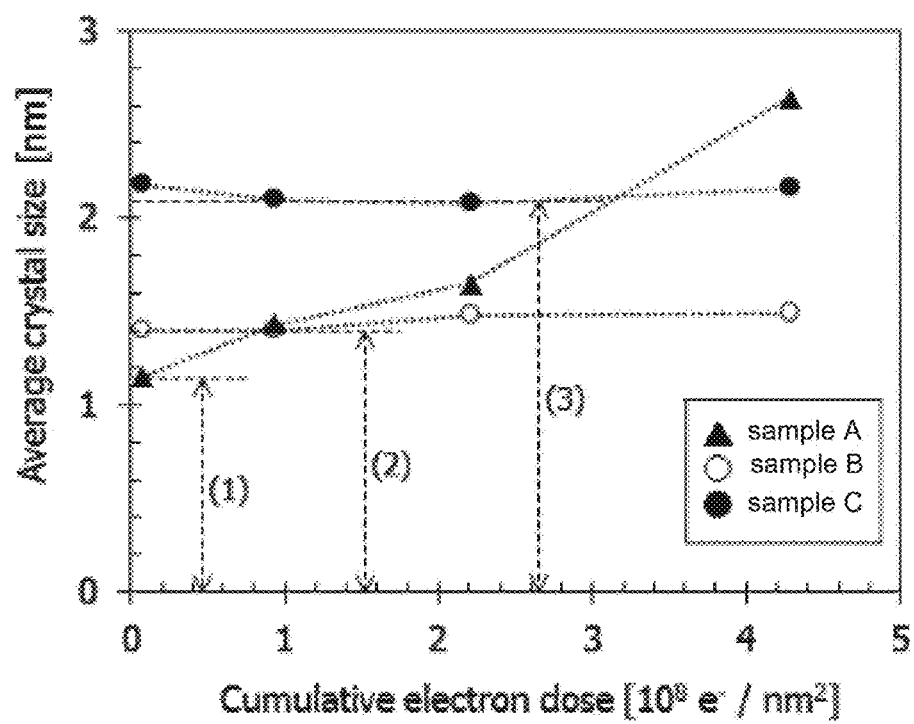
FIG. 31 A graph showing a change in crystal part of an In—Ga—Zn oxide induced by electron irradiation.

FIG. 31 shows change in the average size of crystal parts (at 22 points to 45 points) in each specimen. Note that the crystal part size corresponds to the length of a lattice fringe. FIG. 31 indicates that the crystal part size in the a-like OS increases with an increase in the cumulative electron dose. Specifically, as shown by (1) in FIG. 31, a crystal part of approximately 1.2 nm (also referred to as an initial nucleus) at the start of TEM observation grows to a size of approximately 2.6 nm at a cumulative electron dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$.

Specifically, as shown by (2) and (3) in FIG. 31, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

Note that this embodiment can be combined with the other embodiments in this specification as appropriate.

(Embodiment 8)

In this embodiment, examples in which the semiconductor devices (the transistors, the memory cells, and the like) described in the above embodiments are used in electronic components (RFICs, memory devices, and the like) and in electronic devices including the electronic components will be described with reference to FIG. 32.

Figure 32A:
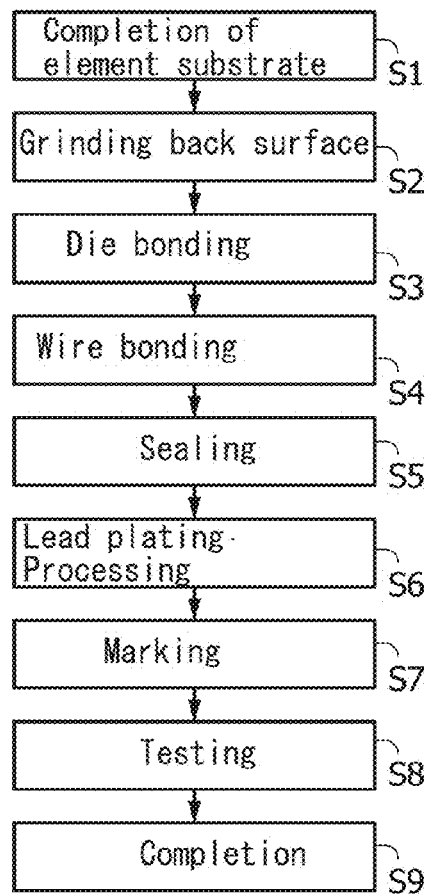
FIG. 32 A flowchart and a perspective view showing an example of a method of manufacturing a semiconductor device.

FIG. 32(A) shows an example where the semiconductor device described in the above embodiment is used as an electronic component. Note that the electronic component is also referred to as semiconductor package or IC package. This electronic component has various standards and names corresponding to the direction of terminals or the shape of terminals; hence, one example of the electronic component is described in this embodiment.

A semiconductor device including the transistors described in Embodiment 1 and Embodiment 2 is completed through an assembly process (post-process) of integrating detachable components on a printed circuit board.

The post-process can be completed through the steps in FIG. 32(A). Specifically, after an element substrate obtained in the pre-process is completed (Step S1), a back surface of the substrate is ground (Step S2). The substrate is thinned in this step to reduce substrate warpage or the like caused in the pre-process and to reduce the size of the component.

After the back surface of the substrate is ground, a dicing step is performed to divide the substrate into a plurality of chips. Then, the divided chips are separately picked up, placed on a lead frame, and bonded thereto in a the bonding step (Step S3). In the die bonding step, the chip is bonded to the lead frame by an appropriate method depending on products, for example, bonding with a resin or a tape. Note that in the the bonding step, a chip may be placed on and bonded to an interposer.

Note that in this embodiment, when an element is formed on a surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, whereby damage to a mounted circuit portion and wire caused by external mechanical force as well as deterioration of characteristics due to moisture or dust can be reduced.

Subsequently, the lead of the lead frame is plated. Then, the lead is cut and processed (Step S6). This plating process prevents rust of the lead and facilitates soldering at the time of mounting the chip on a printed circuit board in a later step.

Next, printing (marking) is performed on a surface of the package (Step S7). After a final testing step (Step S8), the electronic component is completed (Step S9).

The above electronic component can include the semiconductor device described in the above embodiment. Thus, a highly reliable electronic component can be obtained.

Figure 32B:
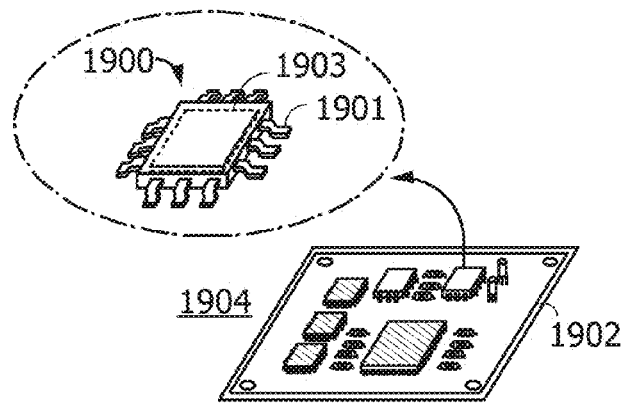

FIG. 32(B) is a schematic perspective diagram illustrating a QFP (Quad Flat Package) as an example of the completed electronic component. An electronic component 1900 in FIG. 32(B) includes a lead 1901 and a circuit portion 1903. The electronic component 1900 in FIG. 32(B) is mounted on a printed circuit board 1902, for example. A plurality of the electronic components 1900 which are combined and electrically connected to each other over the printed circuit board 1902 can be mounted on the electronic device. A completed circuit board 1904 is provided in an electronic device or the like.

Note that this embodiment can be combined with the other embodiments in this specification as appropriate.

(Notes About the Description in the Specification and the Like)

Additional notes are provided below as to the above embodiments and the description of the structures in the above embodiments.

<Notes About One Embodiment of the Present Invention Described in the Embodiments>

The structure described in each embodiment can be used as appropriate in combination with any of the structures described in the other embodiments to make another embodiment of the present invention. In addition, in the case where a plurality of configuration examples is given in one embodiment, any of the configuration examples can be combined as appropriate.

Note that a content (or may be part of the content) described in one embodiment may be applied to, combined with, or replaced by at least one of a different content (or may be part of the different content) described in the embodiment and a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with at least one of another part of the diagram, a different diagram (or may be part of the different diagram) illustrated in the embodiment, and a diagram (or may be part of the diagram) illustrated in one or a plurality of different embodiments, much more diagrams can be formed.

<Notes on Ordinal Numbers>

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Alternatively, in the present specification and the like, for example, a "first" component in one embodiment can be omitted in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the following embodiments. Note that in the structures of the invention described above, the same portions or portions having similar functions are denoted by the same reference numerals in different drawings, and the description of such portions is not repeated.

In this specification and the like, terms for describing arrangement, such as "over" and "under", are used for convenience to indicate a positional relation between components with reference to drawings. The positional relation between components is changed as appropriate in accordance with the direction in which each component is described. Therefore, terms for describing arrangement are not limited to the terms used in the description in the specification, and can be appropriately reworded depending on situations.

Note that the term "over" or "under" does not necessarily mean that a component is placed directly above or directly below and directly in contact with another component. For example, the expression "electrode B over insulating layer A" does not necessarily mean that the electrode B is above and in direct contact with the insulating layer A and can mean the case where another component is provided between the insulating layer A and the electrode B.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, the segmentation of a block in the block diagrams is not limited by any of the components described in the specification, and can be differently determined as appropriate depending on situations.

In the drawings, the size, the layer thickness, or the region has arbitrary magnitude for convenience for the description. Therefore, embodiments of the present invention are not limited to such a scale. Note that the drawings are schematically illustrated for clarity, and shapes or values are not limited to those illustrated in the drawings. For example, the following can be included: variation in signal, voltage, or current due to noise or difference in timing.

In a top view (also referred to as a plan view or a layout chart), a perspective view, and the like, some components are not illustrated for clarity of the drawing in some cases.

In the drawings, the same components, components having similar functions, components formed of the same material, or components formed at the same time are denoted by the same reference numerals in some cases, and the description thereof is not repeated in some cases.

<Notes About the Description that Can be Rephrased or Reworded>

In this specification or the like, in description of connections of a transistor, one of a source and a drain is described as "one of a source and a drain" (or a first electrode or a first terminal), and the other of the source and the drain is described as "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, the terms "voltage" and "potential" are interchangeable in appropriate cases. The term "voltage" refers to a potential difference between a given potential and a reference potential. When the reference potential is a ground potential, the term "voltage" can be replaced with the term "potential". The ground potential does not necessarily mean 0 V. Note that a potential is relative, and a potential supplied to wirings or the like may be changed depending on a reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer". For example, the term "conductive layer" or "conductive film" can be changed into the term "conductor" in some cases. Furthermore, for example, the term "insulating layer" or "insulating film" can be changed into the term "insulator" in some cases.

In this specification and the like, the term "wiring" and the like can be interchanged depending on the case or circumstances. For example, the term "wiring" can be changed into the term such as "signal line" or "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases.

<Notes on Definitions of Terms>

The following are definitions of the terms mentioned in the above embodiments.

<<Semiconductor>>

In this specification, a "semiconductor" has characteristics of an "insulator" in some cases when the conductivity is sufficiently low, for example. Furthermore, it is difficult to strictly distinguish a "semiconductor" and an "insulator" from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" has characteristics of a "conductor" in some cases when the conductivity is sufficiently high, for example. Furthermore, it is difficult to strictly distinguish a "semiconductor" and a "conductor" from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, DOS (Density of State) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. In the case of an oxide semiconductor, oxygen vacancy may be formed by entry of impurities such as hydrogen. Further, in the case where the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow through the drain, the channel formation region, and the source. Note that in this specification and the like, a channel formation region refers to a region through which current mainly flows.

Furthermore, the functions of a source and a drain might be switched when transistors having different polarities are employed or a direction of current flow is changed in circuit operation, for example. Therefore, the terms "source" and "drain" can be switched in this specification and the like.

<<About Switch>>

In this specification and the like, a switch is an element that is brought into a conduction state or a non-conduction state (is turned on or off) to determine whether to have a current flow therethrough or not. Alternatively, the switch is an element having functions of selecting and changing a current path.

For example, an electrical switch, a mechanical switch, or the like can be used as a switch. That is, any element can be used as a switch as long as it can control current, without limitation to a certain element.

A transistor (e.g., a bipolar transistor or a MOS transistor), a diode (e.g., a PN diode, a PIN diode, a Schottky diode, an MIM (Metal Insulator Metal) diode, an MIS (Metal Insulator Semiconductor) diode, or a diode-connected transistor), or a logic circuit in which such elements are combined can be used as an electrical switch.

When a transistor is used as a switch, an "on state" of the transistor refers to a state in which a source electrode and a drain electrode of the transistor are electrically short-circuited. Furthermore, an "off state" of the transistor refers to a state in which the source electrode and drain electrode of the transistor are electrically disconnected. Note that if the transistor operates just as a switch, there is no particular limitation on the polarity (conductivity type) of the transistor.

An example of a mechanical switch is a switch formed using a MEMS (micro electro mechanical system) technology, such as a digital micromirror device (DMD). Such a switch includes an electrode which can be moved mechanically, and operates by controlling conduction and non-conduction in accordance with movement of the electrode.

<<About Channel Length>>

In this specification and the like, the channel length refers to, for example, a distance between a source (source region or source electrode) and a drain (drain region or drain electrode) in a region where a semiconductor (or a portion where a current flows in the semiconductor when a transistor is on) and a gate overlap with each other or a region where a channel is formed in a top view of the transistor.

In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

<<About Channel Width>>

In this specification and the like, a channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW: Surrounded Channel Width) in some cases. Further, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has functions of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and leas than or equal to 120°.

<<Trigonal and Rhombohedral>>

In this specification, trigonal and rhombohedral crystal systems are included in a hexagonal crystal system.

EXPLANATION OF REFERENCE

BL wiring
BLB wiring
WL wiring
WLC wiring
SL wiring
BGL wiring
RBL wiring
RWL wiring
WBL wiring
WWL wiring
BRL wiring
C101 capacitor
C102 capacitor
C103 capacitor
C104 capacitor
C105 capacitor
M101 transistor
M102 transistor
M104 transistor
M105 transistor
M106 transistor
M107 transistor
M108 transistor
Mos1 transistor
Mos2 transistor
Mos3 transistor
Mos4 transistor
Mos5 transistor
Mos6 transistor
10 circuit
20 circuit
100a environmental sensor
100b environmental sensor
100b-1 environmental sensor
100b-2 environmental sensor
100b-3 environmental sensor
100b-4 environmental sensor
100c environmental sensor
100d environmental sensor
101 antenna 102 antenna
103 antenna
110a sensor circuit
110b sensor circuit
110c sensor circuit
111 reception circuit
112 power supply circuit
113 battery
114 memory device
115 analog-to-digital converter circuit
116 sensor
117 optical sensor
118 detector circuit
120 control circuit
121 logic circuit
122 memory controller
123 sensor controller
130 transmission circuit
131 modulation circuit
132 transmission amplifier
141 OS memory
142 OS analog-to-digital converter circuit
401 automobile
402 RF transceiver
403 RF receiver
404 laser light transmitter
405 radio wave
406 ceiling
800 analog-to-digital converter circuit
801 sample-and-hold circuit
801A sample-and-hold circuit
801B sample-and-hold circuit
802 comparator
803 successive approximation register
804 digital-to-analog converter circuit
805 timing controller
806 oscillator circuit
811 buffer circuit
812 transistor
813 capacitor
821 sensor circuit
821A sensor circuit
821B sensor circuit
822 selector
831A sample-and-hold circuit
831B sample-and-hold circuit
831C sample-and-hold circuit
835 transistor
836 transistor
837 transistor
838 transistor
893 capacitor
894 selector
895 selector
896 selector
897 transistor
898 inverter circuit
900 analog-to-digital converter circuit
911 transistor
912 capacitor
1000 bridge
1001 bridge pier
1002 information processing terminal
1100 utility pole
1101 wiring
1102 wiring
1103 traffic light
1104 information processing terminal
1200 memory cell
1203 memory cell
1204 memory cell
1205 memory cell
1206 memory cell
1207 memory cell
1208 memory cell
1400a transistor
1400b transistor
1400c transistor
1400d transistor
1400e transistor
1401 substrate
1402 insulator
1404 conductor
1406a metal oxide
1406b metal oxide
1406c metal oxide
1408 insulator
1412 insulator
1413 conductor
1416a conductor
1416b conductor
1418 insulator
1423a low-resistance region
1423b low-resistance region
1424a conductor
1424b conductor
1426a conductor
1426b conductor
1428 insulator
1600a transistor
1600b transistor
1600c transistor
1600d transistor
1601 substrate
1604 conductor
1606a metal oxide
1606b metal oxide
1606c metal oxide
1612 insulator
1613 conductor
1616a conductor
1616b conductor
1618 insulator
1620 insulator
1630 insulator
1900 electronic component
1901 lead
1902 printed circuit board
1903 circuit portion
1904 circuit substrate
2600 memory device
2601 peripheral circuit
2610 memory cell array
2621 row decoder
2622 word line driver circuit
2630 bit line driver circuit
2631 column decoder
2632 pre-charge circuit
2633 sense amplifier
2634 writing circuit
2640 output circuit 2660 control logic circuit
5100 pellet
5120 substrate
5161 region

The invention claimed is:
1. An environmental sensor comprising:
a first sensor;
a second sensor;
a control circuit;
a transmission amplifier;
a modulation circuit;
a memory device;
an analog-to-digital converter circuit;
a first antenna;
a battery; and
a power supply circuit,
wherein the memory device comprises a first transistor and a first retention node,
wherein the analog-to-digital converter circuit comprises a second transistor and a second retention node,
wherein the first transistor comprises an oxide semiconductor in a channel formation region,
wherein the second transistor comprises an oxide semiconductor in a channel formation region,
wherein the first transistor has a function of controlling charge and discharge at the first retention node,
wherein the second transistor has a function of controlling charge and discharge at the second retention node,
wherein the battery has a function of supplying electric power to the first sensor, the second sensor, the control circuit, the transmission amplifier, the modulation circuit, the memory device, and the analog-to-digital converter circuit through the power supply circuit,
wherein the second sensor has a function of outputting a trigger signal to the control circuit when receiving light,
wherein the control circuit that receives the trigger signal has a function of transmitting a control signal to the first sensor, the memory device, the analog-to-digital converter circuit, the modulation circuit, and the transmission amplifier,
wherein the first sensor has a function of acquiring an external physical quantity or an external chemical quantity as first sensing data,
wherein the analog-to-digital converter circuit has a function of digitizing the first sensing data to generate second sensing data,
wherein the memory device has a function of storing the second sensing data;
wherein the modulation circuit has a function of modulating the second sensing data,
wherein the transmission amplifier has a function of amplifying the second sensing data modulated by the modulation circuit, and
wherein the first antenna has a function of transmitting the second sensing data amplified by the transmission amplifier as a first electromagnetic wave signal.

2. The environmental sensor according to claim 1 wherein the first sensor has a function of measuring at least one of stress, distortion, temperature, humidity, light quantity, current, voltage, the number of particles, and concentration of the particles as the physical quantity.

3. The environmental sensor according to claim 1 wherein the first sensor has a function of measuring the quantity of at least one of an oxide ion, a sulfide ion, a chloride ion, a bromide ion, an iodide ion, a hydroxide ion, a sulfate ion, a carbonate ion, a hydrogen ion, and a calcium ion as the chemical quantity.

4. The environmental sensor according to claim 1 wherein the memory device further comprises a first capacitor, and
wherein the first capacitor has a function of retaining a voltage at the first retention node.

5. The environmental sensor according to claim 1 wherein the analog-to-digital converter circuit further comprises a second capacitor, and
wherein the second capacitor has a function of retaining a voltage at the second retention node.

6. An environmental sensor comprising:
a reception circuit;
a first sensor;
a control circuit;
a transmission amplifier;
a modulation circuit;
a memory device;
an analog-to-digital converter circuit;
a first antenna;
a battery; and
a power supply circuit,
wherein the memory device comprises a first transistor and a first retention node,
wherein the analog-to-digital converter circuit comprises a second transistor and a second retention node,
wherein the first transistor comprises an oxide semiconductor in a channel formation region,
wherein the second transistor comprises an oxide semiconductor in a channel formation region,
wherein the first transistor has a function of controlling charge and discharge at the first retention node,
wherein the second transistor has a function of controlling charge and discharge at the second retention node,
wherein the battery has a function of supplying electric power to the first sensor, the reception circuit, the control circuit, the transmission amplifier, the modulation circuit, the memory device, and the analog-to-digital converter circuit through the power supply circuit,
wherein the reception circuit has a function of outputting a trigger signal to the control circuit when receiving a signal from the outside,
wherein the control circuit that receives the trigger signal has a function of transmitting a control signal to the first sensor, the memory device, the analog-to-digital converter circuit, the modulation circuit, and the transmission amplifier,
wherein the first sensor has a function of acquiring an external physical quantity or an external chemical quantity as first sensing data,
wherein the analog-to-digital converter circuit has a function of digitizing the first sensing data to generate second sensing data,
wherein the memory device has a function of storing the second sensing data,
wherein the modulation circuit has a function of modulating the second sensing data,
wherein the transmission amplifier has a function of amplifying the second sensing data modulated by the modulation circuit, and
wherein the first antenna has a function of transmitting the second sensing data amplified by the transmission amplifier as a first electromagnetic wave signal.

7. The environmental sensor according to claim 6,
wherein the reception circuit comprises a detector circuit,
wherein the battery has a function of supplying electric power to the detector circuit through the power supply circuit,
wherein the first antenna has a function of receiving a second electromagnetic wave signal from the outside, and
wherein the detector circuit has functions of demodulating the second electromagnetic wave signal and outputting it as the trigger signal to the control circuit.

8. The environmental sensor according to claim 6,
wherein the reception circuit comprises a second antenna and a detector circuit,
wherein the battery has a function of supplying electric power to the detector circuit through the power supply circuit,
wherein the second antenna has a function of receiving a second electromagnetic wave signal from the outside,
wherein the detector circuit has functions of demodulating the second electromagnetic wave signal and outputting it as the trigger signal to the control circuit, and
wherein a frequency of the first electromagnetic wave signal and a frequency of the second electromagnetic wave signal are different from each other.

9. The environmental sensor according to claim 6, wherein the first sensor has a function of measuring at least one of stress, distortion, temperature, humidity, light quantity, current, voltage, the number of particles, and concentration of the particles as the physical quantity.

10. The environmental sensor according to claim 6, wherein the first sensor has a function of measuring the quantity of at least one of an oxide ion, a sulfide ion, a chloride ion, a bromide ion, an iodide ion, a hydroxide ion, a sulfate ion, a carbonate ion, a hydrogen ion, and a calcium ion as the chemical quantity.

11. The environmental sensor according to claim 6, wherein the memory device further comprises a first capacitor, and
wherein the first capacitor has a function of retaining a voltage at the first retention node.

12. The environmental sensor according to claim 6, wherein the analog-to-digital converter circuit further comprises a second capacitor, and
wherein the second capacitor has a function of retaining a voltage at the second retention node.

* * * * *